United States Patent
Sasaki et al.

(10) Patent No.: US 8,406,089 B2
(45) Date of Patent: Mar. 26, 2013

(54) HEAT-ASSISTED MAGNETIC RECORDING HEAD WITH LASER DIODE FIXED TO SLIDER

(75) Inventors: Yoshitaka Sasaki, Milpitas, CA (US);
Hiroyuki Ito, Milpitas, CA (US);
Shigeki Tanemura, Milpitas, CA (US);
Hironori Araki, Milpitas, CA (US)

(73) Assignee: Headway Technologies, Inc., Milpitas ( * ) Notice: Subject to any disclaimer, the term of this patent is extended or adjusted under 35 U.S.C. 154(b) by 809 days.

(21) Appl. No.: 12/585,150

(22) Filed: Sep. 4, 2009

(65) Prior Publication Data

US 2011/0058273 A1 Mar. 10, 2011

(51) Int. Cl.
*G11B 11/00* (2006.01)

(52) U.S. Cl. .................................... 369/13.02

(58) Field of Classification Search .................. None
See application file for complete search history.

(56) References Cited

U.S. PATENT DOCUMENTS

| | | | |
|---|---|---|---|
| 6,649,894 B2 | 11/2003 | Matsumoto et al. | |
| 7,911,883 B2 | 3/2011 | Sasaki et al. | |
| 8,000,175 B2 | 8/2011 | Shimazawa et al. | |
| 2001/0017820 A1* | 8/2001 | Akiyama et al. | 369/13 |
| 2005/0254355 A1* | 11/2005 | Rettner et al. | 369/13.24 |
| 2006/0233062 A1 | 10/2006 | Bedillion et al. | |
| 2007/0159720 A1 | 7/2007 | Sohn et al. | |
| 2007/0165494 A1 | 7/2007 | Cho et al. | |
| 2007/0177302 A1 | 8/2007 | Shimazawa et al. | |
| 2008/0002298 A1 | 1/2008 | Sluzewski | |
| 2008/0055762 A1 | 3/2008 | Shimazawa et al. | |
| 2008/0056073 A1* | 3/2008 | Shimizu | 369/13.02 |
| 2008/0316872 A1 | 12/2008 | Shimizu et al. | |
| 2009/0303858 A1 | 12/2009 | Kuiseko et al. | |
| 2010/0061200 A1 | 3/2010 | Shimazawa et al. | |

(Continued)

FOREIGN PATENT DOCUMENTS

| | | |
|---|---|---|
| JP | A-2003-114184 | 4/2003 |
| JP | A 2003-248958 | 9/2003 |

(Continued)

OTHER PUBLICATIONS

Office Action issued May 27, 2011 in related U.S. Appl. No. 12/385,447.

(Continued)

*Primary Examiner* — Joseph Feild
*Assistant Examiner* — Henok Heyi
(74) *Attorney, Agent, or Firm* — Oliff & Berridge, PLC

(57) ABSTRACT

A heat-assisted magnetic recording head includes a slider, an edge-emitting laser diode fixed to the slider, and an external mirror provided outside the slider. The slider includes a magnetic pole, a waveguide, and a near-field light generating element. The laser diode includes: an emitting end face that lies at an end in a direction parallel to the plane of an active layer and includes a laser-light emission part; and a mounting surface that lies at an end in a direction perpendicular to the plane of the active layer and faces the slider. The external mirror includes: a first reference surface that is parallel to the emitting end face and faces the emitting end face; a second reference surface that is parallel to the mounting surface and faces toward the same direction as the mounting surface does; and a reflecting surface that connects the first and second reference surfaces to each other and reflects the laser light emitted from the emission part toward the waveguide.

22 Claims, 33 Drawing Sheets

U.S. PATENT DOCUMENTS

| | | | |
|---|---|---|---|
| 2010/0073802 A1 | 3/2010 | Komura et al. | |
| 2010/0118431 A1 | 5/2010 | Tomikawa et al. | |
| 2010/0123967 A1 | 5/2010 | Batra et al. | |
| 2010/0165801 A1* | 7/2010 | Boone et al. | 369/13.11 |
| 2010/0172220 A1 | 7/2010 | Komura et al. | |
| 2010/0195238 A1 | 8/2010 | Shimazawa et al. | |
| 2010/0202081 A1 | 8/2010 | Shimazawa et al. | |
| 2010/0214684 A1 | 8/2010 | Gao et al. | |
| 2010/0238580 A1 | 9/2010 | Shimazawa et al. | |
| 2010/0260015 A1 | 10/2010 | Sasaki et al. | |
| 2010/0290323 A1 | 11/2010 | Isogai et al. | |
| 2010/0315736 A1 | 12/2010 | Takayama et al. | |
| 2010/0328806 A1 | 12/2010 | Sasaki et al. | |
| 2011/0013497 A1 | 1/2011 | Sasaki et al. | |
| 2011/0026377 A1* | 2/2011 | Shimazawa et al. | 369/13.24 |
| 2011/0058273 A1 | 3/2011 | Sasaki et al. | |
| 2011/0096435 A1 | 4/2011 | Sasaki et al. | |
| 2011/0096639 A1 | 4/2011 | Matsumoto | |
| 2011/0141861 A1 | 6/2011 | Hirata et al. | |
| 2011/0149426 A1 | 6/2011 | Araki et al. | |
| 2011/0188354 A1 | 8/2011 | Sasaki et al. | |
| 2011/0228417 A1 | 9/2011 | Sasaki et al. | |
| 2011/0228418 A1 | 9/2011 | Sasaki et al. | |
| 2011/0228649 A1 | 9/2011 | Shimazawa et al. | |
| 2011/0228653 A1 | 9/2011 | Shimazawa et al. | |

FOREIGN PATENT DOCUMENTS

| | | |
|---|---|---|
| JP | A-2005-004901 | 1/2005 |
| JP | A-2007-188619 | 7/2007 |
| JP | A-2007-207349 | 8/2007 |
| JP | A-2007-257753 | 10/2007 |
| JP | A-2007-335028 | 12/2007 |
| JP | A-2008-16096 | 1/2008 |
| JP | A-2008-059693 | 3/2008 |
| JP | A-2008-257819 | 10/2008 |
| JP | A-2009-004030 | 1/2009 |
| JP | A-2009-087499 | 4/2009 |
| WO | WO 2007/132766 A1 | 11/2007 |
| WO | WO 2009/008488 A1 | 1/2009 |

OTHER PUBLICATIONS

Nov. 7, 2011 Office Action issued in Japanese Application No. 2010-074164 (with translation).
Yoshitaka Sasaki et al., U.S. Appl. No. 12/385,447, filed Apr. 8, 2009.
Yoshitaka Sasaki et al., U.S. Appl. No. 12/457,984, filed Jun. 26, 2009.
Yoshitaka Sasaki et al., U.S. Appl. No. 12/714,998, filed Mar. 1, 2010.
Yoshitaka Sasaki et al., U.S. Appl. No. 12/727,666, filed Mar. 19, 2010.
Yoshitaka Sasaki et al., U.S. Appl. No. 12/727,620, filed Mar. 19, 2010.
Challener W.A., et al. "Heat-Assisted Magnetic Recording by a Near-Field Transducer with Efficient Optical Energy Transfer," Nature Photonics, Mar. 2009, pp. 1-5, Seagate Technology, Pittsburgh, PA.
Yoshitaka Sasaki et al., U.S. Appl. No. 12/458,546, filed Jul. 15, 2009.
Feb. 28, 2012 Office Action issued in Japanese patent application No. 2010-074164 (with translation).
Office Action mailed May 4, 2012 in U.S. Appl. No. 12/458,546.
Oct. 5, 2011 Office Action issued in U.S. Appl. No. 12/727,620.
Notice of Allowance dated Oct. 16, 2012 issued in U.S. Appl. No. 12/458,546.
Office Action issued on Oct. 5, 2011 in related U.S. Appl. No. 12/727,666.
Jan. 8, 2013 Office Action issued in Japanese Patent Application No. 2010-019274 (with translation).

* cited by examiner

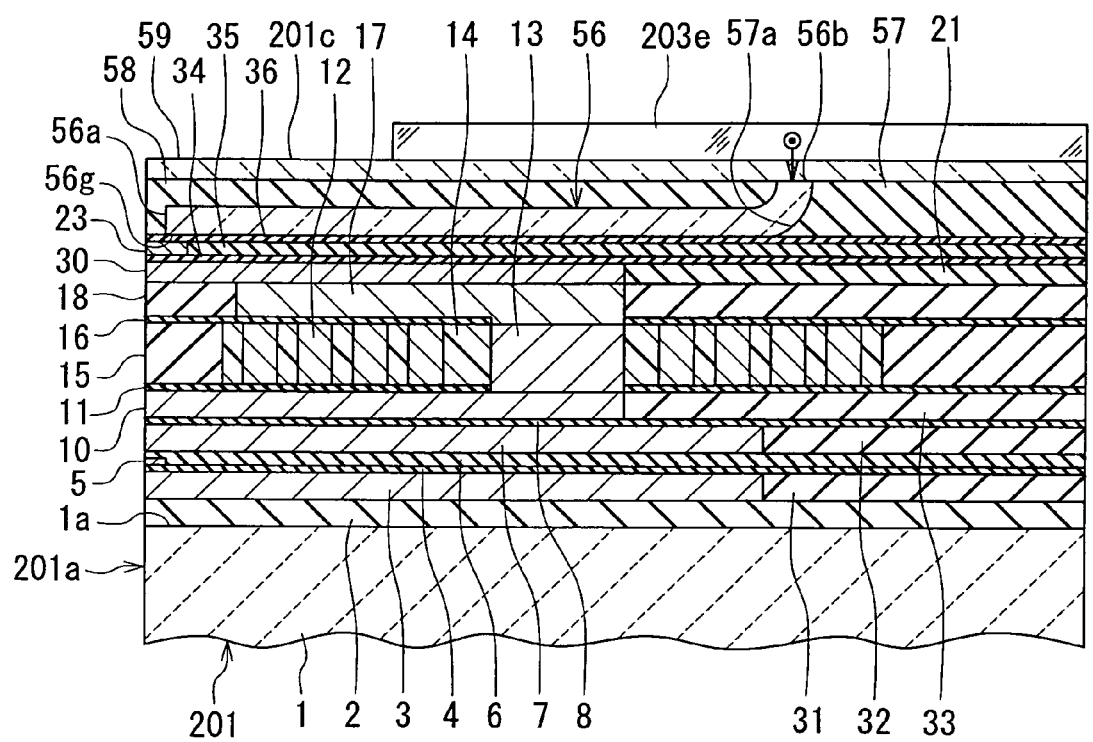
FIG. 35
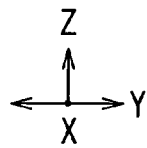

HEAT-ASSISTED MAGNETIC RECORDING HEAD WITH LASER DIODE FIXED TO SLIDER

BACKGROUND OF THE INVENTION

1. Field of the Invention

The present invention relates to a heat-assisted magnetic recording head for use in heat-assisted magnetic recording where a recording medium is irradiated with near-field light to lower the coercivity of the recording medium for data recording.

2. Description of the Related Art

Recently, magnetic recording devices such as a magnetic disk drive have been improved in recording density, and thin-film magnetic heads and magnetic recording media of improved performance have been demanded accordingly. Among the thin-film magnetic heads, a composite thin-film magnetic head has been used widely. The composite thin-film magnetic head has such a structure that a reproducing head including a magnetoresistive element (hereinafter, also referred to as MR element) for reading and a recording head including an induction-type electromagnetic transducer for writing are stacked on a substrate. In a magnetic disk drive, the thin-film magnetic head is mounted on a slider which flies slightly above the surface of the magnetic recording medium.

To increase the recording density of a magnetic recording device, it is effective to make the magnetic fine particles of the recording medium smaller. Making the magnetic fine particles smaller, however, causes the problem that the magnetic fine particles drop in the thermal stability of magnetization. To solve this problem, it is effective to increase the anisotropic energy of the magnetic fine particles. However, increasing the anisotropic energy of the magnetic fine particles leads to an increase in coercivity of the recording medium, and this makes it difficult to perform data recording with existing magnetic heads.

To solve the foregoing problems, there has been proposed a technique so-called heat-assisted magnetic recording. This technique uses a recording medium having high coercivity. When recording data, a magnetic field and heat are simultaneously applied to the area of the recording medium where to record data, so that the area rises in temperature and drops in coercivity for data recording. The area where data is recorded subsequently falls in temperature and rises in coercivity to increase the thermal stability of magnetization.

In heat-assisted magnetic recording, near-field light is typically used as a means for applying heat to the recording medium. A known method for generating near-field light is to irradiate a plasmon antenna, which is a small piece of metal, with laser light. The plasmon antenna has a near-field light generating part which is a sharp-pointed part for generating near-field light. The laser light applied to the plasmon antenna excites surface plasmons on the plasmon antenna. The surface plasmons propagate to the near-field light generating part of the plasmon antenna, and the near-field light generating part generates near-field light based on the surface plasmons. The near-field light generated by the plasmon antenna exists only within an area smaller than the diffraction limit of light. Irradiating the recording medium with the near-field light makes it possible to heat only a small area of the recording medium.

In general, the laser light to be used for generating the near-field light is guided through a waveguide that is provided in the slider to the plasmon antenna that is located near the medium facing surface of the slider. Possible techniques of placement of a light source that emits the laser light are broadly classified into the following two. A first technique is to place the light source away from the slider. A second technique is to fix the light source to the slider.

The first technique is described in U.S. Patent Application Publication No. 2006/0233062 A1, for example. The second technique is described in U.S. Patent Application Publication No. 2008/0055762 A1, U.S. Patent Application Publication No. 2008/0002298 A1, and JP 2008-16096 A, for example.

The first technique requires an optical path of extended length including such optical elements as a mirror, lens, and optical fiber in order to guide the light from the light source to the waveguide. This causes the problem of increasing energy loss of the light in the path. The second technique is free from the foregoing problem since the optical path for guiding the light from the light source to the waveguide is short.

The second technique, however, has the following problem. Hereinafter, the problem that can occur with the second technique will be described in detail. The second technique typically uses a laser diode as the light source. The laser diodes available include edge-emitting laser diodes and surface-emitting laser diodes. In an edge-emitting laser diode, the emission part for emitting the laser light is located in an end face that lies at an end of the laser diode in a direction parallel to the plane of an active layer. The emission part emits the laser light in the direction parallel to the plane of the active layer. In a surface-emitting laser diode, the emission part for emitting the laser light is located in a surface that lies at an end of the laser diode in a direction perpendicular to the plane of the active layer. The emission part emits the laser light in the direction perpendicular to the plane of the active layer.

The laser light emitted from a laser diode can be made incident on the waveguide by a technique described in U.S. Patent Application Publication No. 2008/0055762 A1, for example. This publication describes arranging an edge-emitting laser diode with its emission part opposed to the incident end of the waveguide so that the laser light emitted from the emission part is incident on the incident end of the waveguide without the intervention of any optical element. According to this technique, the laser diode is arranged so that the longitudinal direction of the laser diode, i.e., the direction of the optical axis of the laser light to be emitted from the emission part, is perpendicular to the end face of the slider where the incident end of the waveguide is located. In such a case, the laser diode needs to be positioned with high precision so that the optical axis of the laser light emitted from the emission part will not tilt with respect to the optical axis of the waveguide. If the optical axis of the laser light emitted from the emission part tilts with respect to the optical axis of the waveguide, the laser light may fail to be delivered to the plasmon antenna with sufficient intensity. When the laser diode is to be arranged so that the longitudinal direction of the laser diode is perpendicular to the end face of the slider where the incident end of the waveguide is located, however, there is a problem that the longitudinal direction of the laser diode can easily tilt with respect to the direction perpendicular to the end face of the slider where the incident end of the waveguide is located, and it is thus difficult to align the laser light with the waveguide.

JP 2008-16096 A describes a head that has a unit substrate with an edge-emitting laser diode attached thereto and a propagation layer for guiding laser light emitted from the laser diode to the incident end of the waveguide, the unit substrate and the propagation layer being arranged on a rear surface of the slider opposite to the medium facing surface. In this head, the laser diode emits laser light in a direction parallel to the rear surface. The propagation layer has a total reflection surface for changing the direction of travel of the laser light emitted from the laser diode. In the head, the distance from the laser-light emission part of the laser diode to the total reflection surface and the distance from the total reflection surface to the incident end of the waveguide are both relatively long. In consequence, the laser light can be too large in diameter at the position of the incident end of the waveguide, so that part of the laser light may fail to enter the waveguide and the amount of the laser light to propagate through the waveguide may thus decrease.

The laser light emitted from a laser diode may be made incident on the waveguide by other techniques. For example, U.S. Patent Application Publication No. 2008/0002298 A1 describes a technique in which a surface-emitting laser diode is arranged with its emission part opposed to the surface of the slider on the trailing side so that the laser light emitted from the emission part is incident on the waveguide from above. This technique facilitates aligning the laser light with the waveguide. Surface-emitting laser diodes, however, typically have a lower optical output as compared with edge-emitting laser diodes. The technique therefore has the problem that it is difficult to provide laser light of sufficiently high intensity for use in generating the near-field light.

OBJECT AND SUMMARY OF THE INVENTION

It is an object of the present invention to provide a heat-assisted magnetic recording head that makes it possible that, while using an edge-emitting laser diode as the light source for emitting light to be used for generating near-field light, alignment of the laser light with the waveguide is easy and the path of the laser light from the laser-light emission part of the laser diode to the waveguide is shortened, and to provide a laser assembly for use in the heat-assisted magnetic recording head and a method of manufacturing the same.

A heat-assisted magnetic recording head according to the present invention includes a slider, an edge-emitting laser diode fixed to the slider, and an external mirror provided outside the slider.

The slider includes: a medium facing surface that faces a recording medium; a magnetic pole that has an end face located in the medium facing surface and produces a recording magnetic field for recording data on the recording medium; a waveguide that allows light to propagate therethrough; a near-field light generating element having a near-field light generating part located in the medium facing surface, a surface plasmon being excited based on the light propagating through the waveguide, the surface plasmon propagating to the near-field light generating part, the near-field light generating part generating near-field light based on the surface plasmon; and a substrate on which the magnetic pole, the near-field light generating element and the waveguide are stacked.

The laser diode includes: an active layer; an emitting end face that lies at an end in a direction parallel to a plane of the active layer and includes an emission part for emitting laser light; and a mounting surface that lies at an end in a direction perpendicular to the plane of the active layer and faces the slider.

The external mirror includes: a first reference surface that is parallel to the emitting end face and faces the emitting end face; a second reference surface that is parallel to the mounting surface and faces toward the same direction as the mounting surface does; and a reflecting surface that is oblique with respect to each of the first reference surface and the second reference surface, connects the first reference surface and the second reference surface to each other, and reflects the laser light emitted from the emission part toward the waveguide.

In the heat-assisted magnetic recording head according to the present invention, the first reference surface may be in contact with the emitting end face. The second reference surface may be in contact with the slider.

In the heat-assisted magnetic recording head according to the present invention, the reflecting surface may form an angle of 45° with respect to each of the first reference surface and the second reference surface.

In the heat-assisted magnetic recording head according to the present invention, the slider may have a rear surface that is opposite to the medium facing surface. The waveguide may have an incident end face for the laser light reflected by the external mirror to be incident on, the incident end face being located in the rear surface. The laser diode may be arranged so that the mounting surface faces the rear surface.

In the heat-assisted magnetic recording head according to the present invention, the substrate may have a top surface that faces toward the magnetic pole, the near-field light generating element and the waveguide. The slider may have a top surface that lies at an end above the top surface of the substrate. The laser diode may be arranged so that the mounting surface faces the top surface of the slider. In such a case, the slider may further include an internal mirror that reflects the laser light reflected by the external mirror so as to let the laser light travel through the waveguide toward the medium facing surface. The laser diode, the external mirror, the internal mirror, and the waveguide may be arranged so that the direction of travel of the laser light emitted from the emission part and the direction of travel of the laser light reflected by the internal mirror are orthogonal to each other as viewed from above the top surface of the slider. Alternatively, the laser diode, the external mirror, the internal mirror, and the waveguide may be arranged so that the direction of travel of the laser light emitted from the emission part and the direction of travel of the laser light reflected by the internal mirror are parallel to each other. The waveguide may have an incident end face for the laser light reflected by the external mirror to be incident on, the incident end face being located in the top surface of the slider.

In the heat-assisted magnetic recording head according to the present invention, the laser diode may have a rear surface that is opposite to the mounting surface, and the distance between the mounting surface and the emission part may be smaller than the distance between the rear surface and the emission part of the laser diode.

In the heat-assisted magnetic recording head according to the present invention, the near-field light generating element may have an outer surface that includes: a first end face that is located in the medium facing surface; a second end face that is farther from the medium facing surface; and a coupling portion that couples the first end face and the second end face to each other. The first end face may include the near-field light generating part. In this case, a length of the near-field light generating element in a direction perpendicular to the medium facing surface may be greater than a length of the first end face in a direction perpendicular to the top surface of the substrate, and the waveguide may have an outer surface including an opposed portion that is opposed to a part of the coupling portion. In this case, the slider may further include an interposition layer that has a refractive index lower than that of the waveguide and is interposed between the opposed portion and the near-field light generating element.

In the heat-assisted magnetic recording head according to the present invention, the external mirror may include: a block having the first and second reference surfaces and an oblique surface that is oblique with respect to each of the first reference surface and the second reference surface and connects the first reference surface and the second reference surface to each other; and a metal film that adheres to the oblique surface to form the reflecting surface.

A laser assembly according to the present invention is usable in combination with the foregoing slider to constitute a heat-assisted magnetic recording head. The laser assembly according to the present invention includes an edge-emitting laser diode to be fixed to the slider, and an external mirror to be provided outside the slider. The laser diode includes: an active layer; an emitting end face that lies at an end in a direction parallel to a plane of the active layer and includes an emission part for emitting laser light; and a mounting surface that lies at an end in a direction perpendicular to the plane of the active layer and is to face the slider. The external mirror includes: a first reference surface that is parallel to the emitting end face and faces the emitting end face; a second reference surface that is parallel to the mounting surface and faces toward the same direction as the mounting surface does; and a reflecting surface that is oblique with respect to each of the first reference surface and the second reference surface, connects the first reference surface and the second reference surface to each other, and reflects the laser light emitted from the emission part toward the waveguide. The first reference surface is bonded to the emitting end face.

In the laser assembly according to the present invention, the reflecting surface may form an angle of 45° with respect to each of the first reference surface and the second reference surface.

In the laser assembly according to the present invention, the laser diode may have a rear surface that is opposite to the mounting surface, and the distance between the mounting surface and the emission part may be smaller than the distance between the rear surface and the emission part.

In the laser assembly according to the present invention, the external mirror may include: a block having the first and second reference surfaces and an oblique surface that is oblique with respect to each of the first reference surface and the second reference surface and connects the first reference surface and the second reference surface to each other; and a metal film that adheres to the oblique surface to form the reflecting surface.

A manufacturing method for the laser assembly according to the present invention includes the steps of: fabricating the external mirror; and bonding the first reference surface of the external mirror to the emitting end face of the laser diode.

The step of fabricating the external mirror includes the steps of: fabricating an initial block that has a first, initial reference surface, a second initial reference surface orthogonal to the first reference surface, and a corner formed between the first initial reference surface and the second initial reference surface, the first initial reference surface including a portion to be the first reference surface afterward, the second initial reference surface including a portion to be the second reference surface afterward; polishing the initial block at the corner to fabricate a block having the first and second reference surfaces and an oblique surface that is oblique with respect to each of the first reference surface and the second reference surface and connects the first reference surface and the second reference surface to each other; and depositing a metal film for forming the reflecting surface onto the oblique surface.

In the manufacturing method for the laser assembly according to the present invention, the reflecting surface may form an angle of 45° with respect to each of the first reference surface and the second reference surface.

In the manufacturing method for the laser assembly according to the present invention, the laser diode may have a rear surface that is opposite to the mounting surface, and the distance between the mounting surface and the emission part may be smaller than the distance between the rear surface and the emission part.

In the manufacturing method for the laser assembly according to the present invention, the initial block may be in the shape of a rectangular solid.

As employed herein, the direction of travel of the laser light refers to the direction of travel at the center of the laser beam. Where the components of the heat-assisted magnetic recording head excluding the substrate are concerned in the present application, a surface closer to the top surface of the substrate will be defined as "bottom surface," and a surface farther from the top surface of the substrate will be defined as "top surface."

In the heat-assisted magnetic recording head according to the present invention, the edge-emitting laser diode is fixed to the slider such that the mounting surface lying at an end in the direction perpendicular to the plane of the active layer faces the slider. According to the present invention, it is thus possible to align the laser diode with respect to the slider so that the optical axis of the laser light emitted from the emission part of the laser diode will not tilt with respect to a desired direction. In the present invention, the laser light emitted from the emission part is reflected toward the waveguide by the external mirror. The external mirror has the first reference surface that is parallel to the emitting end face and faces the emitting end face, and the second reference surface that is parallel to the mounting surface and faces toward the same direction as the mounting surface does. According to the present invention, at least either one of the first reference surface and the second reference surface can be used to align the external mirror with respect to the slider and the laser diode so that the optical axis of the laser light reflected by the reflecting surface will not tilt with respect to a desired direction. In the present invention, the reflecting surface of the external mirror connects the first reference surface and the second reference surface to each other, the first reference surface facing the emitting end face, the second reference surface facing toward the same direction as the mounting surface does. According to the present invention, it is thus possible to reduce both the distance from the emission part to the reflecting surface and the distance from the reflecting surface to the slider. In consequence, the present invention allows easy alignment of the laser light with the waveguide and allows shortening of the path of the laser light from the emission part to the waveguide, while using an edge-emitting laser diode as the light source for emitting light to be used for generating near-field light.

Other and further objects, features and advantages of the present invention will appear more fully from the following description.

BRIEF DESCRIPTION OF THE DRAWINGS

FIG. 35 is a cross-sectional view of a heat-assisted magnetic recording head according to a fourth embodiment of the invention.

DETAILED DESCRIPTION OF THE PREFERRED EMBODIMENTS

First Embodiment

Figure 1:
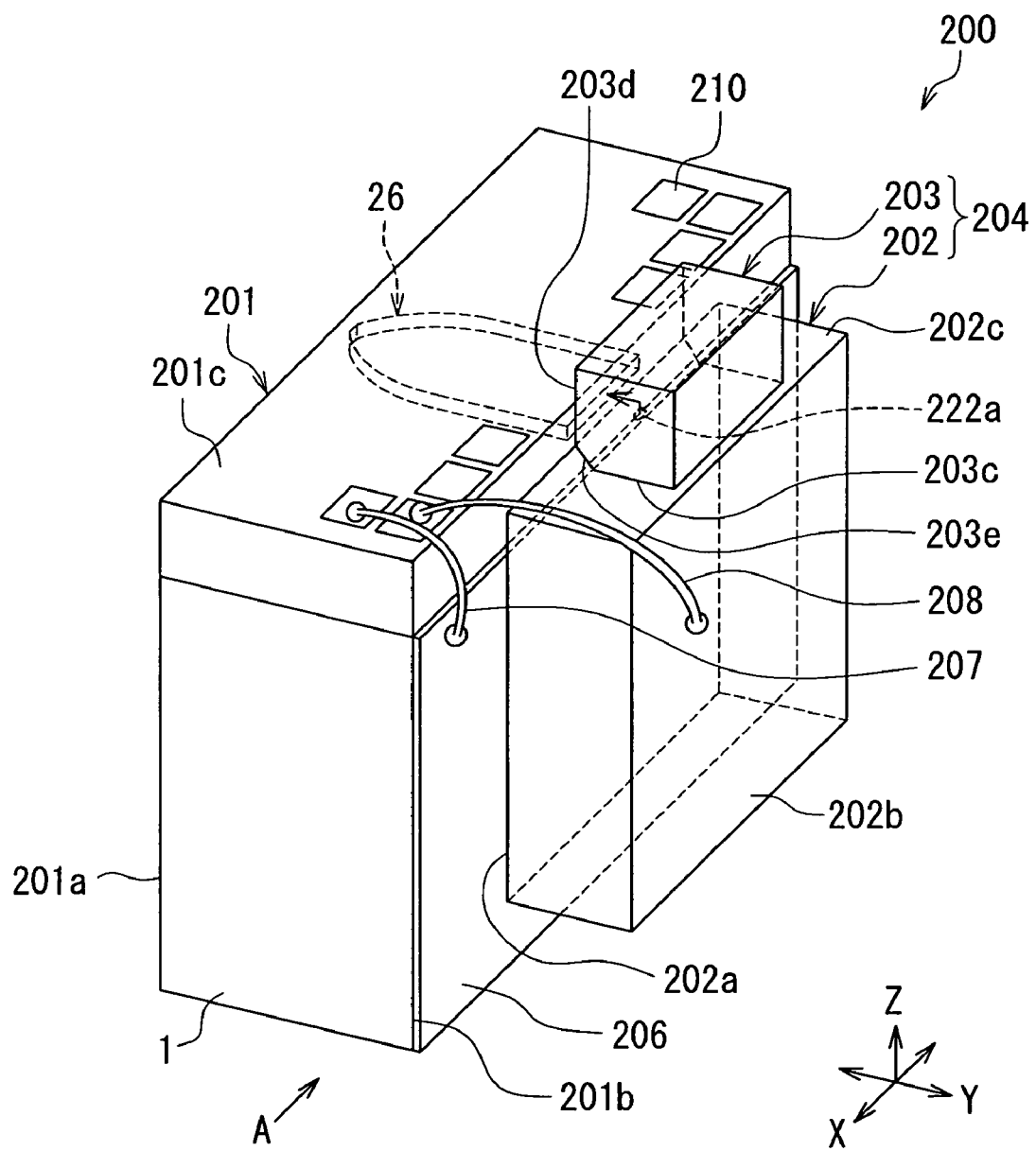
FIG. 1 is a perspective view of a heat-assisted magnetic recording head according to a first embodiment of the invention.
Figure 2:
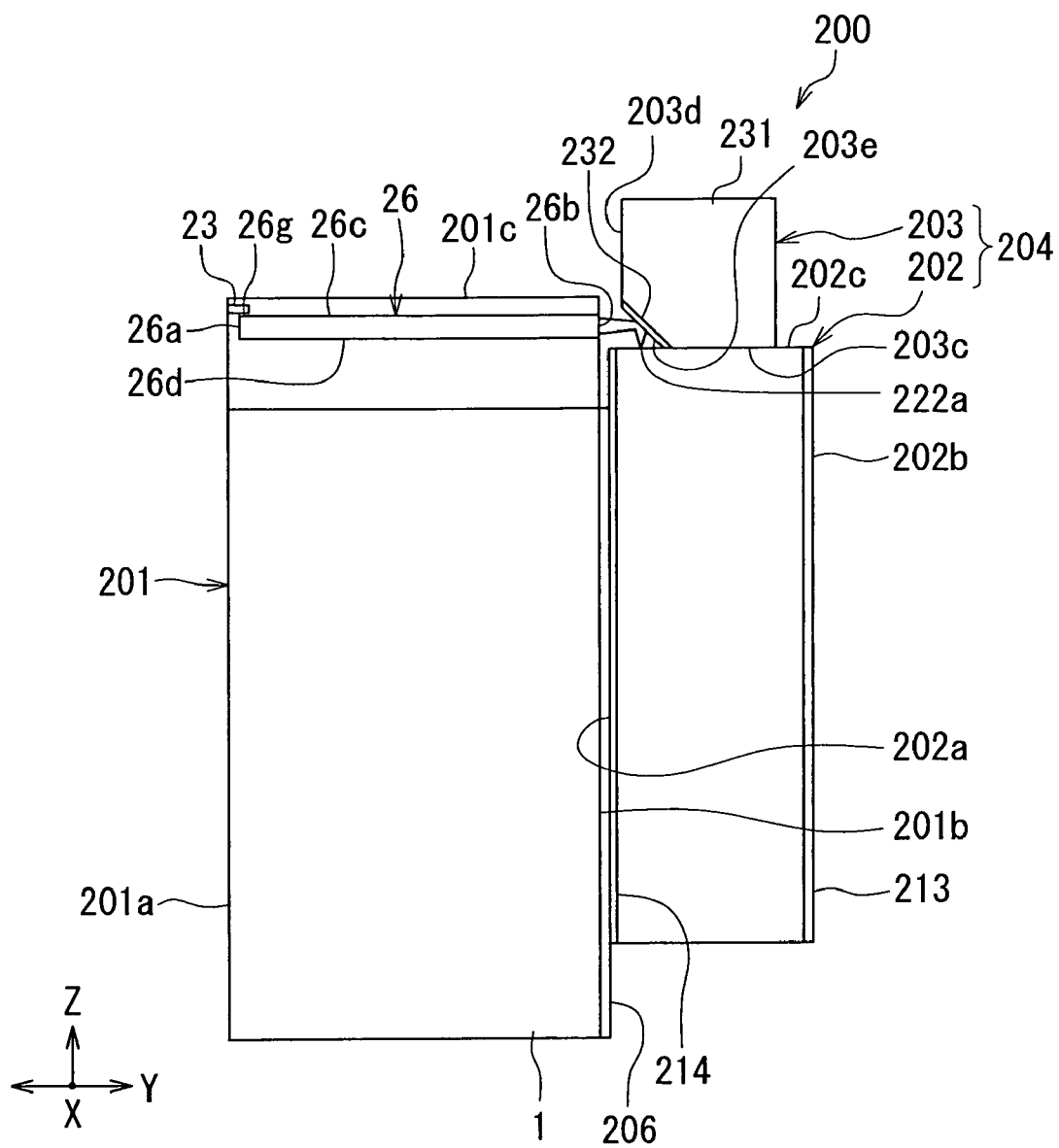
FIG. 2 is a side view of the heat-assisted magnetic recording head as viewed from the direction A of FIG. 1.

Preferred embodiments of the present invention will now be described in detail with reference to the drawings. Reference is first made to FIG. 1 and FIG. 2 to describe a heat-assisted magnetic recording head and a magnetic disk drive according to a first embodiment of the invention. FIG. 1 is a perspective view of the heat-assisted magnetic recording head according to the present embodiment. FIG. 2 is a side view of the heat-assisted magnetic recording head as viewed from the direction A of FIG. 1.

The magnetic disk drive of the present embodiment incorporates the heat-assisted magnetic recording head 200 according to the present embodiment. The heat-assisted magnetic recording head 200 is supported by a not-shown suspension and is disposed to face a circular-plate-shaped recording medium (magnetic disk) that is driven to rotate. In FIG. 1 and FIG. 2, the X direction is a direction across the tracks of the recording medium, the Y direction is a direction perpendicular to the surface of the recording medium, and the Z direction is the direction of travel of the recording medium as viewed from the heat-assisted magnetic recording head 200. The X direction, the Y direction and the Z direction are orthogonal to one another.

The heat-assisted magnetic recording head 200 includes a slider 201, an edge-emitting laser diode 202 fixed to the slider 201, and an external mirror 203 provided outside the slider 201. The slider 201 is nearly hexahedron-shaped, and has a medium facing surface 201a that faces the recording medium, a rear surface 201b that is opposite to the medium facing surface 201a, and four surfaces that connect the medium facing surface 201a to the rear surface 201b. The laser diode 202 is fixed to the rear surface 201b. One of the four surfaces that connect the medium facing surface 201a to the rear surface 201b is the top surface 201c. The slider 201 has a plurality of terminals 210 provided on the top surface 201c. In the present embodiment, the external mirror 203 is fixed to the laser diode 202.

When the recording medium rotates and travels in the Z direction, an airflow passing between the recording medium and the slider 201 generates a lift in the Y direction of FIG. 1, and the lift is exerted on the slider 201. The lift causes the slider 201 to slightly fly over the surface of the recording medium.

Figure 5:
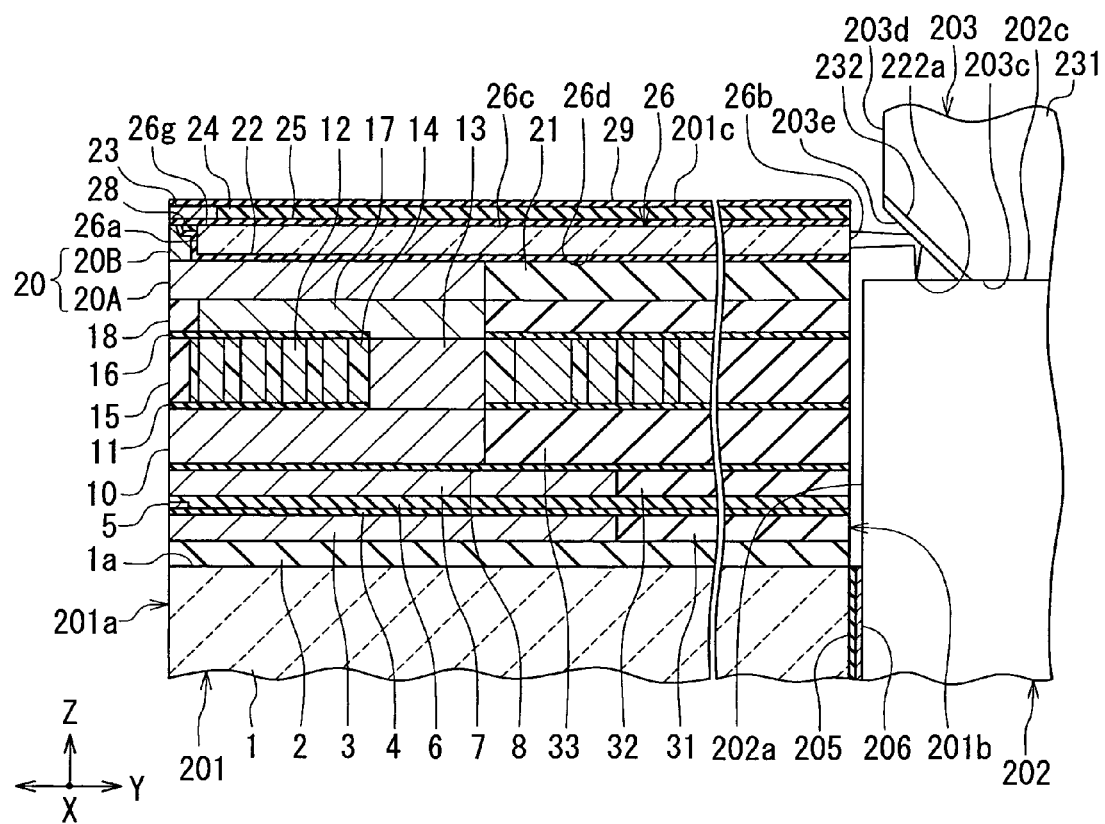
FIG. 5 is a cross-sectional view showing the configuration of a slider of the first embodiment of the invention.
Figure 6:
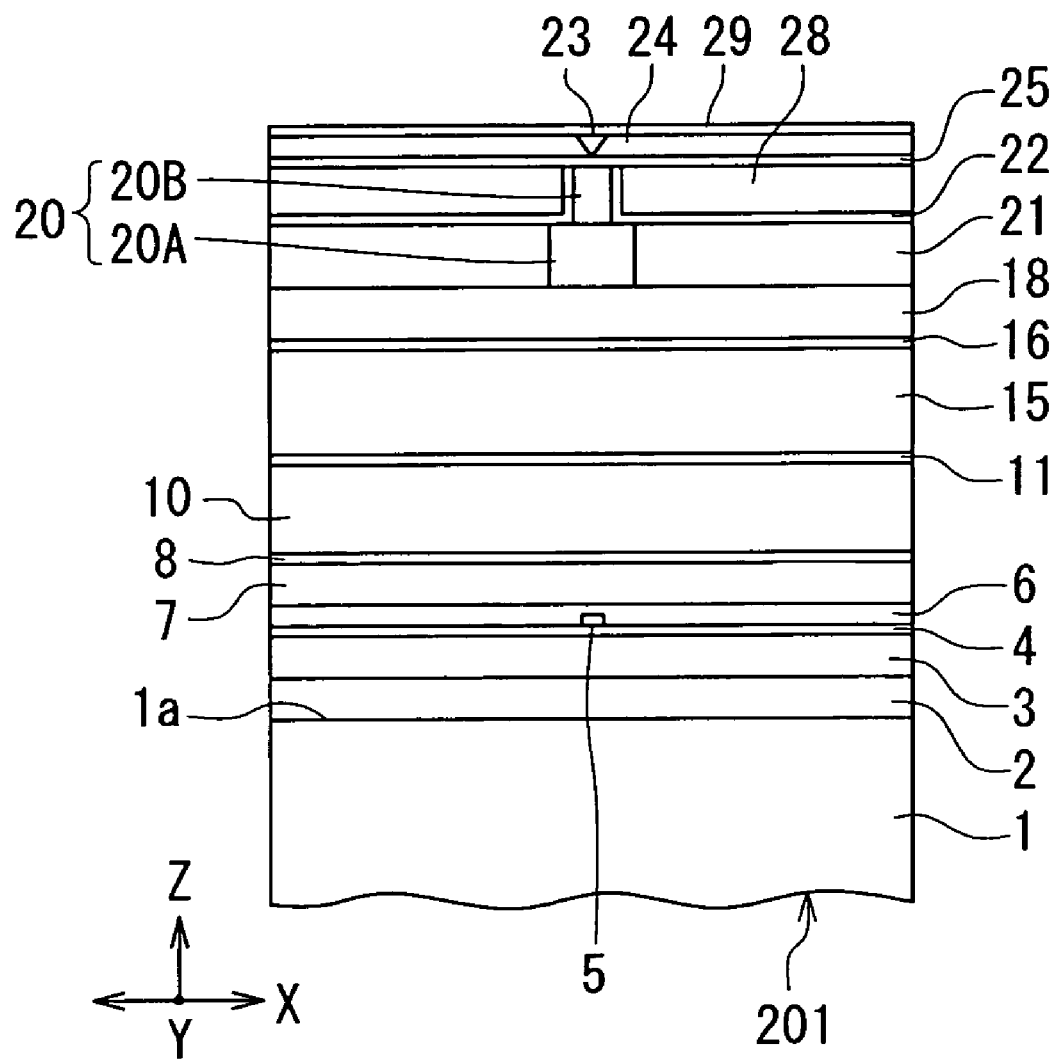
FIG. 6 is a front view showing the medium facing surface of the slider of the first embodiment of the invention.
Figure 7:
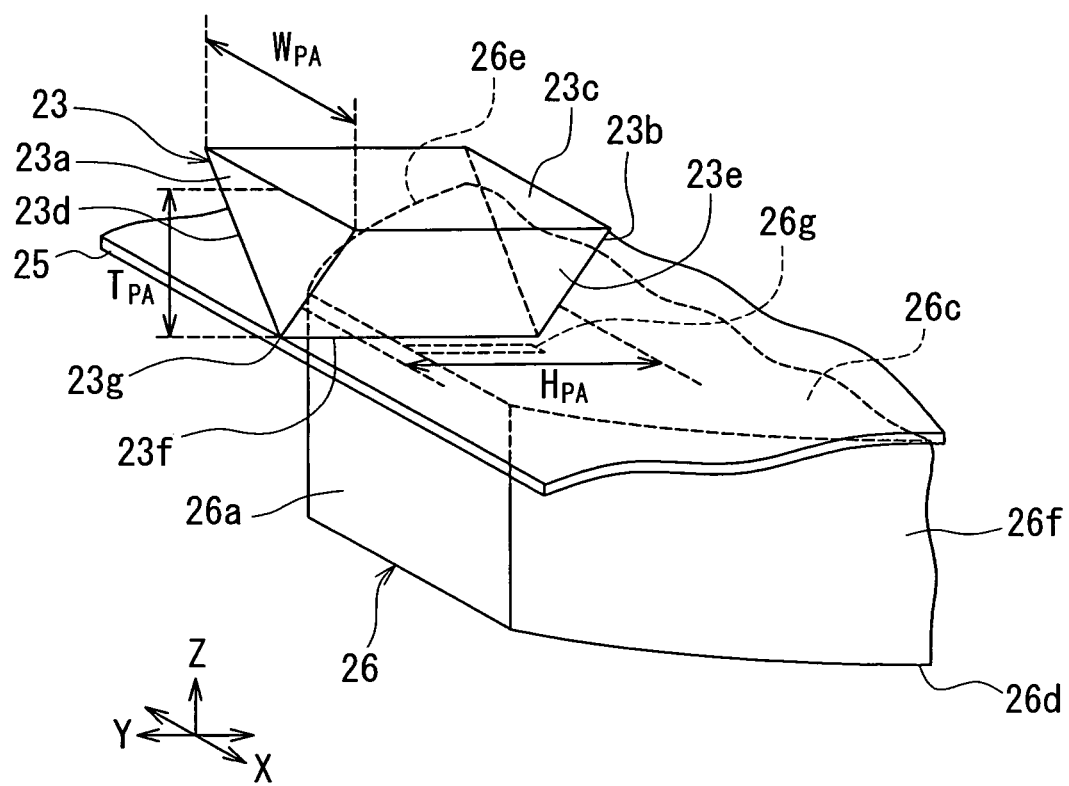
FIG. 7 is a perspective view showing a near-field light generating element and its vicinity in the heat-assisted magnetic recording head according to the first embodiment of the invention.

Reference is now made to FIG. 5 to FIG. 7 to describe the configuration of the slider 201 in detail. FIG. 5 is a cross-sectional view showing the configuration of the slider 201. FIG. 6 is a front view showing the medium facing surface 201a of the slider 201. FIG. 7 is a perspective view showing a near-field light generating element and its vicinity in the heat-assisted magnetic recording head 200. The X, Y and Z directions shown in FIG. 1 are also shown in FIG. 5 to FIG. 7.

In FIG. 5 the X direction is orthogonal to the Y and Z directions. In FIG. 6 the Y direction is orthogonal to the X and Z directions.

As shown in FIG. 5 and FIG. 6, the slider 201 includes: a substrate 1 made of a ceramic material such as aluminum oxide-titanium carbide ($Al_2O_3$—TiC) and having a top surface 1a; an insulating layer 2 made of an insulating material and disposed on the top surface 1a of the substrate 1; a bottom shield layer 3 made of a magnetic material and disposed on the insulating layer 2; and an insulating layer 31 made of an insulating material and disposed around the bottom shield layer 3 on the insulating layer 2. The insulating layers 2 and 31 are made of alumina ($Al_2O_3$), for example. The bottom shield layer 3 and the insulating layer 31 are flattened at the top.

The slider 201 further includes: a bottom shield gap film 4 which is an insulating film disposed over the top surfaces of the bottom shield layer 3 and the insulating layer 31; a magnetoresistive (MR) element 5 as a read element disposed on the bottom shield gap film 4; a top shield gap film 6 which is an insulating film disposed on the MR element 5; a top shield layer 7 made of a magnetic material and disposed on the top shield gap film 6; and an insulating layer 32 made of an insulating material and disposed around the top shield layer 7 on the top shield gap film 6. The insulating layer 32 is made of alumina, for example. The top shield layer 7 and the insulating layer 32 are flattened at the top.

An end of the MR element 5 is located in the medium facing surface 201a. The MR element 5 may be an element made of a magneto-sensitive film that exhibits a magnetoresistive effect, such as an anisotropic magnetoresistive (AMR) element, a giant magnetoresistive (GMR) element, or a tunneling magnetoresistive (TMR) element. The GMR element may be of either the current-in-plane (CIP) type in which a current used for detecting magnetic signals is fed in a direction nearly parallel to the plane of layers constituting the GMR element or the current-perpendicular-to-plane (CPP) type in which the current used for detecting magnetic signals is fed in a direction nearly perpendicular to the plane of layers constituting the GMR element. The parts from the bottom shield layer 3 to the top shield layer 7 constitute a reproducing head.

The slider 201 further includes: a nonmagnetic layer 8 made of a nonmagnetic material and disposed over the top surfaces of the top shield layer 7 and the insulating layer 32; a return magnetic pole layer 10 made of a magnetic material and disposed on the nonmagnetic layer 8; and an insulating layer 33 made of an insulating material and disposed around the return magnetic pole layer 10 on the nonmagnetic layer 8. The nonmagnetic layer 8 and the insulating layer 33 are made of alumina, for example. The return magnetic pole layer 10 and the insulating layer 33 are flattened at the top.

The slider 201 further includes: an insulating layer 11 disposed on part of the top surfaces of the return magnetic pole layer 10 and the insulating layer 33; a coil 12 disposed on the insulating layer 11; and a coupling layer 13 disposed on the return magnetic pole layer 10. The return magnetic pole layer 10 and the coupling layer 13 are each made of a magnetic material. The material of the return magnetic pole layer 10 and the coupling layer 13 may be CoFeN, CoNiFe, NiFe or CoFe, for example. The insulating layer 11 is made of alumina, for example. The coil 12 produces a magnetic field corresponding to data to be recorded on the recording medium. The coil 12 is planar spiral-shaped and wound around the coupling layer 13. The coil 12 is made of a conductive material such as copper.

The slider 201 further includes: an insulating layer 14 made of an insulating material and disposed around the coil 12 and in the space between every adjacent turns of the coil 12; an insulating layer 15 disposed around the insulating layer 14 and the coupling layer 13 on the insulating layer 11; and an insulating layer 16 disposed on the coil 12 and the insulating layers 14 and 15. The coil 12, the coupling layer 13 and the insulating layers 14 and 15 are flattened at the top. The insulating layer 14 is made of photoresist, for example. The insulating layers 15 and 16 are made of alumina, for example.

The slider 201 further includes: a bottom yoke layer 17 made of a magnetic material and disposed over the coupling layer 13 and the insulating layer 16; and a nonmagnetic layer 18 made of a nonmagnetic material and disposed around the bottom yoke layer 17 on the insulating layer 16. The material of the bottom yoke layer 17 may be CoFeN, CoNiFe, NiFe or CoFe, for example. The nonmagnetic layer 18 is made of alumina, for example. The bottom yoke layer 17 has an end face that is closer to the medium facing surface 201a, and this end face is located at a distance from the medium facing surface 201a. The bottom yoke layer 17 and the nonmagnetic layer 18 are flattened at the top.

The slider 201 further includes a magnetic pole 20. The magnetic pole 20 includes a first layer 20A and a second layer 20B. The first layer 20A lies over the bottom yoke layer 17 and the nonmagnetic layer 18. The first layer 20A has an end face located in the medium facing surface 201a. The end face is rectangular in shape, for example.

The second layer 20B lies on the first layer 20A in the vicinity of the medium facing surface 201a. The second layer 20B has a front end face located in the medium facing surface 201a, and a rear end face opposite to the front end face. The front end face of the second layer 20B is rectangular in shape, for example.

The magnetic pole 20 allows a magnetic flux corresponding to the magnetic field produced by the coil 12 to pass, and produces a recording magnetic field for recording data on the recording medium by means of a perpendicular magnetic recording system. The position of the end of a bit pattern to be recorded on the recording medium depends on the position of the top edge, i.e., the edge farther from the top surface 1a of the substrate 1, of the front end face of the second layer 20B. The width of the front end face of the second layer 20B taken at the top edge defines the track width.

The end face of the first layer 20A located in the medium facing surface 201a may have a width equal to or greater than the width of the front end face of the second layer 20B.

As shown in FIG. 5, the second layer 20B includes a first portion having the front end face, and a second portion that is located farther from the medium facing surface 201a than is the first portion and has a thickness smaller than that of the first portion. The first portion has a thickness that does not change with the distance from the medium facing surface 201a. The top surface of the first portion is located farther from the top surface 1a of the substrate 1 than is the top surface of the second portion. The top surface of the second layer 20B is thus bent.

The first layer 20A and the second layer 20B are each made of a magnetic metal material. The material of the first layer 20A and the second layer 20B may be NiFe, CoNiFe or CoFe, for example.

The slider 201 further includes a nonmagnetic layer 21 that is made of a nonmagnetic material and disposed around the first layer 20A on the nonmagnetic layer 18. The nonmagnetic layer 21 is made of alumina, for example. The first layer 20A and the nonmagnetic layer 21 are flattened at the top.

The slider 201 further includes a clad layer 22 disposed over the top surfaces of the first layer 20A and the nonmagnetic layer 21, and a waveguide 26 and a clad layer 28 that are disposed on the clad layer 22. The clad layer 22 is arranged to cover the top surfaces of the first layer 20A and the nonmagnetic layer 21 around the second layer 20B, and the rear end face and part of the top surface (the top surface of the second portion) of the second layer 20B. The clad layer 28 lies around the waveguide 26. The waveguide 26 is made of a dielectric material that transmits laser light to be described later. The clad layers 22 and 28 are each made of a dielectric material that has a refractive index lower than that of the waveguide 26. For example, the waveguide 26 is made of $Ta_2O_5$ which has a refractive index of approximately 2.1, and the clad layers 22 and 28 are made of alumina which has a refractive index of approximately 1.8. The first portion of the second layer 20B, the waveguide 26, and the clad layers 22 and 28 are flattened at the top. The shape of the waveguide 26 will be detailed later.

The slider 201 further includes an interposition layer 25 disposed over the top surfaces of the first portion of the second layer 20B, the waveguide 26 and the clad layers 22 and 28. The interposition layer 25 is made of a dielectric material that has a refractive index lower than that of the waveguide 26 and transmits the laser light. For example, the interposition layer 25 is made of alumina which has a refractive index of approximately 1.8. The interposition layer 25 has a thickness within the range of 30 to 70 nm, for example.

The slider 201 further includes: a near-field light generating element 23 disposed on the interposition layer 25; an insulating layer 24 made of an insulating material and disposed around the near-field light generating element 23 on the interposition layer 25; and an insulating layer 29 made of an insulating material and disposed over the near-field light generating element 23 and the insulating layer 24. The near-field light generating element 23 and the insulating layer 24 are flattened at the top. The near-field light generating element 23 is made of a metal. Specifically, the near-field light generating element 23 is made of one of Au, Ag, Al, Cu, Pd, Pt, Rh and Ir, or an alloy composed of two or more of these elements. The insulating layers 24 and 29 are made of alumina, for example. The top surface of the insulating layer 29 constitutes the top surface 201c of the slider 201. In the slider 201, the substrate 1 has the top surface 1a facing toward the magnetic pole 20, the near-field light generating element 23 and the waveguide 26, and the top surface 201c of the slider 201 lies at an end above the top surface 1a of the substrate 1.

As shown in FIG. 7, the near-field light generating element 23 has a near-field light generating part 23g located in the medium facing surface 201a. The near-field light generating element 23 is in the shape of a triangular prism, having an outer surface described below. The outer surface of the near-field light generating element 23 includes: a first end face 23a that is located in the medium facing surface 201a; a second end face 23b that is farther from the medium facing surface 201a; and a coupling portion that couples the first end face 23a and the second end face 23b to each other. The coupling portion includes: a top surface 23c that is farther from the top surface 1a of the substrate 1; two side surfaces 23d and 23e that decrease in distance from each other with decreasing distance to the top surface 1a of the substrate 1; and an edge part 23f that connects the two side surfaces 23d and 23e to each other. The first end face 23a is shaped like an isosceles triangle with the vertex downward. The first end face 23a includes the near-field light generating part 23g. Specifically, the near-field light generating part 23g refers to the end of the edge part 23f and its vicinity in the end face 23a.

As shown in FIG. 7, the length of the near-field light generating element 23 in the direction perpendicular to the medium facing surface 201a will be denoted by the symbol $H_{PA}$; the width of the first end face 23a at its top edge will be denoted by the symbol $W_{PA}$; and the length of the first end face 23a in the direction perpendicular to the top surface 1a of the substrate 1 will be denoted by the symbol $T_{PA}$. The length $H_{PA}$ of the near-field light generating element 23 in the direction perpendicular to the medium facing surface 201a is greater than the length $T_{PA}$ of the first end face 23a in the direction perpendicular to the top surface 1a of the substrate 1. Both of $W_{PA}$ and $T_{PA}$ are smaller than or equal to the wavelength of light that propagates through the waveguide 26. $W_{PA}$ falls within the range of 50 to 150 nm, for example. $T_{PA}$ falls within the range of 50 to 150 nm, for example. $H_{PA}$ falls within the range of 0.25 to 2.5 μm, for example.

Figure 4:
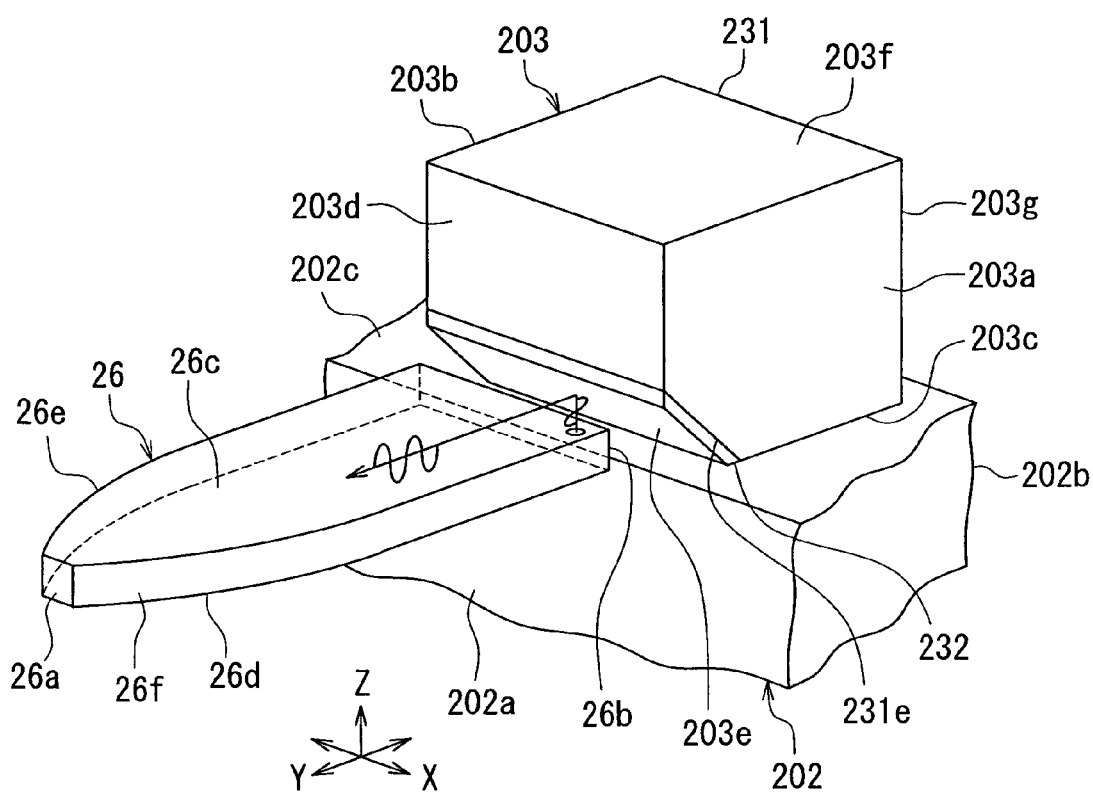
FIG. 4 is a perspective view showing the main part of the heat-assisted magnetic recording head according to the first embodiment of the invention.

A detailed description will now be given of the shape of the waveguide 26 with reference to FIG. 1 and FIG. 4. FIG. 4 is a perspective view showing the main part of the heat-assisted magnetic recording head 200. As shown in FIG. 1 and FIG. 4, the waveguide 26 extends in the direction perpendicular to the medium facing surface 201a (the Y direction). The waveguide 26 has an outer surface. The outer surface includes: a front end face 26a that is closer to the medium facing surface 201a; an incident end face 26b that is located in the rear surface 201b; a top surface 26c that is farther from the top surface 1a of the substrate 1; a bottom surface 26d that is closer to the top surface 1a of the substrate 1; and two side surfaces 26e and 26f that are opposite to each other in the track width direction. The front end face 26a is opposed to the rear end face of the second layer 20B with the clad layer 22 interposed therebetween.

As shown in FIG. 7, the outer surface of the waveguide 26 includes an opposed portion 26g that is opposed to a part of the coupling portion of the outer surface of the near-field light generating element 23. In the present embodiment, in particular, the opposed portion 26g is a portion of the top surface 26c of the waveguide 26 that is opposed to a part of the edge part 23f of the near-field light generating element 23 and its vicinity with the interposition layer 25 interposed therebetween. The previously-mentioned configuration that the length $H_{PA}$ of the near-field light generating element 23 in the direction perpendicular to the medium facing surface 201a is greater than the length $T_{PA}$ of the first end face 23a in the direction perpendicular to the top surface 1a of the substrate 1 is necessary in order that the opposed portion 26g, which is a part of the top surface 26c of the waveguide 26, is opposed to a part of the edge part 23f of the near-field light generating element 23 and its vicinity with the interposition layer 25 interposed therebetween.

Figure 3:
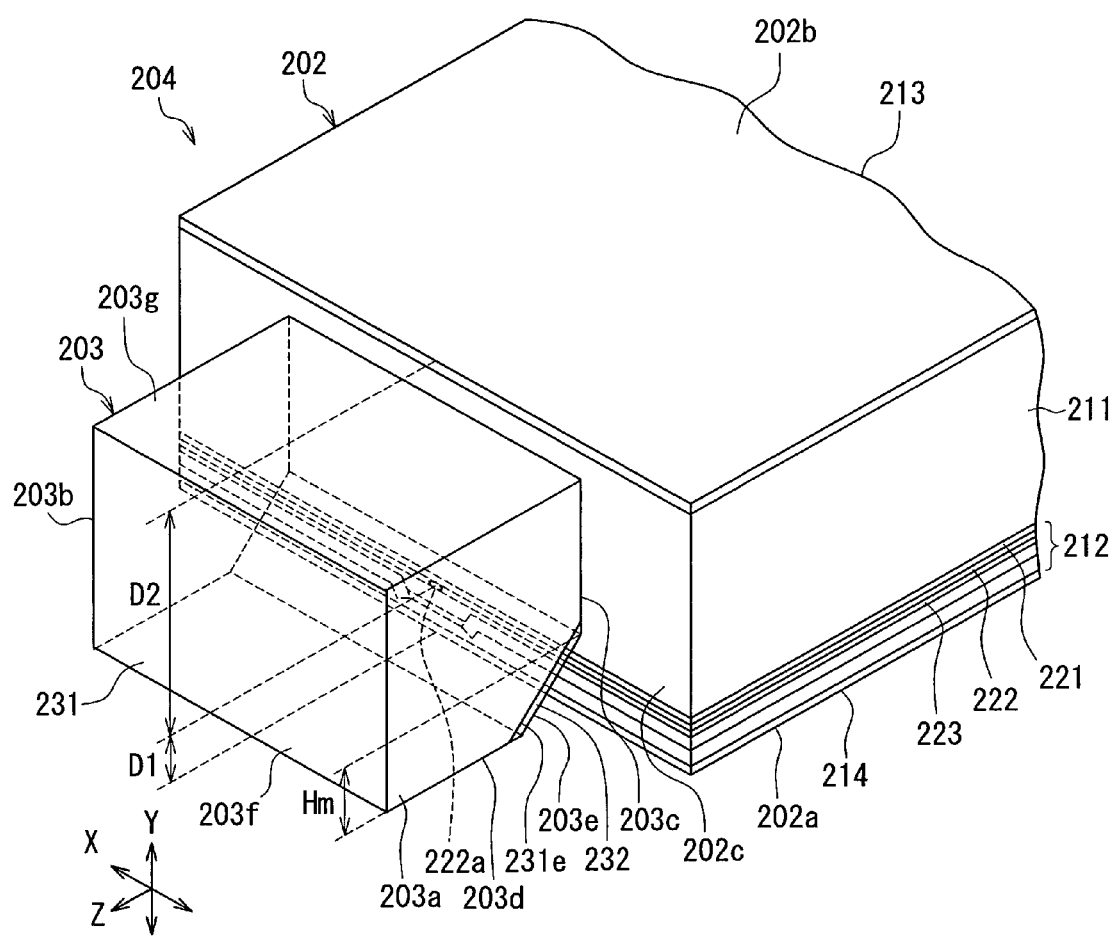
FIG. 3 is a perspective view showing the laser diode and the external mirror of FIG. 1.

Reference is now made to FIG. 3 to describe the laser diode 202 and the external mirror 203. FIG. 3 is a perspective view showing the laser diode 202 and the external mirror 203. First, a detailed description will be given of the laser diode 202. As shown in FIG. 3, the laser diode 202 includes: an n-substrate 211 having two surfaces that face toward opposite directions; an n-electrode 213 bonded to one of the two surfaces of the n-substrate 211; a laser structure part 212 integrated on the other of the two surfaces of the n-substrate 211; and a p-electrode 214 bonded to the laser structure part 212 such that the laser structure part 212 is sandwiched between the n-substrate 211 and the p-electrode 214. The laser structure part 212 includes at least an n-clad layer 221, an active layer 222 and a p-clad layer 223. The n-clad layer 221 is disposed between the n-substrate 211 and the active layer 222. The p-clad layer 223 is disposed between the p-electrode 214 and the active layer 222. The active layer 222 has a surface that faces the n-clad layer 221, and a surface that faces the p-clad layer 223.

The laser diode 202 is in the shape of a rectangular solid, having a mounting surface 202a that lies at an end in a direction perpendicular to the plane of the active layer 222, a rear surface 202b opposite to the mounting surface 202a, and four surfaces that connect the mounting surface 202a and the rear surface 202b to each other. The mounting surface 202a and the rear surface 202b are parallel to the plane of the active layer 222. The mounting surface 202a is formed by the surface of the p-electrode 214. The rear surface 202b is formed by the surface of the n-electrode 213. One of the four surfaces that connect the mounting surface 202a and the rear surface 202b to each other is an emitting end face 202c. The emitting end face 202c lies at an end in a direction parallel to the plane of the active layer 222. The emitting end face 202c includes an emission part 222a for emitting laser light. The emission part 222a lies at an end of the active layer 222. The mounting surface 202a and the rear surface 202b each have an area greater than that of the emitting end face 202c.

In the present embodiment, as shown in FIG. 3, the distance D1 between the mounting surface 202a and the emission part 222a of the laser diode 202 is smaller than the distance D2 between the rear surface 202b and the emission part 222a of the laser diode 202. D1 is 6 to 8 µm or so. D2 is around 50 µm. The surface of the n-substrate 211 to which the n-electrode 213 is to be bonded is typically polished, and the n-substrate 211 thus varies in thickness. This results in variations in D2. D1 varies smaller than D2 does.

As shown in FIG. 5, the heat-assisted magnetic recording head 200 further includes an insulating layer 205, and a conductor layer 206 disposed on the insulating layer 205. The insulating layer 205 covers the area of the rear surface 201b of the slider 201 that is formed by the surface of the substrate 1. The insulating layer 205 is made of alumina, for example. The conductor layer 206 is made of a metal such as Cu or Au. Note that the insulating layer 205 is omitted in FIG. 1 and FIG. 2. The insulating layer 205 need not be provided if the substrate 1 has sufficient insulation performance.

As shown in FIG. 1 and FIG. 2, the laser diode 202 is fixed to the slider 201 by bonding the p-electrode 214 (see FIG. 3) to the conductor layer 206 such that the mounting surface 202a faces the rear surface 201b of the slider 201 and the emitting end face 202c faces toward the Z direction.

As shown in FIG. 1, the heat-assisted magnetic recording head 200 further includes a bonding wire 207 that electrically connects the conductor layer 206 to one of the terminals 210, and a bonding wire 208 that electrically connects the n-electrode 213 to another one of the terminals 210. The p-electrode 214 is electrically connected to the one of the terminals 210 via the conductor layer 206 and the bonding wire 207.

Next, the external mirror 203 will be described in detail. As shown in FIG. 3, the external mirror 203 is in the shape of a pentagonal prism. More specifically, the external mirror 203 has two end faces 203a and 203b that face toward opposite directions, and five surfaces that connect the two end faces 203a and 203b to each other. The five surfaces include a first reference surface 203c, a second reference surface 203d, a reflecting surface 203e, and surfaces 203f and 203g. The first reference surface 203c is parallel to the emitting end face 202c of the laser diode 202, and faces the emitting end face 202c. The second reference surface 203d is parallel to the mounting surface 202a of the laser diode 202, and faces toward the same direction as the mounting surface 202a does. The reflecting surface 203e is oblique with respect to each of the first reference surface 203c and the second reference surface 203d, and connects the first reference surface 203c and the second reference surface 203d to each other. The surface 203f lies opposite to the first reference surface 203c and is parallel to the first reference surface 203c. The surface 203g lies opposite to the second reference surface 203d and is parallel to the second reference surface 203d. The surfaces 203f and 203g are orthogonal to each other. The surfaces 203c and 203g are orthogonal to each other. The surfaces 203d and 203f are orthogonal to each other. The reflecting surface 203e forms an angle of 45° with respect to each of the first reference surface 203c and the second reference surface 203d.

As shown in FIG. 3, the distance (difference in level) between both ends of the reflecting surface 203e in the direction perpendicular to the second reference surface 203d (Y direction) will be denoted by the reference symbol Hm. The distance Hm falls within the range of 5.0 to 9.0 µm, for example.

The external mirror 203 includes a block 231 in the shape of a pentagonal prism. The block 231 has the end faces 203a and 203b, the first reference surface 203c, the second reference surface 203d, the surface 203f, the surface 203g, and an oblique surface 231e. The oblique surface 231e is oblique with respect to each of the first reference surface 203c and the second reference surface 203d, and connects the first reference surface 203c and the second reference surface 203d to each other. The oblique surface 231e forms an angle of 45° with respect to each of the first reference surface 203c and the second reference surface 203d. The external mirror 203 further includes a metal film 232 that adheres to the oblique surface 231e to form the reflecting surface 203e.

The block 231 may be made of an insulating material such as glass or resin, a semiconductor material such as silicon, or a metal material. The metal film 232 is made of a metal such as Au, Cu, Cr, Ag, or Al. The metal film 232 has a thickness of 50 to 200 nm or so.

The first reference surface 203c is in contact with the emitting end face 202c of the laser diode 202. In the present embodiment, in particular, the external mirror 203 is fixed to the laser diode 202 by bonding the first reference surface 203c to the emitting end face 202c. The reflecting surface 203e is located in front of the emission part 222a. The second reference surface 203d may be either in contact with or not in contact with the rear surface 201b of the slider 201.

The laser diode 202 and the external mirror 203 constitute a laser assembly 204 according to the present embodiment. The laser assembly 204, in combination with the slider 201, constitutes the heat-assisted magnetic recording head 200. The laser assembly 204 and the parts of the slider 201 from the return magnetic pole layer 10 to the insulating layer 29 constitute a recording head.

Reference is now made to FIG. 1 to FIG. 5 to describe the path of the laser light emitted from the emission part 222a of the laser diode 202. The laser light emitted from the emission part 222a of the laser diode 202 is reflected by the reflecting surface 203e of the external mirror 203, enters the waveguide 26 from the incident end face 26b, and travels through the waveguide 26 toward the medium facing surface 201a (front end face 26a).

FIG. 1 and FIG. 4 show an example of the configuration of the waveguide 26. In this example, the two side surfaces 26e and 26f of the waveguide 26 are formed as a reflecting surface of parabolic shape in the vicinity of the front end face 26a as viewed from above. This reflecting surface has the function of collecting the light propagating through the waveguide 26 to the vicinity of the front end face 26a.

With reference to FIG. 4, a description will be given of the direction of polarization of the laser light of the present embodiment. In the present embodiment, the laser diode 202 emits linearly polarized laser light whose electric field oscillates in a direction perpendicular to the plane of the active layer 222, i.e., laser light of TM mode, from the emission part 222a. The direction of oscillation of the electric field of the laser light emitted from the emission part 222a is parallel to the YZ plane. The laser light emitted from the emission part 222a is reflected by the reflecting surface 203e of the external mirror 203 and enters the waveguide 26 from the incident end face 26b. Here, the direction of oscillation of the electric field of the laser light is parallel to the YZ plane. This laser light propagates through the waveguide 26 to reach the opposed portion 26g, which is a part of the top surface 26c. The direction of oscillation of the electric field of this laser light is perpendicular to the top surface 26c (the opposed portion 26g). This makes it possible to produce surface plasmons of high intensity on the near-field light generating element 23.

As has been described, the heat-assisted magnetic recording head 200 according to the present embodiment includes the slider 201, the edge-emitting laser diode 202 fixed to the slider 201, and the external mirror 203 provided outside the slider 201. The slider 201 includes: the medium facing surface 201a that faces the recording medium; the reproducing head; and a portion of the recording head other than the laser diode 202 and the external mirror 203 (hereinafter, referred to as an in-slider portion of the recording head). The reproducing head and the in-slider portion of the recording head are stacked on the substrate 1. The in-slider portion of the recording head is located on the front side (trailing side) relative to the reproducing head in the direction of travel of the recording medium (the Z direction).

The reproducing head includes: the MR element 5 as the read element; the bottom shield layer 3 and the top shield layer 7 for shielding the MR element 5, the respective portions of the bottom shield layer 3 and the top shield layer 7 located near the medium facing surface 201a being opposed to each other with the MR element 5 therebetween; the bottom shield gap film 4 disposed between the MR element 5 and the bottom shield layer 3; and the top shield gap film 6 disposed between the MR element 5 and the top shield layer 7.

The in-slider portion of the recording head includes the return magnetic pole layer 10, the coil 12, the coupling layer 13, the bottom yoke layer 17, and the magnetic pole 20. The coil 12 produces a magnetic field corresponding to data to be recorded on the recording medium. The return magnetic pole layer 10, the coupling layer 13, the bottom yoke layer 17 and the magnetic pole 20 form a magnetic path for passing a magnetic flux corresponding to the magnetic field produced by the coil 12. The magnetic pole 20 includes the first layer 20A and the second layer 20B. The magnetic pole 20 allows the magnetic flux corresponding to the magnetic field produced by the coil 12 to pass, and produces a recording magnetic field for recording data on the recording medium by means of the perpendicular magnetic recording system. The position of the end of a bit pattern to be recorded on the recording medium depends on the position of the top edge, i.e., the edge farther from the top surface 1a of the substrate 1, of the front end face of the second layer 20B located in the medium facing surface 201a. The width of the front end face of the second layer 20B located in the medium facing surface 201a taken at the top edge defines the track width. The return magnetic pole layer 10, the coupling layer 13 and the bottom yoke layer 17 have the function of returning a magnetic flux to the magnetic pole 20, the magnetic flux having been generated from the magnetic pole 20 and having magnetized the recording medium.

The in-slider portion of the recording head further includes the near-field light generating element 23, the interposition layer 25, the waveguide 26, and the clad layers 22 and 28. The substrate 1 has the top surface 1a facing toward the magnetic pole 20, the near-field light generating element 23 and the waveguide 26. The waveguide 26 is located farther from the top surface 1a of the substrate 1 than is the first layer 20A. The front end face 26a of the waveguide 26 is opposed to the rear end face of the second layer 20B. The near-field light generating element 23 is located farther from the top surface 1a of the substrate 1 than is the second layer 20B.

The outer surface of the near-field light generating element 23 includes: the first end face 23a that is located in the medium facing surface 201a; the second end face 23b that is farther from the medium facing surface 201a; and the coupling portion that couples the first end face 23a and the second end face 23b to each other. The coupling portion includes: the top surface 23c that is farther from the top surface 1a of the substrate 1; the two side surfaces 23d and 23e that decrease in distance from each other with decreasing distance to the top surface 1a of the substrate 1; and the edge part 23f that connects the two side surfaces 23d and 23e to each other. The first end face 23a includes the near-field light generating part 23g. The length $H_{PA}$ of the near-field light generating element 23 in the direction perpendicular to the medium facing surface 201a (the Y direction) is greater than the length $T_{PA}$ of the first end face 23a in the direction perpendicular to the top surface 1a of the substrate 1. As will be detailed later, surface plasmons are excited on the near-field light generating element 23 based on the light propagating through the waveguide 26. The surface plasmons propagate to the near-field light generating part 23g, and the near-field light generating part 23g generates near-field light based on the surface plasmons.

The waveguide 26 is located closer to the top surface 1a of the substrate 1 than is the near-field light generating element 23. The outer surface of the waveguide 26 includes the opposed portion 26g that is opposed to a part of the edge part 23f of the near-field light generating element 23 with the interposition layer 25 interposed therebetween.

The interposition layer 25 and the clad layers 22 and 28 are each made of a dielectric material that has a refractive index lower than that of the waveguide 26. Consequently, the outer surface of the waveguide 26 excluding the incident end face 26b is covered with the dielectric material that is lower in refractive index than the waveguide 26.

The recording head further includes the edge-emitting laser diode 202 fixed to the slider 201, and the external mirror 203 provided outside the slider 201. The slider 201 has the medium facing surface 201a that faces the recording medium, and the rear surface 201b opposite thereto. The laser diode 202 has: the active layer 222; the emitting end face 202c that lies at an end in the direction parallel to the plane of the active layer 222 and includes the emission part 222a for emitting laser light; and the mounting surface 202a that lies at an end in the direction perpendicular to the plane of the active layer 222. The laser diode 202 is fixed to the slider 201 such that the mounting surface 202a faces the rear surface 201b of the slider 201 and the emitting end face 202c faces toward the Z direction. The reflecting surface 203e of the external mirror 203 reflects the laser light emitted from the emission part 222a toward the waveguide 26 in the slider 201. The laser light reflected by the external mirror 203 enters the waveguide 26 from the incident end face 26b, and travels through the waveguide 26 toward the medium facing surface 201a (front end face 26a).

Now, the principle of generation of near-field light in the present embodiment and the principle of heat-assisted magnetic recording using the near-field light will be described in detail. As described above, the laser light emitted from the emission part 222a of the laser diode 202 is reflected by the external mirror 203, enters the waveguide 26 from the incident end face 26b, and travels through the waveguide 26 toward the medium facing surface 201a (the front end face 26a). The laser light propagates through the waveguide 26 to reach the vicinity of the opposed portion 26g. The laser light is then totally reflected at the interface between the opposed portion 26g and the interposition layer 25, and this generates evanescent light permeating into the interposition layer 25. As a result, the evanescent light and the collective oscillations of charges on a part of the coupling portion (a part of the edge part 23f and its vicinity) of the outer surface of the near-field light generating element 23, i.e., surface plasmons, are coupled with each other to excite a system of surface plasmon polaritons. In this way, surface plasmons are excited on the near-field light generating element 23.

The surface plasmons excited on the near-field light generating element 23 propagate along the edge part 23f of the near-field light generating element 23 toward the near-field light generating part 23g. Consequently, the surface plasmons concentrate at the near-field light generating part 23g, and the near-field light generating part 23g generates near-field light based on the surface plasmons. The near-field light is projected toward the recording medium, reaches the surface of the recording medium and heats a part of the magnetic recording layer of the recording medium. This lowers the coercivity of the part of the magnetic recording layer. In heat-assisted magnetic recording, the part of the magnetic recording layer with the lowered coercivity is subjected to a recording magnetic field produced by the magnetic pole 20 for data recording.

Reference is now made to FIG. 8A to FIG. 16A and FIG. 8B to FIG. 16B to describe a manufacturing method for the heat-assisted magnetic recording head 200 according to the present embodiment. FIG. 8A to FIG. 16A each show a cross section of a stack of layers formed in the process of manufacturing the heat-assisted magnetic recording head 200, the cross section being perpendicular to the medium facing surface and the substrate. In FIG. 8A to FIG. 16A, the symbol "ABS" indicates the position where the medium facing surface 201a is to be formed. FIG. 8B to FIG. 16B show cross sections at the position ABS of FIG. 8A to FIG. 16A, respectively.

Figure 8A:
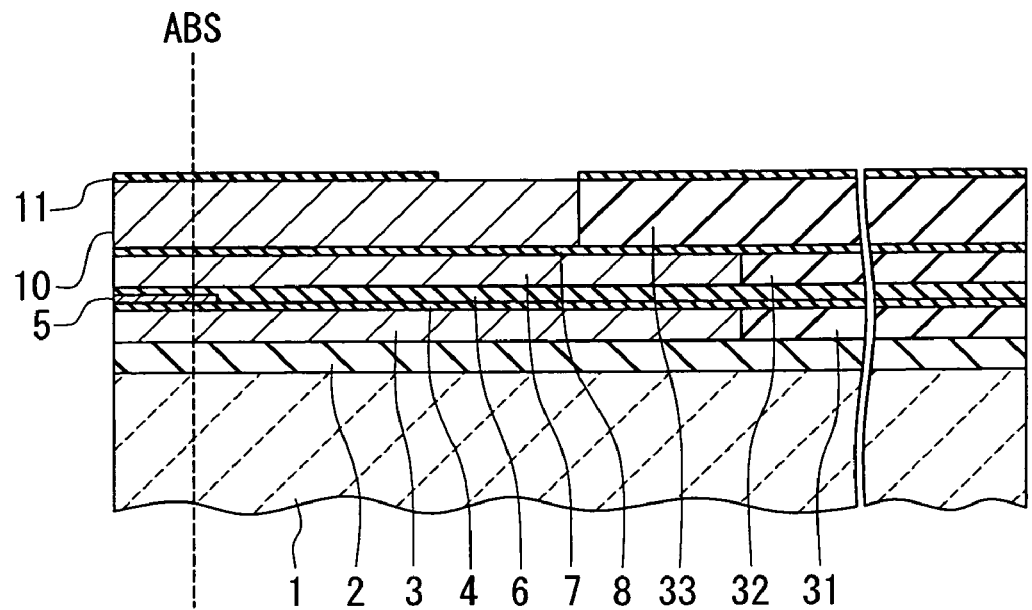
FIG. 8A and FIG. 8B are explanatory diagrams showing a step of a method of manufacturing the heat-assisted magnetic recording head according to the first embodiment of the invention.
Figure 8B:
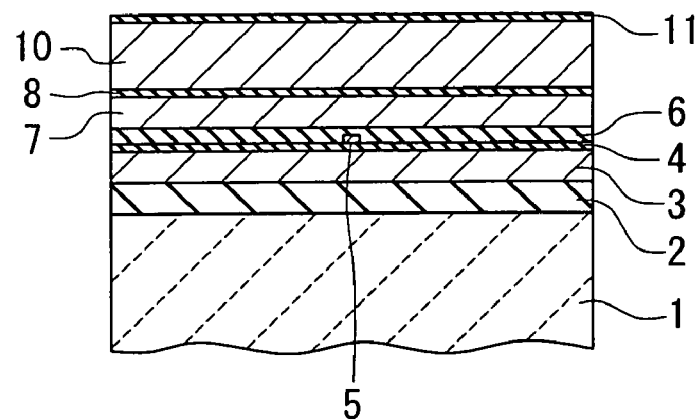

In the manufacturing method for the heat-assisted magnetic recording head 200 according to the present embodiment, first, the insulating layer 2 is formed on the substrate 1 as shown in FIG. 8A and FIG. 8B. Next, the bottom shield layer 3 is formed on the insulating layer 2. Next, the insulating layer 31 is formed to cover the bottom shield layer 3. Next, the insulating layer 31 is polished by, for example, chemical mechanical polishing (hereinafter referred to as CMP), until the bottom shield layer 3 is exposed. The bottom shield layer 3 and the insulating layer 31 are thereby flattened at the top. Next, the bottom shield gap film 4 is formed over the bottom shield layer 3 and the insulating layer 31. Next, the MR element 5 and leads (not shown) connected to the MR element 5 are formed on the bottom shield gap film 4. Next, the top shield gap film 6 is formed to cover the MR element 5 and the leads. Next, the top shield layer 7 is formed on the top shield gap film 6. Next, the insulating layer 32 is formed to cover the top shield layer 7. Next, the insulating layer 32 is polished by, for example, CMP, until the top shield layer 7 is exposed. The top shield layer 7 and the insulating layer 32 are thereby flattened at the top. Next, the nonmagnetic layer 8 is formed over the top shield layer 7 and the insulating layer 32. Next, the return magnetic pole layer 10 is formed on the nonmagnetic layer 8. Next, the insulating layer 33 is formed to cover the return magnetic pole layer 10. Next, the insulating layer 33 is polished by, for example, CMP, until the return magnetic pole layer 10 is exposed. The return magnetic pole layer 10 and the insulating layer 33 are thereby flattened at the top. Next, the insulating layer 11 is formed on part of the top surfaces of the return magnetic pole layer 10 and the insulating layer 33.

Figure 9A:
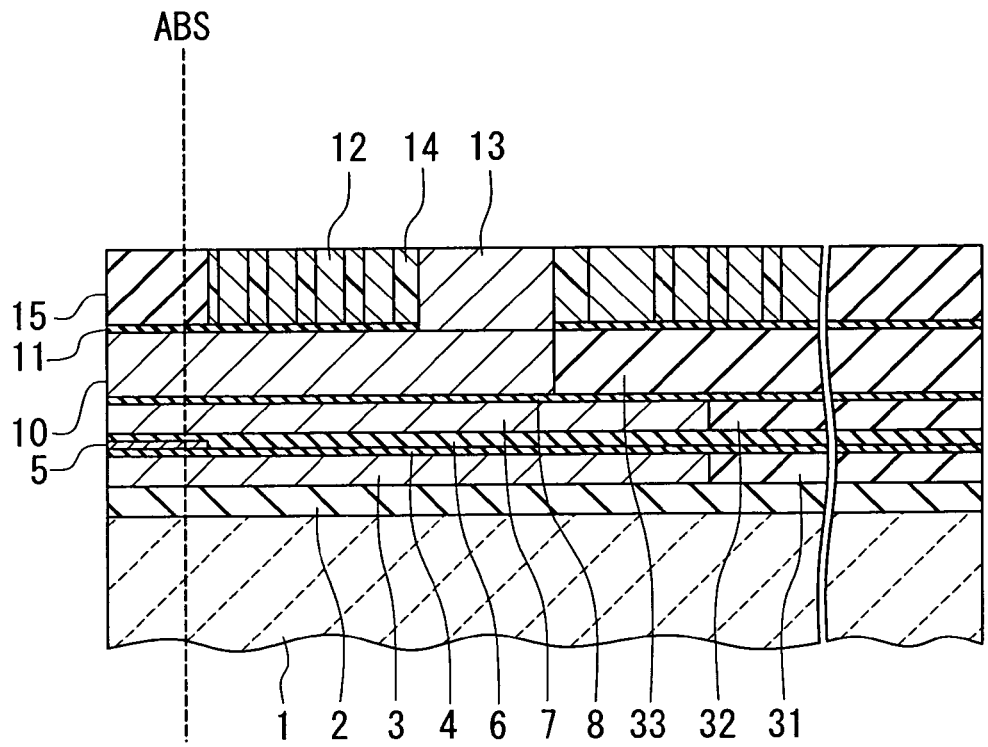
FIG. 9A and FIG. 9B are explanatory diagrams showing a step that follows the step of FIG. 8A and FIG. 8B.
Figure 9B:
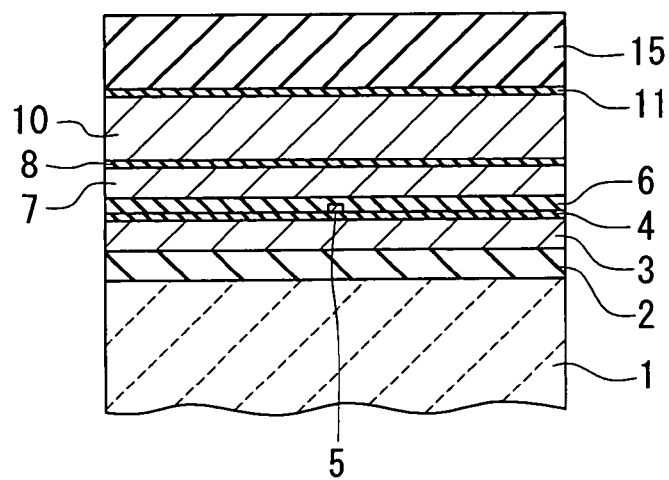

FIG. 9A and FIG. 9B show the next step. In this step, first, the coil 12 is formed on the insulating layer 11 by frame plating, for example. Next, the coupling layer 13 is formed on the return magnetic pole layer 10 by frame plating, for example. Alternatively, the coil 12 may be formed after forming the coupling layer 13. Next, the insulating layer 14 made of photoresist, for example, is selectively formed around the coil 12 and in the space between every adjacent turns of the coil 12. Next, the insulating layer 15 is formed over the entire top surface of the stack by sputtering, for example. Next, the insulating layer 15 is polished by, for example, CMP, until the coil 12 and the coupling layer 13 are exposed. The coil 12, the coupling layer 13 and the insulating layers 14 and 15 are thereby flattened at the top.

Figure 10A:
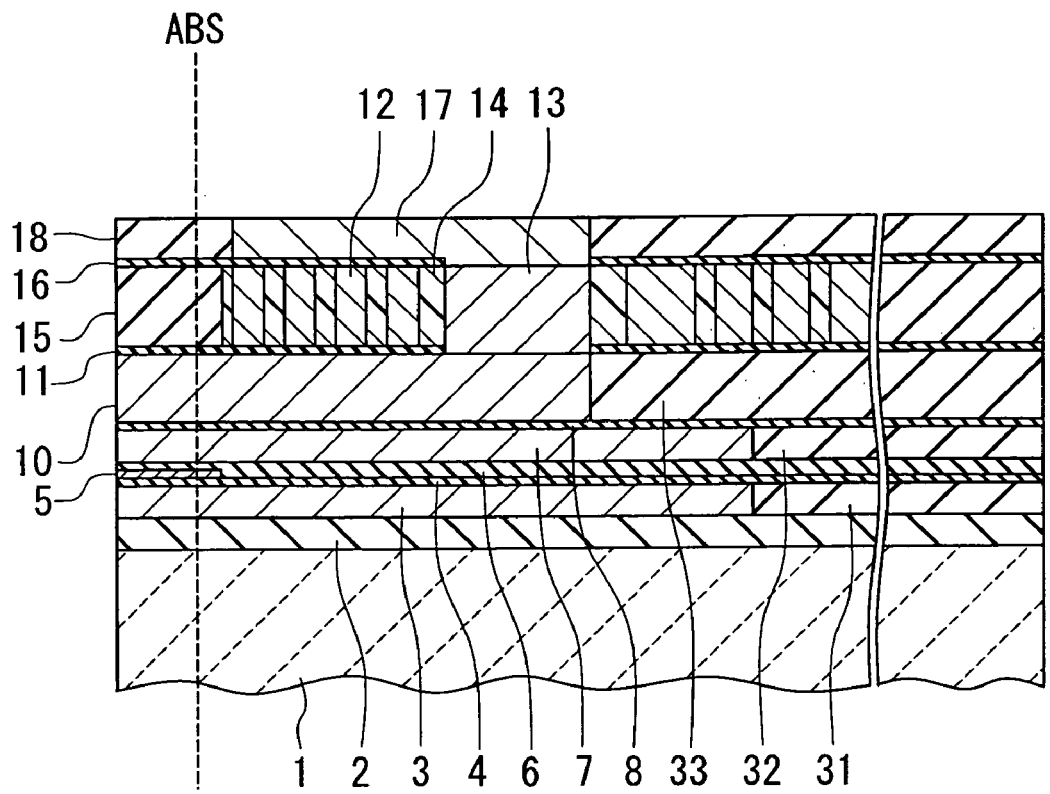
FIG. 10A and FIG. 10B are explanatory diagrams showing a step that follows the step of FIG. 9A and FIG. 9B.
Figure 10B:
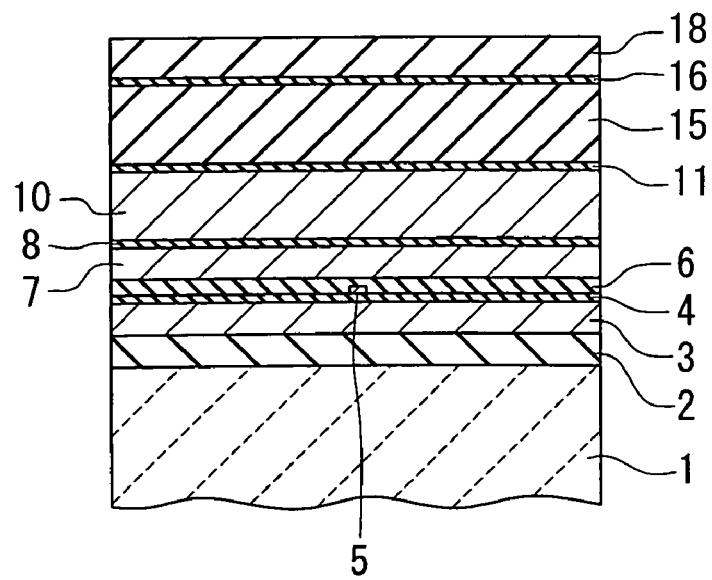

FIG. 10A and FIG. 10B show the next step. In this step, first, the bottom yoke layer 17 is formed over the coupling layer 13 and the insulating layer 16 by frame plating, for example. Next, the nonmagnetic layer 18 is formed over the entire top surface of the stack. The nonmagnetic layer 18 is then polished by, for example, CMP, until the bottom yoke layer 17 is exposed. The bottom yoke layer 17 and the nonmagnetic layer 18 are thereby flattened at the top.

Figure 11A:
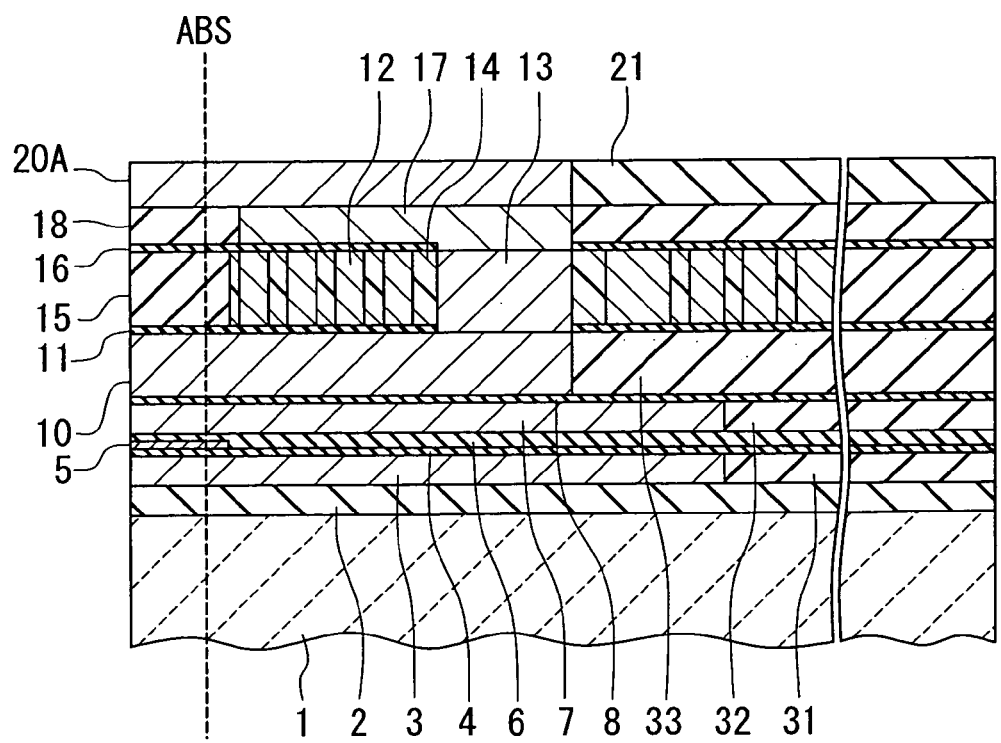
FIG. 11A and FIG. 11B are explanatory diagrams showing a step that follows the step of FIG. 10A and FIG. 10B.
Figure 11B:
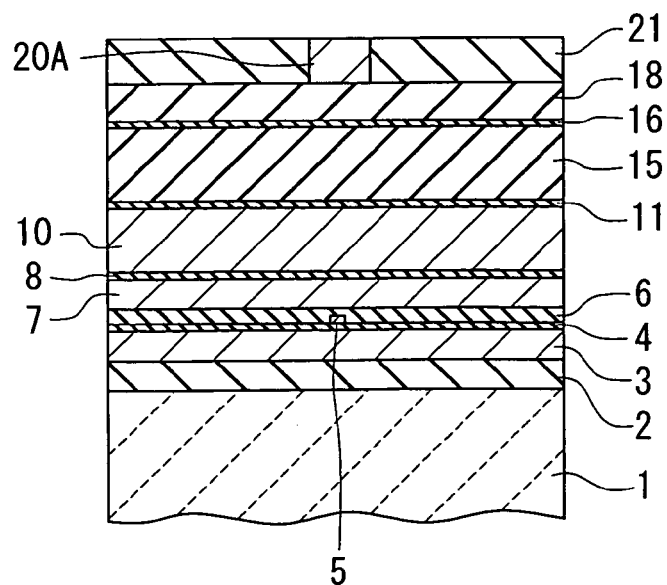

FIG. 11A and FIG. 11B show the next step. In this step, first, the first layer 20A is formed over the bottom yoke layer 17 and the nonmagnetic layer 18 by frame plating, for example. Next, the nonmagnetic layer 21 is formed over the entire top surface of the stack. The nonmagnetic layer 21 is then polished by, for example, CMP, until the first layer 20A is exposed. The first layer 20A and the nonmagnetic layer 21 are thereby flattened at the top.

Figure 12A:
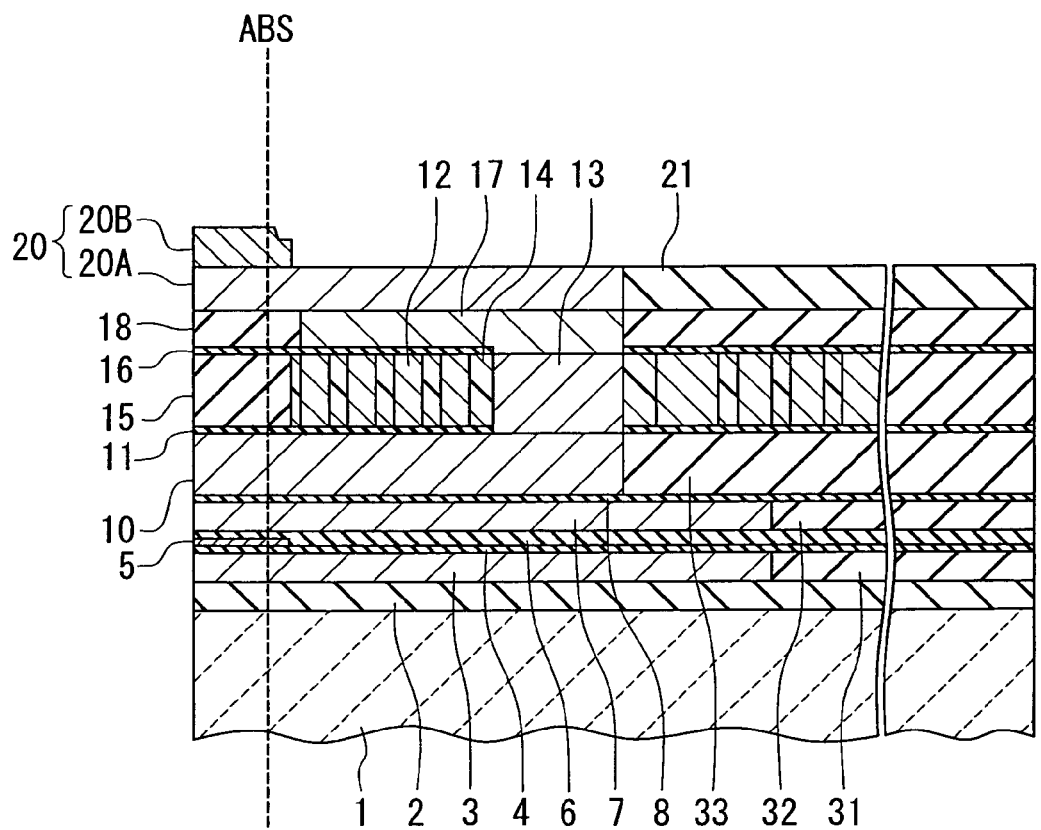
FIG. 12A and FIG. 12B are explanatory diagrams showing a step that follows the step of FIG. 11A and FIG. 11B.
Figure 12B:
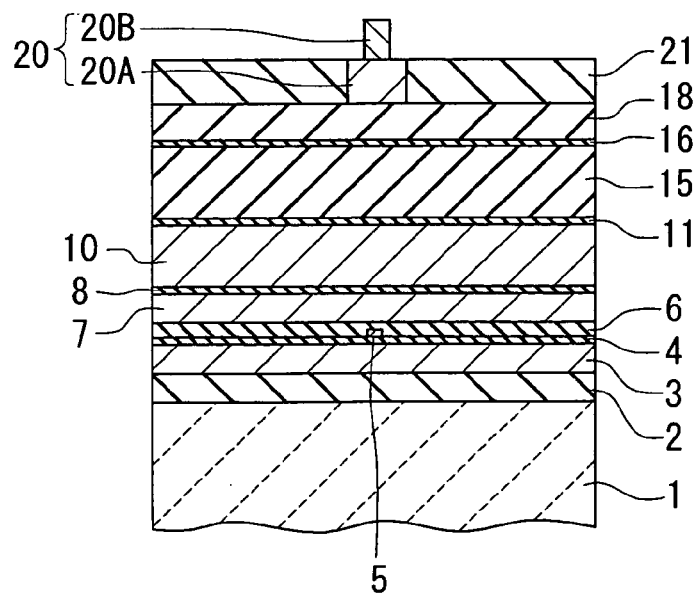

FIG. 12A and FIG. 12B show the next step. In this step, first, a magnetic layer is formed on the first layer 20A by frame plating, for example. The magnetic layer is to be made into the second layer 20B afterward. Next, a part of the magnetic layer is etched by, for example, ion beam etching, so that the first portion and the second portion are formed in the magnetic layer and the magnetic layer is thereby made into the second layer 20B.

Figure 13A:
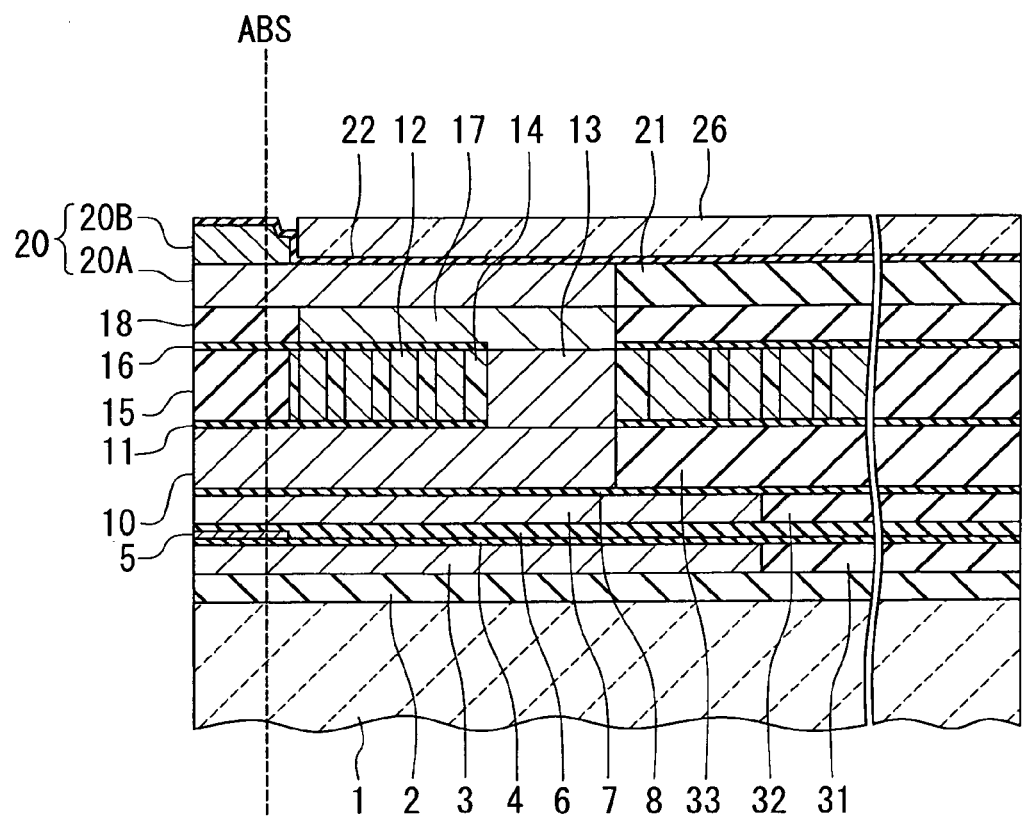
FIG. 13A and FIG. 13B are explanatory diagrams showing a step that follows the step of FIG. 12A and FIG. 12B.
Figure 13B:
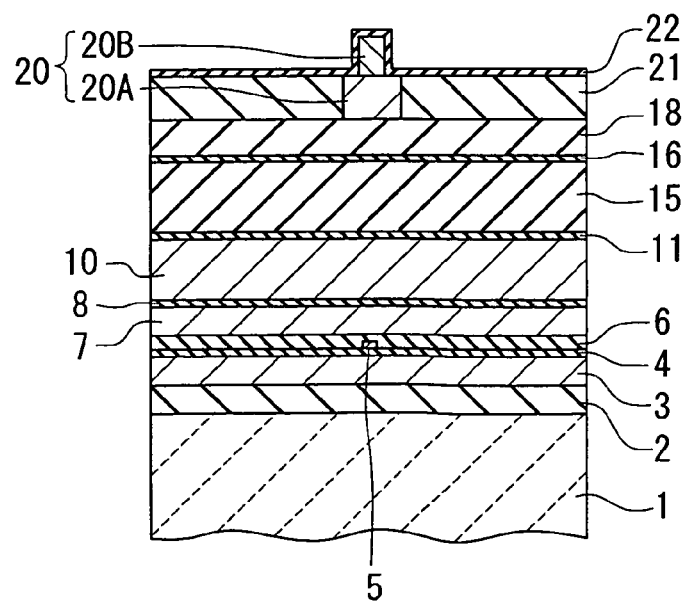

FIG. 13A and FIG. 13B show the next step. In this step, first, the clad layer 22 is formed over the entire top surface of the stack. Next, the waveguide 26 patterned is formed on the clad layer 22.

Figure 14A:
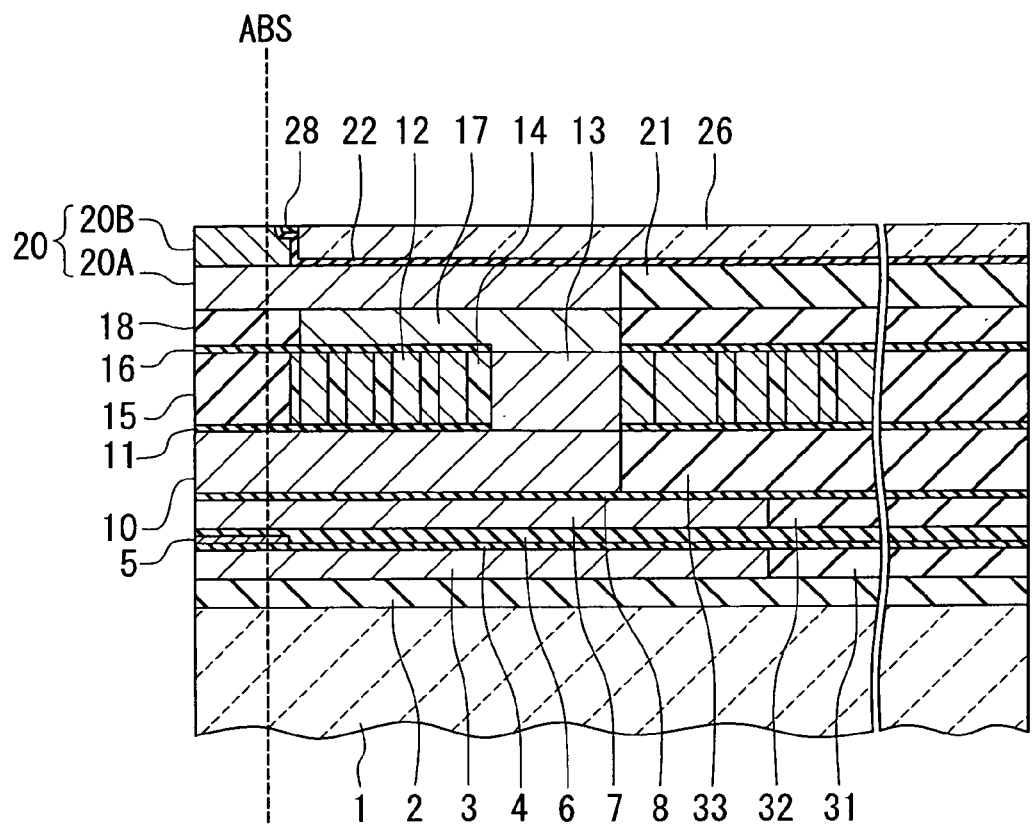
FIG. 14A and FIG. 14B are explanatory diagrams showing a step that follows the step of FIG. 13A and FIG. 13B.
Figure 14B:
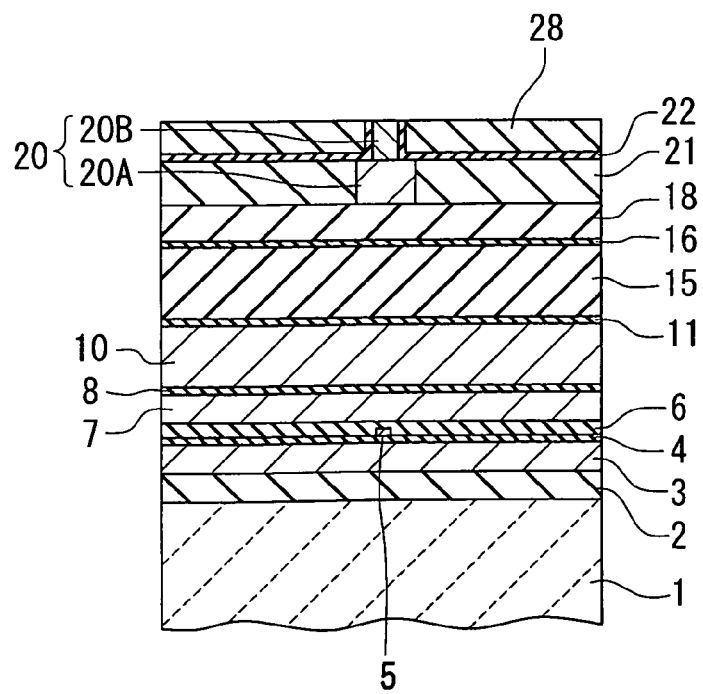

FIG. 14A and FIG. 14B show the next step. In this step, first, the clad layer 28 is formed over the entire top surface of the stack. Next, the waveguide 26 and the clad layers 22 and 28 are polished until the first portion of the second layer 20B is exposed. The first portion of the second layer 20B, the waveguide 26 and the clad layers 22 and 28 are thereby flattened at the top.

Figure 15A:
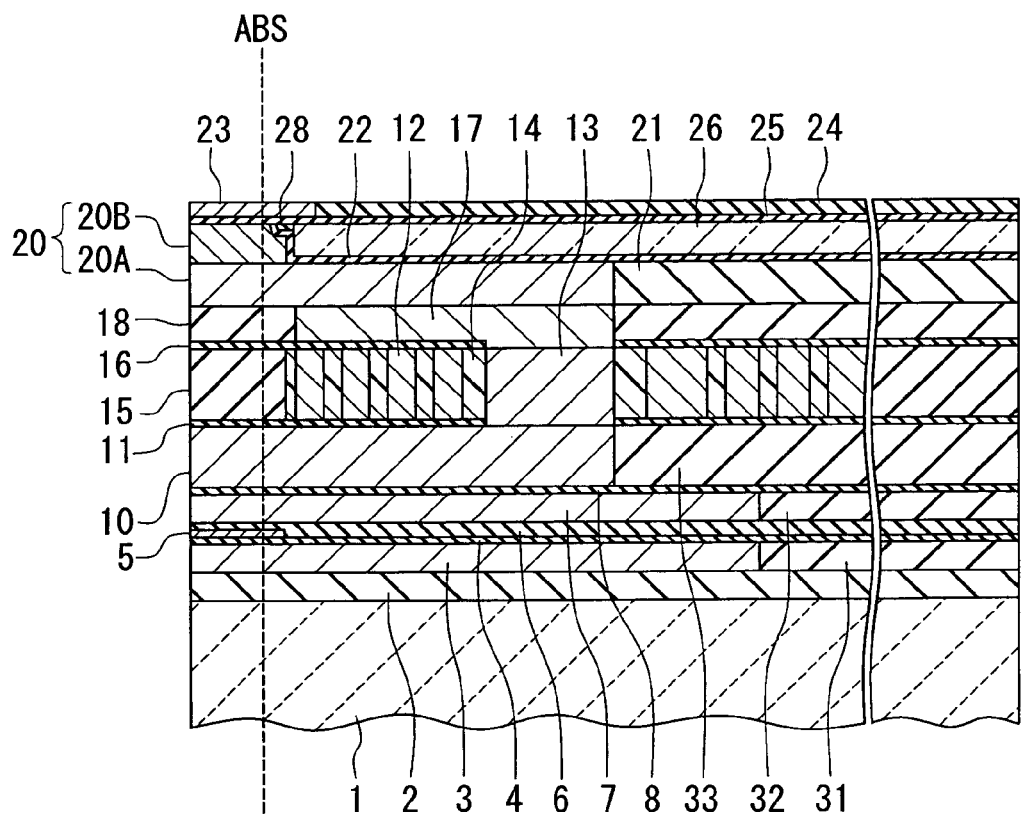
FIG. 15A and FIG. 15B are explanatory diagrams showing a step that follows the step of FIG. 14A and FIG. 14B.
Figure 15B:
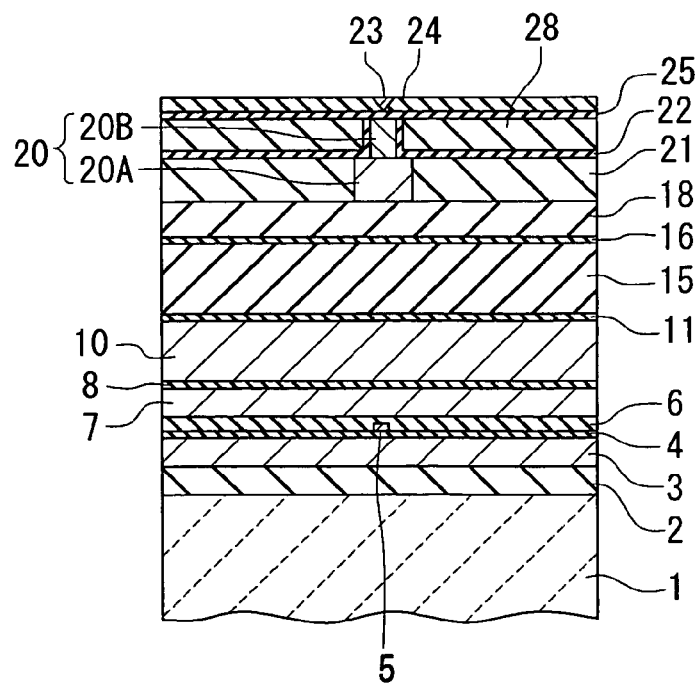

FIG. 15A and FIG. 15B show the next step. In this step, first, the interposition layer 25 is formed over the first portion of the second layer 20B, the waveguide 26 and the clad layers 22 and 28. Next, the insulating layer 24 is formed on the interposition layer 25. The insulating layer 24 is then selectively etched to form therein a groove for accommodating the near-field light generating element 23. The near-field light generating element 23 is then formed to be accommodated in the groove of the insulating layer 24.

Figure 16A:
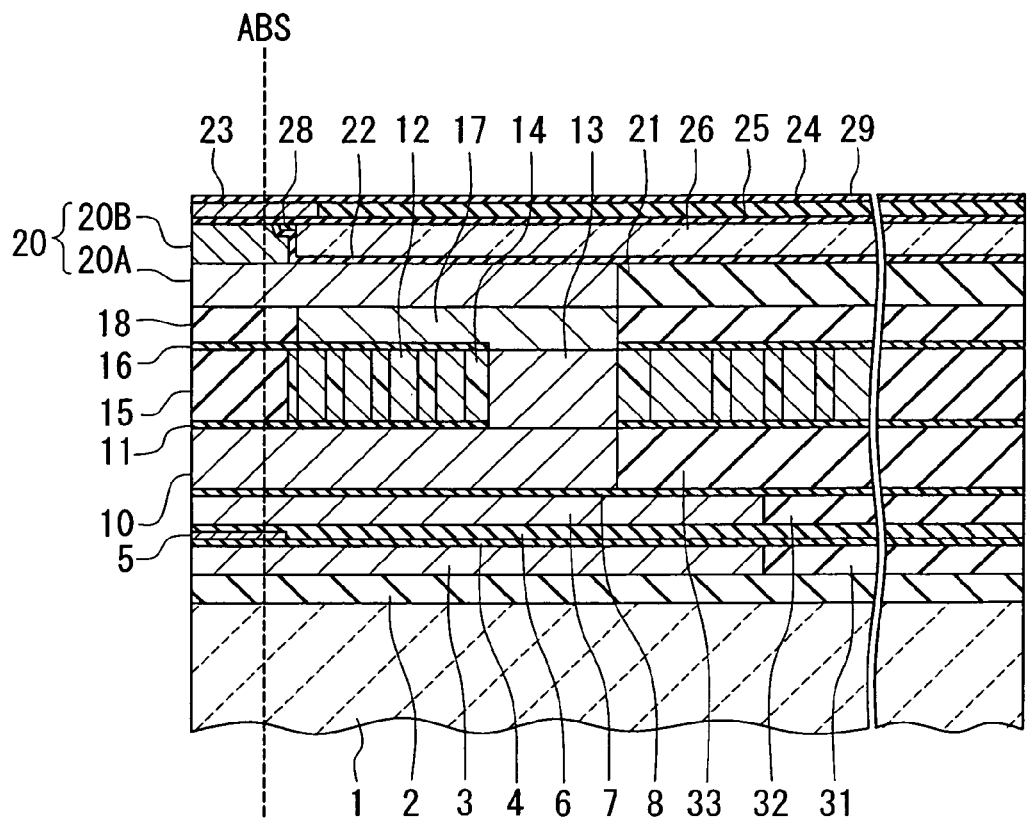
FIG. 16A and FIG. 16B are explanatory diagrams showing a step that follows the step of FIG. 15A and FIG. 15B.
Figure 16B:
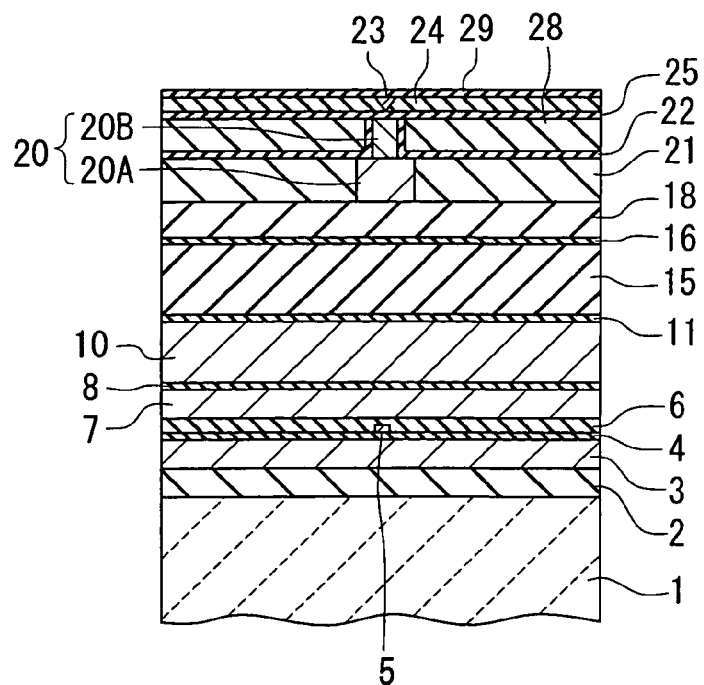

Next, as shown in FIG. 16A and FIG. 16B, the insulating layer 29 is formed over the entire top surface of the stack. Wiring, the terminals 210 and so on are then formed on the top surface of the insulating layer 29.

Next, the substrate is cut into sliders, and working including polishing of the medium facing surface 201a and the rear surface 201b, formation of flying rails in the medium facing surface 201a, etc. is performed. Next, as shown in FIG. 5, the insulating layer 205 and the conductor layer 206 are formed in this order on the rear surface 201b.

Next, the laser assembly 204 is fixed to the slider 201 by bonding the p-electrode 214 of the laser diode 202 to the conductor layer 206 such that the mounting surface 202a of the laser diode 202 faces the rear surface 201b of the slider 201 and the emitting end face 202c faces toward the Z direction. Alignment of the laser assembly 204 with respect to the slider 201 may be performed using a flip chip bonder, for example. Bonding of the p-electrode 214 of the laser diode 202 to the conductor layer 206 may be performed using a conductive bonding material such as solder or a conductive adhesive, or by ultrasonic bonding.

Next, as shown in FIG. 1, the conductor layer 206 is electrically connected to one of the terminals 210 with the bonding wire 207, and the n-electrode 213 of the laser diode 202 is electrically connected to another one of the terminals 210 with the bonding wire 208. The heat-assisted magnetic recording head 200 is completed through the foregoing series of steps.

A manufacturing method for the laser assembly 204 according to the present embodiment will now be described. The manufacturing method for the laser assembly 204 according to the present embodiment includes the step of fabricating the external mirror 203 and the step of bonding the first reference surface 203c of the external mirror 203 to the emitting end face 202c of the laser diode 202. The first reference surface 203c is bonded to the emitting end face 202c with an adhesive, for example.

Figure 17:
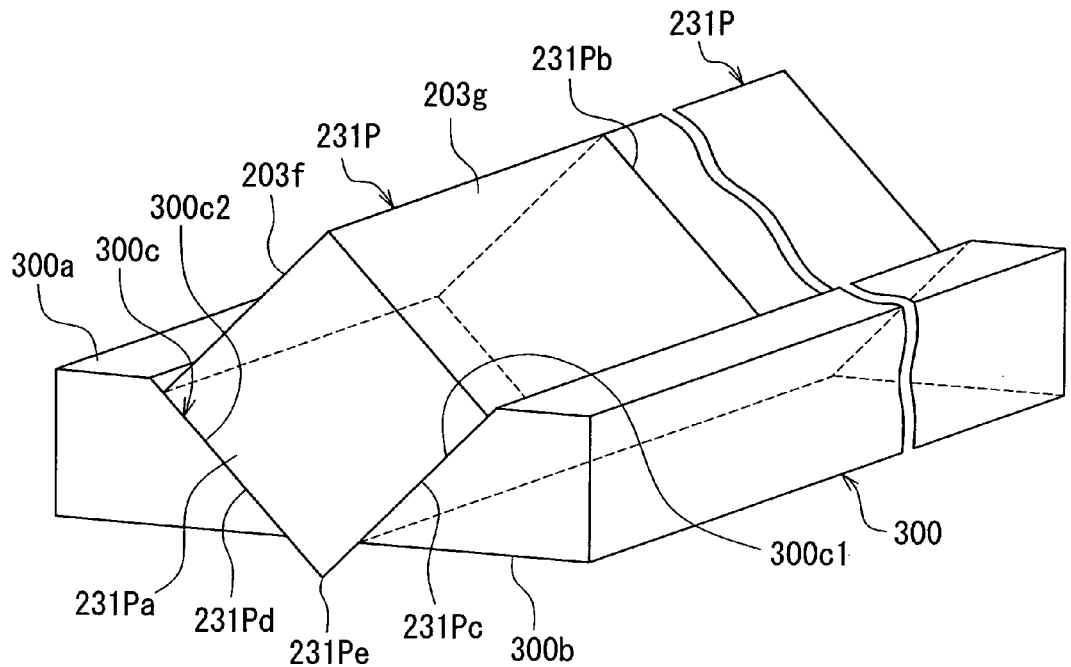
FIG. 17 is a perspective view showing a step of a fabrication method for the external mirror of the first embodiment of the invention.

The step of fabricating the external mirror 203 will now be described with reference to FIG. 17 and FIG. 18. FIG. 17 is a perspective view showing a step of the fabrication method for the external mirror 203. In the step of fabricating the external mirror, first, an initial block 231P shown in FIG. 17 is fabricated. The initial block 231P is in the shape of a rectangular solid, and is to be polished into the block 231 afterward. The initial block 231P has end faces 231Pa and 231Pb, and four surfaces that connect the two end faces 231Pa and 231Pb to each other. The four surfaces include a first initial reference surface 231Pc, a second initial reference surface 231Pd, and surfaces 203f and 203g. The first initial reference surface 231Pc includes a portion to be the first reference surface 203c afterward. The second initial reference surface 231Pd includes a portion to be the second reference surface 203d afterward, and is orthogonal to the first initial reference surface 231Pc. The surface 203f lies opposite to the first initial reference surface 231Pc and is parallel to the first initial reference surface 231Pc. The surface 203g lies opposite to the second initial reference surface 231Pd and is parallel to the second initial reference surface 231Pd. The surfaces 203f and 203g are orthogonal to each other. The surfaces 231Pc and 203g are orthogonal to each other. The surfaces 231Pd and 203f are orthogonal to each other. The initial block 231P further has a corner 231Pe formed between the first initial reference surface 231Pc and the second initial reference surface 231Pd.

Next, one or a plurality of initial blocks 231P are fixed to a jig 300 shown in FIG. 17. The jig 300 has a top surface 300a, a bottom surface 300b, and an opening 300c that penetrates through the jig 300 from the top surface 300a to the bottom surface 300b and that is long in one direction. The opening 300c has first and second opening sidewalls 300c1 and 300c2 that decrease in distance from each other with the decreasing distance to the bottom surface 300b. Each of the first opening sidewall 300c1 and the second opening sidewall 300c2 forms an angle of 45° with respect to the bottom surface 300b. It should be noted that two portions of the jig 300 located on both sides of the opening 300c are coupled with each other by a not-shown coupling part so as not to be separated from each other.

FIG. 17 shows an example in which a plurality of initial blocks 231P are fixed to the jig 300. In this case, the plurality of initial blocks 231P are placed in the opening 300c in a row along the longitudinal direction of the opening 300c, and fixed to the jig 300. The first initial reference surface 231Pc is in contact with the first opening sidewall 300c1. The second initial reference surface 231Pd is in contact with the second opening sidewall 300c2. The corner 231Pe protrudes downward from the bottom surface 300b through the opening 300c. The one or plurality of initial blocks 231P are fixed to the jig 300 with an adhesive, for example.

Figure 18:
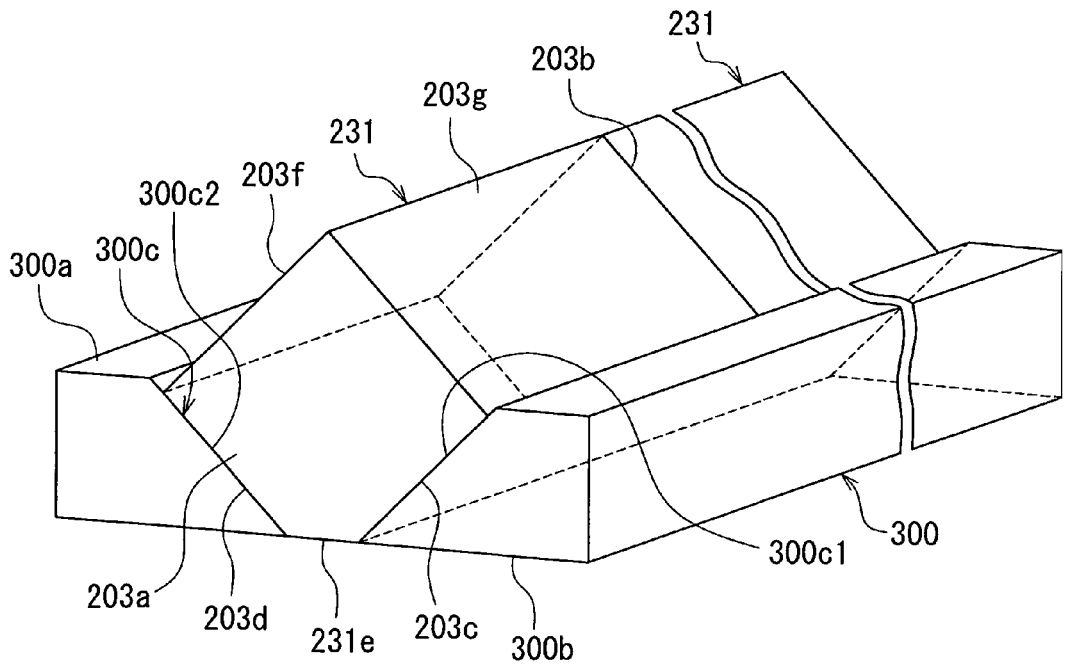
FIG. 18 is a perspective view showing a step that follows the step of FIG. 17.

FIG. 18 is a perspective view showing a step that follows the step of FIG. 17. In this step, the corner 231Pe protruding downward from the bottom surface 300b of the jig 300 through the opening 300c is subjected to polishing. This polishing causes the initial block 231P to have the oblique surface 231e. The polishing is performed until the oblique surface 231e becomes flush with the bottom surface 300b of the jig 300. The polishing makes the end faces 231Pa and 231Pb into the end faces 203a and 203b, the first and second initial reference surfaces 231Pc and 231Pd into the first and second reference surfaces 203c and 203d, and the initial block 231P into the block 231. One or a plurality of blocks 231 are fabricated in this way.

Next, the metal film 232 for forming the reflecting surface 203e is deposited onto the oblique surface 231e of the block 231 by vapor deposition, sputtering, or the like. This completes the external mirror 203 shown in FIG. 3.

As has been described, in the heat-assisted magnetic recording head 200 according to the present embodiment, the edge-emitting laser diode 202 is fixed to the slider 201 such that the mounting surface 202a lying at an end in the direction perpendicular to the plane of the active layer 222 faces the slider 201. Specifically, the laser diode 202 is fixed to the slider 201 by bonding the p-electrode 214 to the conductor layer 206 such that the mounting surface 202a faces the rear surface 201b of the slider 201 and the emitting end face 202c faces toward the Z direction. The mounting surface 202a is parallel to the plane of the active layer 222, and has an area greater than that of the emitting end face 202c. In the present embodiment, it is therefore easy to align the laser diode 202 with respect to the slider 201 with high precision so that the optical axis of the laser light emitted from the emission part 222a is parallel to the rear surface 201b of the slider 201. The present embodiment thus makes it possible to align the laser diode 202 with respect to the slider 201 so that the optical axis of the laser light emitted from the emission part 222a will not tilt with respect a desired direction.

In the present embodiment, the laser light emitted from the emission part 222a of the laser diode 202 is reflected by the external mirror 203 toward the waveguide 26 in the slider 201. The external mirror 203 has the first reference surface 203c that is parallel to the emitting end face 202c and faces the emitting end face 202c, and the second reference surface 203d that is parallel to the mounting surface 202a and faces toward the same direction as the mounting surface 202a does. According to the present embodiment, at least either one of the first reference surface 203c and the second reference surface 203d can be used to align the external mirror 203 with respect to the slider 201 and the laser diode 202 so that the optical axis of the laser light reflected by the reflecting surface 203e will not tilt with respect to a desired direction. Specifically, in the present embodiment, the first reference surface 203c is in contact with the emitting end face 202c of the laser diode 202, and the external mirror 203 is thereby aligned with respect to the slider 201 and the laser diode 202 so that the optical axis of the laser light reflected by the reflecting surface 203e will not tilt with respect to a desired direction.

In the present embodiment, the reflecting surface 203e of the external mirror 203 connects the first reference surface 203c and the second reference surface 203d to each other, the first reference surface 203c facing the emitting end face 202c, the second reference surface 203d facing toward the same direction as the mounting surface 202a does. The reflecting surface 203e is thus close to both the emitting end face 202c and the slider 201. According to the present embodiment, it is therefore possible to reduce both the distance from the emission part 222a of the laser diode 202 to the reflecting surface 203e and the distance from the reflecting surface 203e to the slider 201 (the incident end 26b of the waveguide 26).

In the present embodiment, the distance D1 between the mounting surface 202a and the emission part 222a of the laser diode 202 is smaller than the distance D2 between the rear surface 202b and the emission part 222a of the laser diode 202. Besides, D1 varies smaller than D2 does. According to the present embodiment, it is therefore possible to make the path of the laser light from the emission part 222a to the waveguide 26 shorter and to make variations in length of the path smaller, compared with the case where the laser diode 202 is arranged so that the n-electrode 213 of the laser diode 202 faces the rear surface 201b of the slider 201.

In consequence, the present embodiment makes it possible that, while using the edge-emitting laser diode 202 of high optical output as the light source for emitting light to be used for generating near-field light, alignment of the laser light with the waveguide 26 is easy and the path of the laser light from the emission part 222a of the laser diode 202 to the waveguide 26 is shortened.

In the present embodiment, the laser diode 202 is fixed to the slider 201 such that the mounting surface 202a faces the rear surface 201b of the slider 201. The rear surface 201b of the slider 201 is the surface that has the largest area among the five surfaces of the slider 201 excluding the medium facing surface 201a. According to the present embodiment, it is therefore possible to use a laser diode 202 of large size and high optical output.

In the heat-assisted magnetic recording head 200 according to the present embodiment, the opposed portion 26g of the outer surface of the waveguide 26 is opposed to a part of the coupling portion of the outer surface of the near-field light generating element 23 with the interposition layer 25 interposed therebetween. In the present embodiment, evanescent light occurs from the interposition layer 25 based on the light propagating through the waveguide 26. Based on this evanescent light, surface plasmons are excited on the near-field light generating element 23. The surface plasmons then propagate to the near-field light generating part 23g, and the near-field light generating part 23g generates near-field light based on the surface plasmons. According to the present embodiment, it is possible to increase the efficiency of conversion of the light propagating through the waveguide 26 into the near-field light, as compared with the case where a plasmon antenna is directly irradiated with laser light to produce near-field light.

According to the present embodiment, it is possible suppress a temperature rise of the near-field light generating element 23 because the near-field light generating element 23 is not directly irradiated with the laser light propagating through the waveguide 26. In the present embodiment, the length $H_{P4}$ of the near-field light generating element 23 in the direction perpendicular to the medium facing surface 201a is greater than the length $T_{P4}$ of the first end face 23a in the direction perpendicular to the top surface 1a of the substrate 1. Thus, the near-field light generating element 23 according to the present embodiment is greater in volume than a conventional plasmon antenna in which the length in the direction perpendicular to the medium facing surface 201a is smaller than the length in the direction perpendicular to the top surface 1a of the substrate 1. This also contributes to suppression of a temperature rise of the near-field light generating element 23. Consequently, according to the present embodiment, it is possible to prevent the near-field light generating element 23 from protruding from the medium facing surface 201a.

Modification Example

Figure 19:
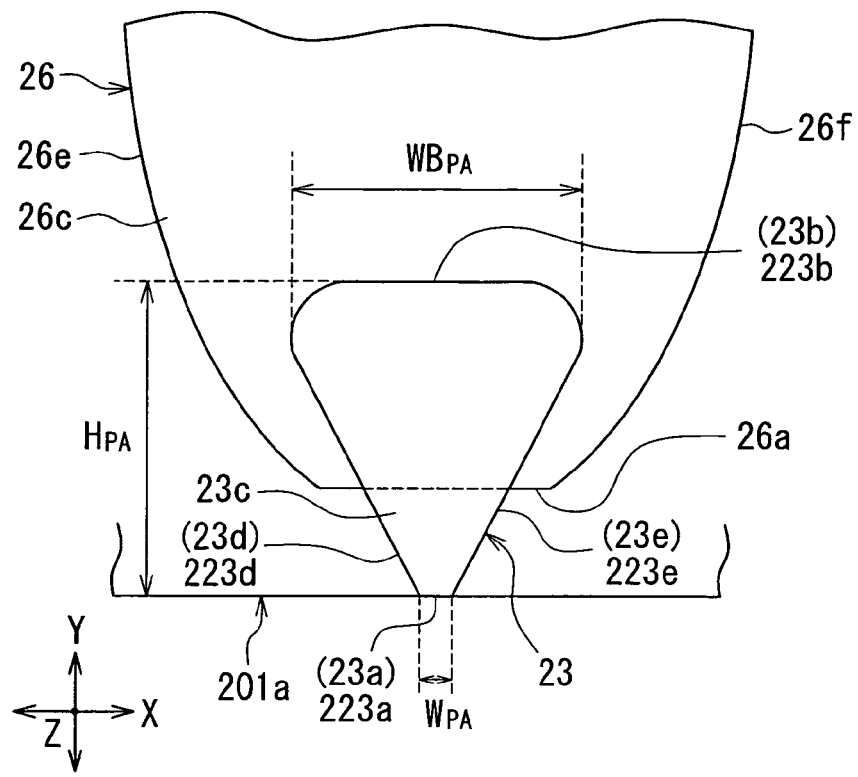
FIG. 19 is a plan view showing a part of a waveguide and a near-field light generating element of a modification example of the first embodiment of the invention.
Figure 20:
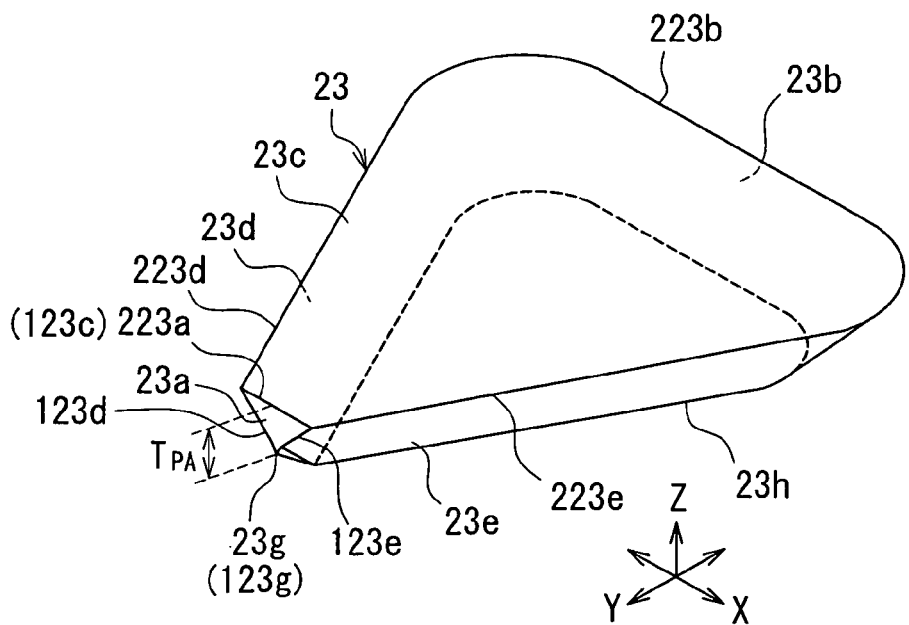
FIG. 20 is a perspective view of the near-field light generating element shown in FIG. 19.

A modification example of the present embodiment will now be described. FIG. 19 is a plan view showing a part of the waveguide 26 and the near-field light generating element 23 of the modification example. FIG. 20 is a perspective view of the near-field light generating element 23 shown in FIG. 19. In the near-field light generating element 23 of the modification example, the side surfaces 23d and 23e have their respective portions that decrease in distance from each other in the track width direction with decreasing distance to the medium facing surface 201a. The corner portion between the side surface 23d and the second end face 23b and the corner portion between the side surface 23e and the second end face 23b are both rounded. In this modification example, in particular, the side surfaces 23d and 23e excluding the above-mentioned two corner portions decrease in distance from each other in the track width direction with decreasing distance to the medium facing surface 201a.

The top surface 23c has a first edge 223a that is located at the top end of the first end face 23a, a second edge 223b that is located at the top end of the second end face 23b, a third edge 223d that is located at the top end of the side surface 23d, and a fourth edge 223e that is located at the top end of the side surface 23e. The third edge 223d and the fourth edge 223e have their respective portions that decrease in distance from each other in a direction parallel to the first edge 223a with decreasing distance to the first edge 223a. The corner portion between the second edge 223b and the third edge 223d and the corner portion between the second edge 223b and the fourth edge 223e are both rounded. In this modification example, in particular, the third edge 223d and the fourth edge 223e excluding the above-mentioned two corner portions decrease in distance from each other in the direction parallel to the first edge 223a with decreasing distance to the first edge 223a.

The near-field light generating element 23 of the modification example has a bottom surface 23h that is closer to the top surface 1a of the substrate 1. A part of the top surface 26c of the waveguide 26 is opposed to a part of the bottom surface 23h of the near-field light generating element 23 with the interposition layer 25 interposed therebetween. FIG. 19 shows an example in which the front end face 26a of the waveguide 26 is located away from the medium facing surface 201a. However, the front end face 26a may be located in the medium facing surface 201a.

As shown in FIG. 20, the near-field light generating element 23 of the modification example is configured so that an area near the first end face 23a (hereinafter, referred to as front end vicinity area) has a bottom end that gets farther from the top surface 1a of the substrate 1 with decreasing distance to the first end face 23a. Only in the front end vicinity area of the near-field light generating element 23, each of the side surfaces 23d and 23e includes an upper part and a lower part that are continuous with each other, and the angle formed between the lower part of the side surface 23d and the lower part of the side surface 23e is smaller than that formed between the upper part of the side surface 23d and the upper part of the side surface 23e. In the area other than the front end vicinity area of the near-field light generating element 23, the side surfaces 23d and 23e are each planar or almost planar in shape.

The first end face 23a includes: a first side 123d that is located at an end of the first side surface 23d; a second side 123e that is located at an end of the second side surface 23e; a third side 123c that is located at an end of the top surface 23c; and a pointed tip 123g that is formed by contact of the first side 123d and the second side 123e with each other and constitutes the near-field light generating part 23g. Specifically, the near-field light generating part 23g refers to the pointed tip 123g and its vicinity in the end face 23a.

The first side 123d includes an upper part and a lower part that are continuous with each other. The second side 123e includes an upper part and a lower part that are continuous with each other. The angle formed between the lower part of the first side 123d and the lower part of the second side 123e is smaller than the angle formed between the upper part of the first side 123d and the upper part of the second side 123e.

As shown in FIG. 19, the length of the near-field light generating element 23 in the direction perpendicular to the medium facing surface 201a will be denoted by the symbol $H_{P4}$; the width of the first end face 23a at its top edge will be denoted by the symbol $W_{P4}$; and the maximum width of the near-field light generating element 23 in the track width direction (the X direction) will be denoted by the symbol $WB_{P4}$. As shown in FIG. 20, the length of the first end face 23a in the direction perpendicular to the top surface 1a of the substrate 1 will be denoted by the symbol $T_{P4}$. The length $H_{P4}$ of the near-field light generating element 23 in the direction perpendicular to the medium facing surface 201a is greater than the length $T_{P4}$ of the first end face 23a in the direction perpendicular to the top surface 1a of the substrate 1. $W_{P4}$ falls within the range of 50 to 350 nm, for example. $T_{P4}$ falls within the range of 60 to 350 nm, for example. $H_{P4}$ falls within the range of 0.25 to 2.5 μm, for example. $WB_{P4}$ falls within the range of 0.25 to 2.5 μm for example.

The modification example allows an increase in area of the opposed portion of the waveguide 26 opposed to a part of the coupling portion (a part of the bottom surface 23h) of the outer surface of the near-field light generating element 23. Consequently, it is possible to excite more surface plasmons on the coupling portion (the bottom surface 23h) of the near-field light generating element 23. According to the modification example, in the near-field light generating element 23, the corner portion between the side surface 23d and the second end face 23b and the corner portion between the side surface 23e and the second end face 23b are both rounded. This can prevent near-field light from occurring from these corner portions. In the modification example, the side surfaces 23d and 23e of the near-field light generating element 23, excluding the foregoing two corner portions, decrease in distance from each other in the track width direction with decreasing distance to the medium facing surface 201a. This configuration can concentrate surface plasmons excited on the bottom surface 23h while the surface plasmons propagate to the near-field light generating part 23g. According to the modification example, it is therefore possible to concentrate more surface plasmons at the near-field light generating part 23g of pointed shape.

Second Embodiment

Figure 21:
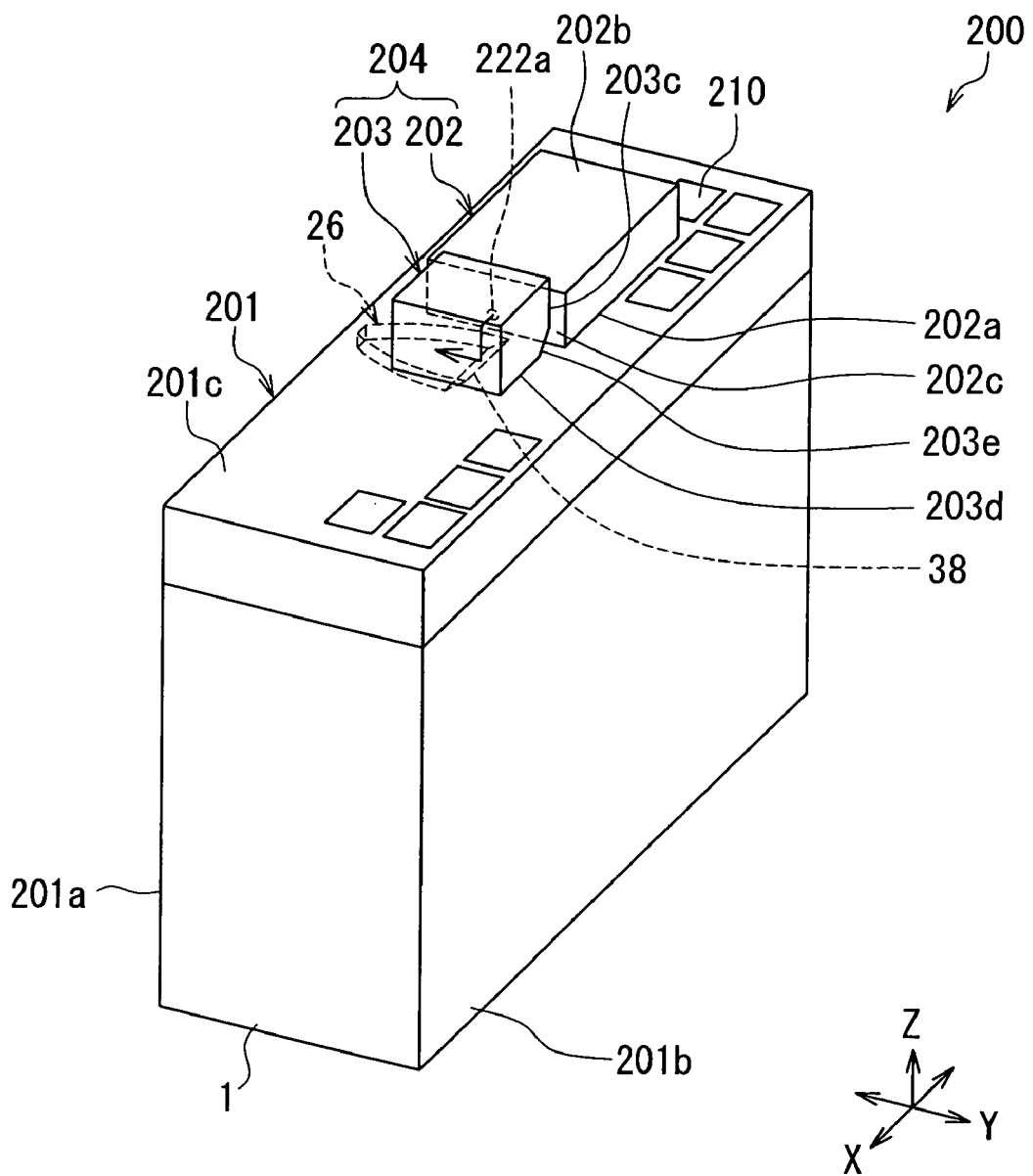
FIG. 21 is a perspective view of a heat-assisted magnetic recording head according to a second embodiment of the invention.
Figure 22:
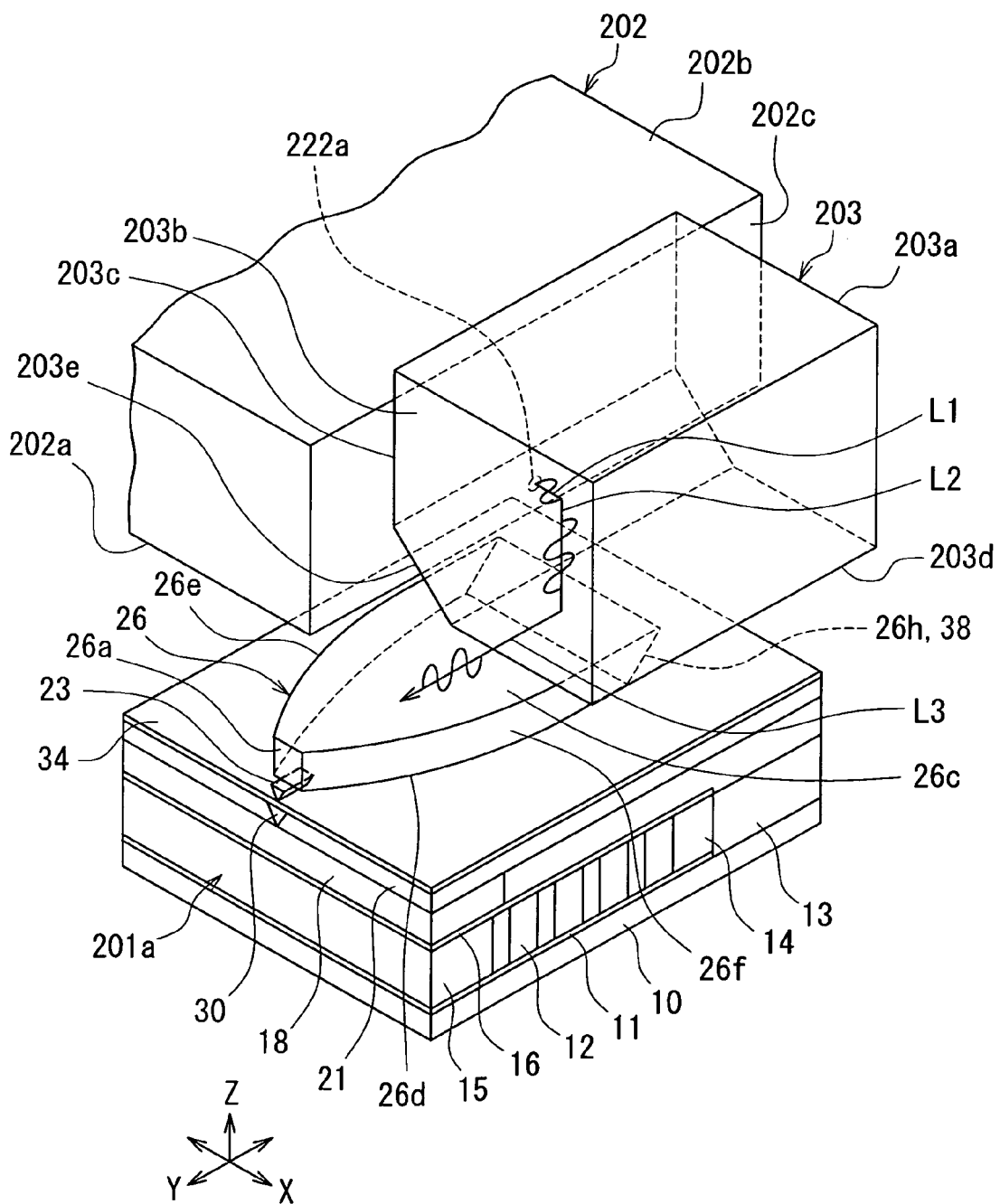
FIG. 22 is a perspective view showing the main part of the heat-assisted magnetic recording head shown in FIG. 21.
Figure 23:
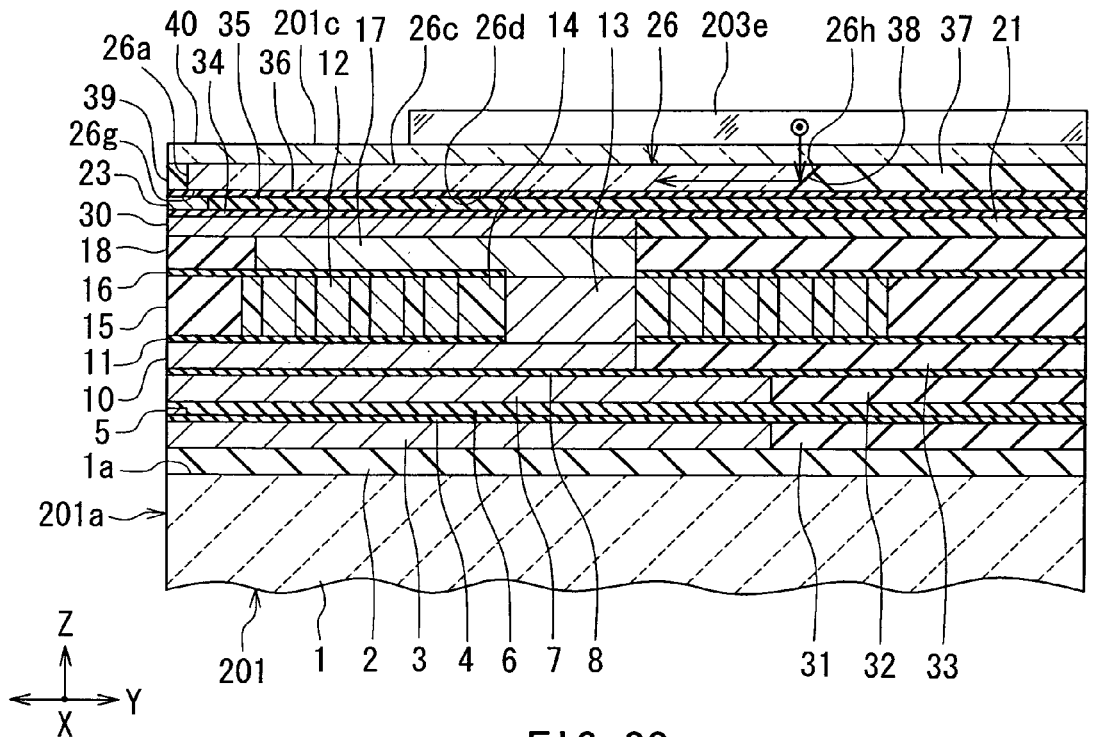
FIG. 23 is a cross-sectional view showing the configuration of a slider of the second embodiment of the invention.
Figure 24:
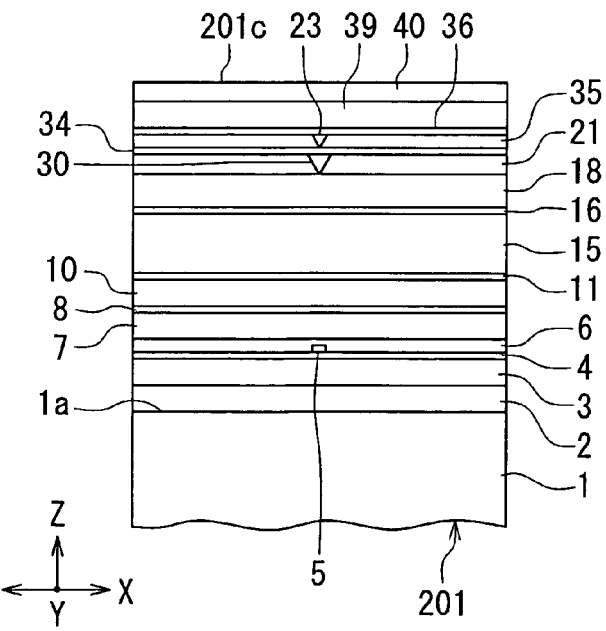
FIG. 24 is a front view showing the medium facing surface of the slider of the second embodiment of the invention.
Figure 25:
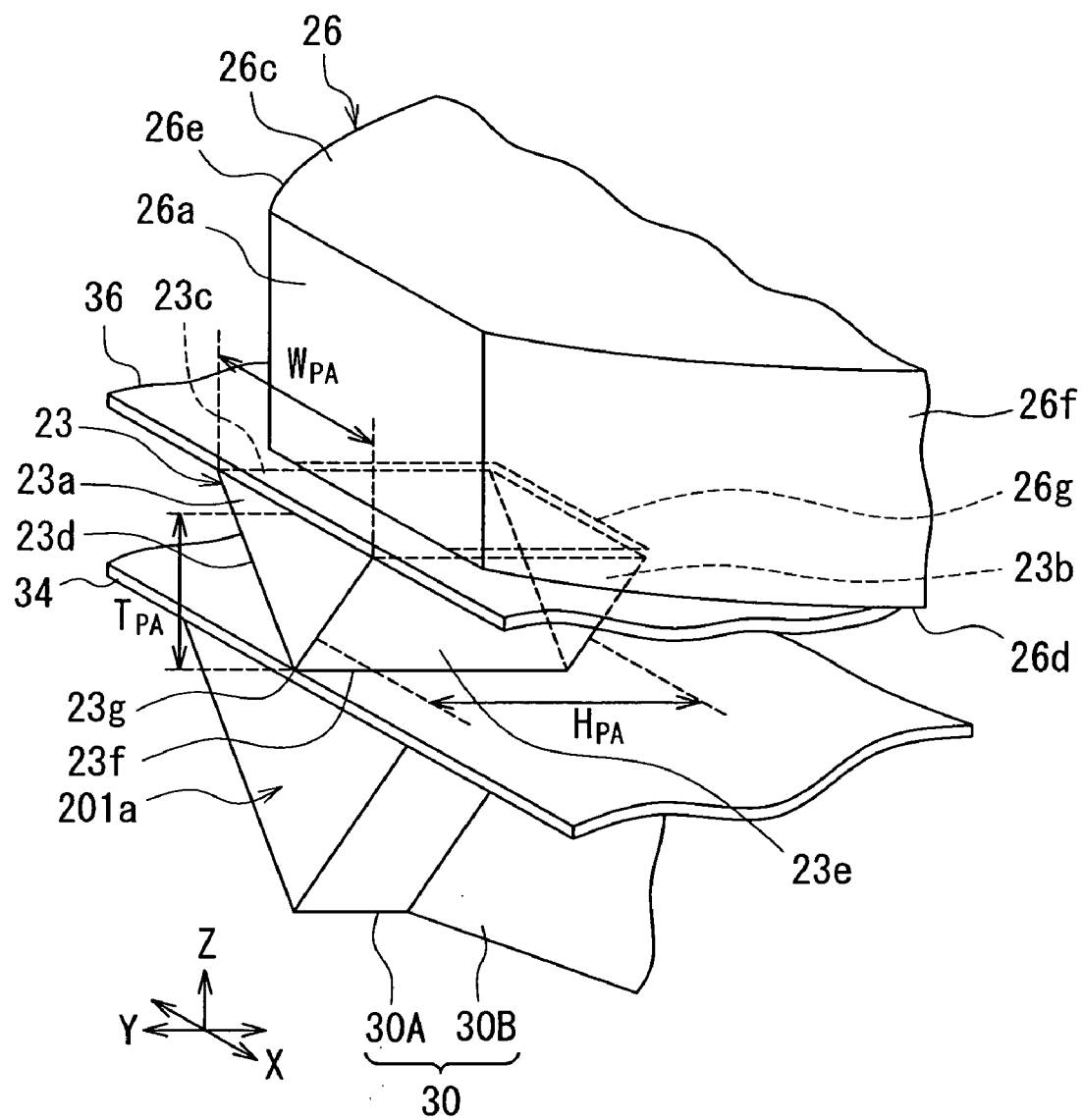
FIG. 25 is a perspective view showing a near-field light generating element and its vicinity in the heat-assisted magnetic recording head according to the second embodiment of the invention.

A heat-assisted magnetic recording head according to a second embodiment of the invention will now be described with reference to FIG. 21 to FIG. 25. FIG. 21 is a perspective view of the heat-assisted magnetic recording head according to the present embodiment. FIG. 22 is a perspective view of the main part of the heat-assisted magnetic recording head shown in FIG. 21. FIG. 23 is a cross-sectional view showing the configuration of the slider of the present embodiment. FIG. 24 is a front view showing the medium facing surface of the slider of the present embodiment. FIG. 25 is a perspective view showing the near-field light generating element and its vicinity in the heat-assisted magnetic recording head according to the present embodiment.

In the present embodiment, the laser diode 202 is fixed to the slider 201 by bonding the p-electrode 214 (see FIG. 3) to the top surface 201c of the slider 201 such that the mounting surface 202a faces the top surface 201c and the emitting end face 202c faces toward the X direction, as shown in FIG. 21. The laser diode 202 of the present embodiment emits linearly polarized laser light whose electric field oscillates in a direction parallel to the plane of the active layer 222, i.e., laser light of TE mode, from the emission part 222a. The p-electrode 214 of the laser diode 202 is electrically connected to one of the terminals 210 of the slider 201. The n-electrode 213 (see FIG. 3) of the laser diode 202 is electrically connected to another one of the terminals 210 of the slider 201.

The first reference surface 203c of the external mirror 203 is in contact with the emitting end face 202c of the laser diode 202. The second reference surface 203d is in contact with the top surface 201c of the slider 201. The external mirror 203 is fixed to the laser diode 202 by bonding the first reference surface 203c to the emitting end face 202c. The external mirror 203 is also fixed to the slider 201 by bonding the second reference surface 203d to the top surface 201c. The reflecting surface 203e of the external mirror 203 is located in front of the emission part 222a. In the present embodiment, also, the distance D1 between the mounting surface 202a and the emission part 222a of the laser diode 202 is smaller than the distance D2 between the rear surface 202b and the emission part 222a of the laser diode 202, as in the first embodiment.

The configuration of the slider 201 of the present embodiment will now be described in detail with reference to FIG. 23 to FIG. 25. The slider 201 of the present embodiment has the same configuration as that of the slider 201 of the first embodiment, as far as the parts from the substrate 1 to the bottom yoke layer 17 and the nonmagnetic layer 18 are concerned. Hereinafter, a description will be given of differences of the slider 201 of the present embodiment from the slider 201 of the first embodiment.

The slider 201 of the present embodiment includes: a magnetic pole 30 disposed over the bottom yoke layer 17 and the nonmagnetic layer 18; and a nonmagnetic layer 21 made of a nonmagnetic material and disposed around the magnetic pole 30 on the nonmagnetic layer 18. The magnetic pole 30 has an end face located in the medium facing surface 201a. The magnetic pole 30 allows a magnetic flux corresponding to the magnetic field produced by the coil 12 to pass, and produces a recording magnetic field for recording data on the recording medium by means of the perpendicular magnetic recording system. The magnetic pole 30 is made of a magnetic metal material. The material of the magnetic pole 30 may be NiFe, CoNiFe or CoFe, for example. The nonmagnetic layer 21 is made of alumina, for example. The magnetic pole 30 and the nonmagnetic layer 21 are flattened at the top.

As shown in FIG. 25, the magnetic pole 30 includes a track width defining portion 30A and a wide portion 30B. The track width defining portion 30A has an end face located in the medium facing surface 201a and an end opposite thereto. The wide portion 30B is connected to the end of the track width defining portion 30A and has a width greater than that of the track width defining portion 30A. The width of the track width defining portion 30A does not change with the distance from the medium facing surface 201a. For example, the wide portion 30B is equal in width to the track width defining portion 30A at the boundary with the track width defining portion 30A, and gradually increases in width with increasing distance from the medium facing surface 201a and then maintains a specific width to the end of the wide portion 30B. In the example shown in FIG. 24 and FIG. 25, the end face of the track width defining portion 30A located in the medium facing surface 201a is shaped like an isosceles triangle with its vertex downward. However, the end face of the track width defining portion 30A located in the medium facing surface 201a may have a rectangular or trapezoidal shape.

The slider 201 further includes an insulating layer 34 disposed over the top surfaces of the magnetic pole 30 and the nonmagnetic layer 21. The insulating layer 34 is made of alumina, for example. The insulating layer 34 has a thickness within the range of 30 to 70 nm, for example.

The slider 201 further includes: a near-field light generating element 23 disposed on the insulating layer 34; and an insulating layer 35 made of an insulating material and disposed around the near-field light generating element 23 on the insulating layer 34. The near-field light generating element 23 and the insulating layer 35 are flattened at the top. The insulating layer 35 is made of alumina, for example. The material and shape of the near-field light generating element 23 are the same as those in the first embodiment.

The slider 201 further includes: an interposition layer 36 disposed over the top surfaces of the near-field light generating element 23 and the insulating layer 35; and a waveguide 26 and clad layers 37 and 39 disposed on the interposition layer 36. The waveguide 26 is made of a dielectric material that transmits the laser light. The interposition layer 36 is made of a dielectric material that has a refractive index lower than that of the waveguide 26 and transmits the laser light. The clad layers 37 and 39 are made of a dielectric material that has a refractive index lower than that of the waveguide 26. For example, the waveguide 26 may be made of $Ta_2O_5$ which has a refractive index of approximately 2.1, and the interposition layer 36 and the clad layers 37 and 39 may be made of alumina which has a refractive index of approximately 1.8. The interposition layer 36 has a thickness within the range of 30 to 70 nm, for example.

As shown in FIG. 21 and FIG. 22, the waveguide 26 extends in the direction perpendicular to the medium facing surface 201a (the Y direction). The waveguide 26 has an outer surface. The outer surface includes: a front end face 26a that is closer to the medium facing surface 201a; a rear end face 26h that is farther from the medium facing surface 201a; a top surface 26c that is farther from the top surface 1a of the substrate 1; a bottom surface 26d that is closer to the top surface 1a of the substrate 1; and two side surfaces 26e and 26f that are opposite to each other in the track width direction. FIG. 22 shows an example in which the front end face 26a is located away from the medium facing surface 201a. The front end face 26a may be located in the medium facing surface 201a, however. The clad layer 37 is located farther from the medium facing surface 201a than is the rear end face 26h. The clad layer 39 is disposed around the waveguide 26 and the clad layer 37. The waveguide 26 and the clad layers 37 and 39 are flattened at the top.

The outer surface of the waveguide 26 includes an opposed portion 26g that is opposed to a part of the coupling portion of the outer surface of the near-field light generating element 23. In the present embodiment, as shown in FIG. 25, the waveguide 26 is disposed farther from the top surface 1a of the substrate 1 than is the near-field light generating element 23, and a part of the bottom surface 26d of the waveguide 26 is opposed to a part of the top surface 23c of the near-field light generating element 23 with the interposition layer 36 interposed therebetween. This part of the bottom surface 26d of the waveguide 26 opposed to the part of the top surface 23c is the opposed portion 26g. The length $H_{PA}$ of the near-field light generating element 23 in the direction perpendicular to the medium facing surface 201a is greater than the length $T_{PA}$ of the first end face 23a in the direction perpendicular to the top surface 1a of the substrate 1. This configuration is necessary in order that the opposed portion 26g, which is a part of the bottom surface 26d of the waveguide 26, is opposed to a part of the top surface 23c of the near-field light generating element 23 with the interposition layer 36 interposed therebetween.

As shown in FIG. 23, the rear end face 26h is an oblique surface at an angle of 45° with respect to the direction perpendicular to the top surface 1a of the substrate 1. The distance between the medium facing surface 201a and an arbitrary point on the rear end face 26h increases with increasing distance between the arbitrary point and the top surface 1a of the substrate 1.

The slider 201 further includes an internal mirror 38 that is disposed between the waveguide 26 and the clad layer 37 so as to be in contact with the rear end face 26h of the waveguide 26. The internal mirror 38 is made of a film of a metal such as Cu or Au having a thickness of 50 to 200 nm or so. The internal mirror 38 is configured to reflect laser light emitted from the laser diode 202 disposed above the waveguide 26, so as to let the laser light travel through the waveguide 26 toward the medium facing surface 201a. More specifically, the internal mirror 38 is configured to reflect the laser light that enters the waveguide 26 from the top surface 26c of the waveguide 26 and reaches the rear end face 26h, so as to let the laser light travel toward the front end face 26a.

The slider 201 further includes a clad layer 40 disposed over the top surfaces of the waveguide 26 and the clad layers 37 and 39. The clad layer 40 is made of a dielectric material that has a refractive index lower than that of the waveguide 26 and transmits the laser light. For example, if the waveguide 26 is made of $Ta_2O_5$ which has a refractive index of approximately 2.1, the clad layer 40 may be made of alumina which has a refractive index of approximately 1.8. The clad layer 40 has a thickness in the range of 0.1 to 0.5 μm for example. The top surface of the clad layer 40 constitutes the top surface 201c of the slider 201.

The laser diode 202 and the external mirror 203 constitute a laser assembly 204 according to the present embodiment. The laser assembly 204, in combination with the slider 201, constitutes the heat-assisted magnetic recording head 200.

The laser assembly 204 and the parts of the slider 201 from the return magnetic pole layer 10 to the clad layer 40 constitute the recording head.

Reference is now made to FIG. 22 to describe the path of the laser light emitted from the emission part 222a of the laser diode 202. The laser light emitted from the emission part 222a of the laser diode 202 is reflected by the reflecting surface 203e of the external mirror 203, passes through the clad layer 40, and enters the waveguide 26 from the top surface 26c to reach the rear end face 26h. The laser light is then reflected by the internal mirror 38 so as to travel through the waveguide 26 toward the medium facing surface 201a (the front end face 26a).

Here, the laser light emitted from the emission part 222a will be designated by the reference symbol L1; the laser light reflected by the external mirror 203 will be designated by the reference symbol L2; and the laser light reflected by the internal mirror 38 will be designated by the reference symbol L3. In the present embodiment, the laser diode 202, the external mirror 203, the internal mirror 38 and the waveguide 26 are arranged so that the direction of travel of the laser light L1 emitted from the emission part 222a and the direction of travel of the laser light L3 reflected by the internal mirror 38 are orthogonal to each other as viewed from above the top surface 201c of the slider 201.

FIG. 22 shows an example of the configuration of the waveguide 26. In this example, the two side surfaces 26e and 26f of the waveguide 26 are formed as a reflecting surface of parabolic shape in the vicinity of the front end face 26a as viewed from above. This reflecting surface has the function of collecting the light propagating through the waveguide 26 to the vicinity of the front end face 26a.

With reference to FIG. 22, a description will be given of the direction of polarization of the laser light of the present embodiment. In the present embodiment, the laser diode 202 emits laser light of TE mode from the emission part 222a. The direction of oscillation of the electric field of the laser light emitted from the emission part 222a is parallel to the XY plane. The laser light emitted from the emission part 222a is reflected by the reflecting surface 203e of the external mirror 203 and travels toward the waveguide 26. Here, the direction of oscillation of the electric field of the laser light is parallel to the YZ plane. The laser light passes through the clad layer 40, enters the waveguide 26 from the top surface 26c, and is reflected by the internal mirror 38. The direction of oscillation of the electric field of the laser light reflected by the internal mirror 38 is parallel to the YZ plane. The laser light reflected by the internal mirror 38 propagates through the waveguide 26 to reach the opposed portion 26g. The direction of oscillation of the electric field of this laser light is perpendicular to the opposed portion 26g. This makes it possible to produce surface plasmons of high intensity on the near-field light generating element 23.

Reference is now made to FIG. 26A to FIG. 32A and FIG. 26B to FIG. 32B to describe a manufacturing method for the heat-assisted magnetic recording head 200 according to the present embodiment. FIG. 26A to FIG. 32A each show a cross section of a stack of layers formed in the process of manufacturing the heat-assisted magnetic recording head 200, the cross section being perpendicular to the medium facing surface and the substrate. In FIG. 26A to FIG. 32A, the symbol "ABS" indicates the position where the medium facing surface 201a is to be formed. FIG. 26B to FIG. 32B show cross sections at the position ABS of FIG. 26A to FIG. 32A, respectively.

The manufacturing method for the heat-assisted magnetic recording head 200 according to the present embodiment is the same as that of the first embodiment up to the step of flattening the bottom yoke layer 17 and the nonmagnetic layer 18 at the top as shown in FIG. 10A and FIG. 10B.

Figure 26A:
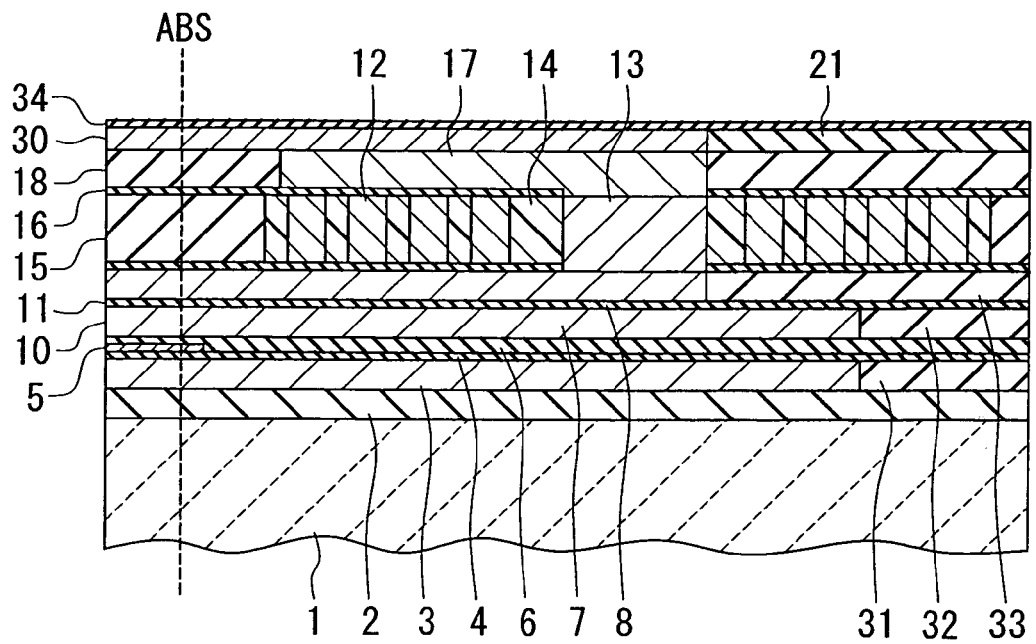
FIG. 26A and FIG. 26B are explanatory diagrams showing a step of a method of manufacturing the heat-assisted magnetic recording head according to the second embodiment of the invention.
Figure 26B:
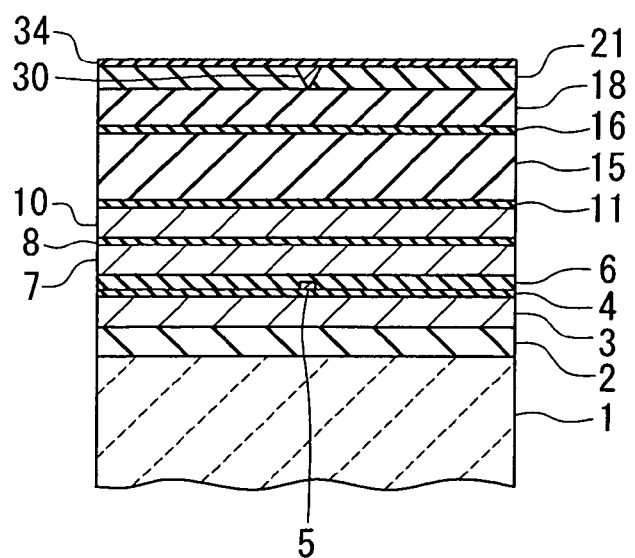

FIG. 26A and FIG. 26B show the next step. In this step, first, the nonmagnetic layer 21 is formed over the bottom yoke layer 17 and the nonmagnetic layer 18. Next, the nonmagnetic layer 21 is selectively etched to form therein a groove for accommodating the magnetic pole 30. The magnetic pole 30 is then formed by, for example, frame plating, so as to be accommodated in the groove of the nonmagnetic layer 21. Next, the magnetic pole 30 and the nonmagnetic layer 21 are polished by CMP, for example. The magnetic pole 30 and the nonmagnetic layer 21 are thereby flattened at the top. Next, the insulating layer 34 is formed over the magnetic pole 30 and the nonmagnetic layer 21.

Figure 27A:
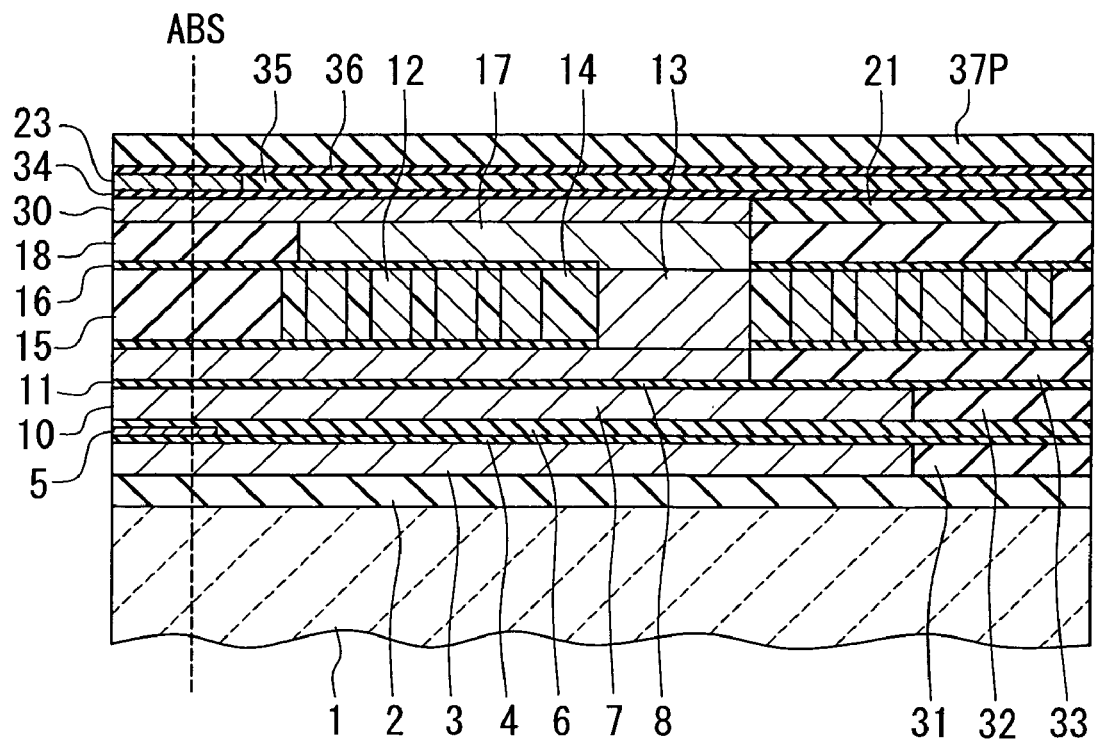
FIG. 27A and FIG. 27B are explanatory diagrams showing a step that follows the step of FIG. 26A and FIG. 26B.
Figure 27B:
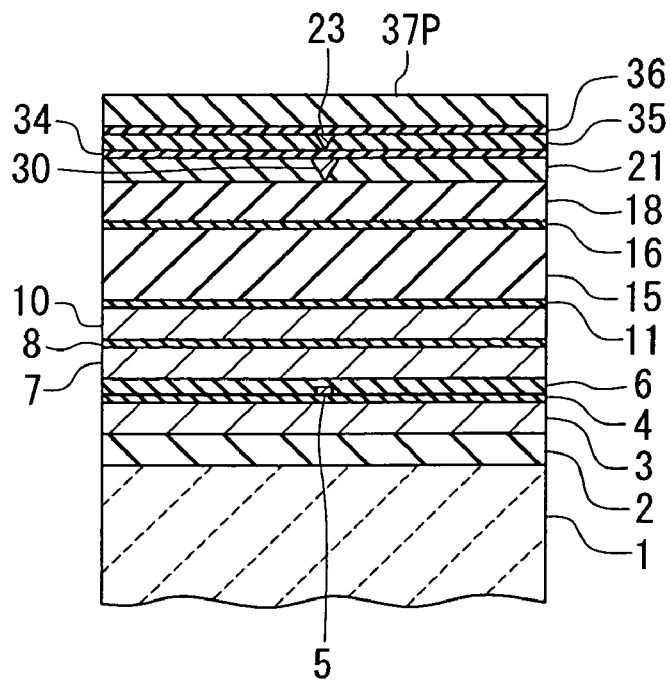

FIG. 27A and FIG. 27B show the next step. In this step, first, the insulating layer 35 is formed on the insulating layer 34. The insulating layer 35 is then selectively etched to form therein a groove for accommodating the near-field light generating element 23. The near-field light generating element 23 is then formed to be accommodated in the groove of the insulating layer 35. Next, the interposition layer 36 is formed over the near-field light generating element 23 and the insulating layer 35. Next, a dielectric layer 37P is formed on the interposition layer 36. The dielectric layer 37P is to be made into the clad layer 37 afterward.

Figure 28A:
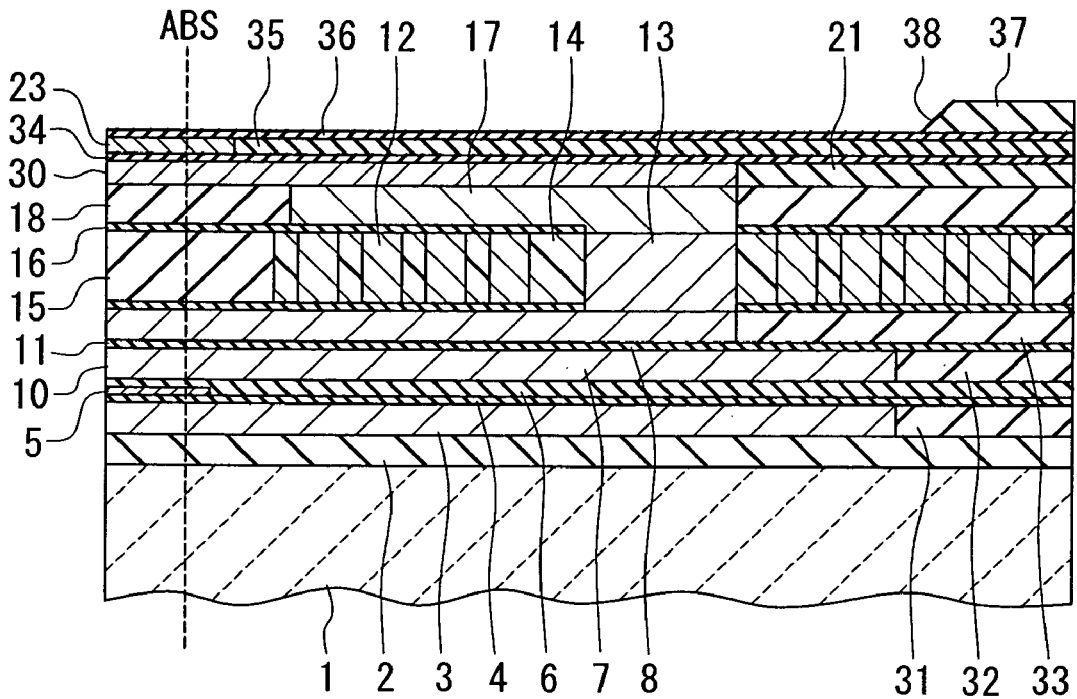
FIG. 28A and FIG. 28B are explanatory diagrams showing a step that follows the step of FIG. 27A and FIG. 27B.
Figure 28B:
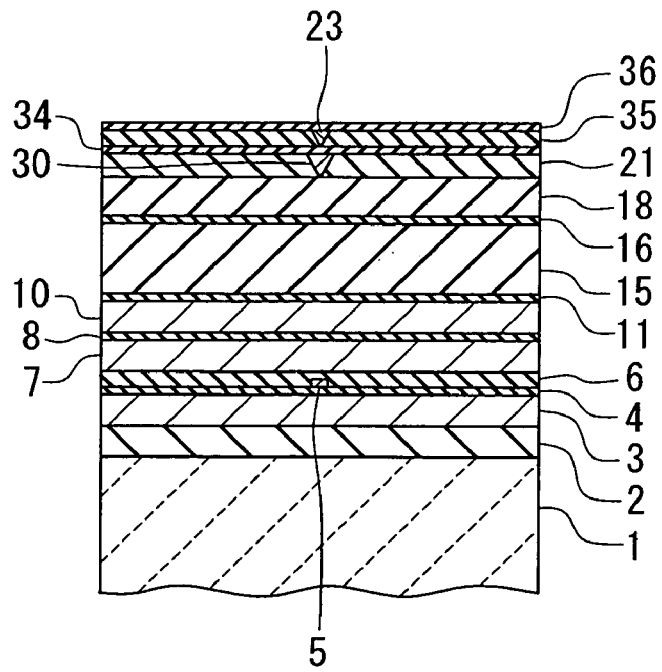

FIG. 28A and FIG. 28B show the next step. In this step, first, a not-shown metal mask having a plane shape corresponding to that of the clad layer 37 is formed on the dielectric layer 37P. Next, the clad layer 37 is formed by selectively etching the dielectric layer 37P by reactive ion etching (hereinafter referred to as RIE), for example. Here, the dielectric layer 37P is taper-etched so as to provide the clad layer 37 with an oblique surface for the internal mirror 38 to be formed thereon. Then, the internal mirror 38 is formed on the oblique surface of the clad layer 37.

Figure 29A:
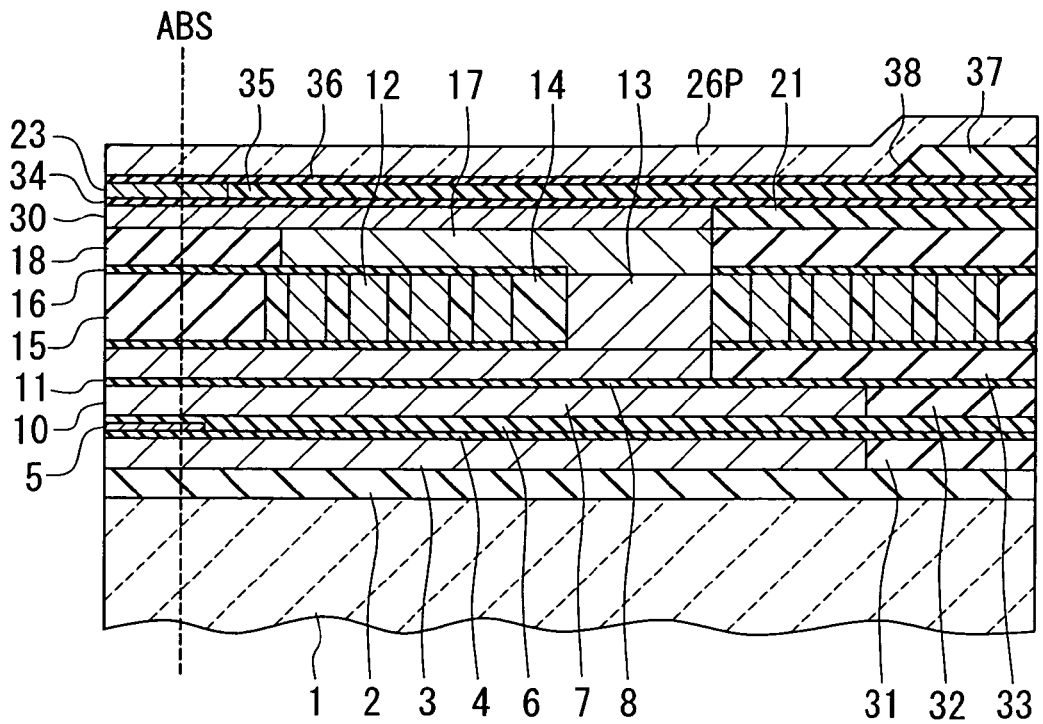
FIG. 29A and FIG. 29B are explanatory diagrams showing a step that follows the step of FIG. 28A and FIG. 28B.
Figure 29B:
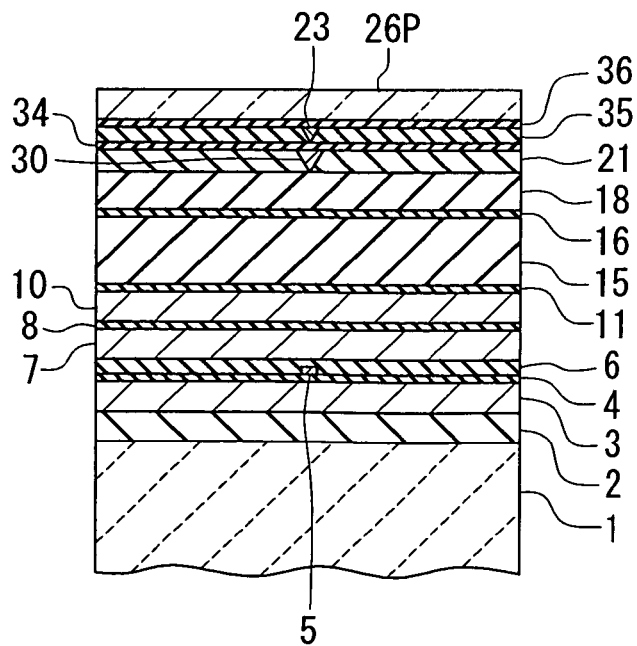

Next, as shown in FIG. 29A and FIG. 29B, a dielectric layer 26P is formed over the entire top surface of the stack. The dielectric layer 26P is to be made into the waveguide 26 afterward.

Figure 30A:
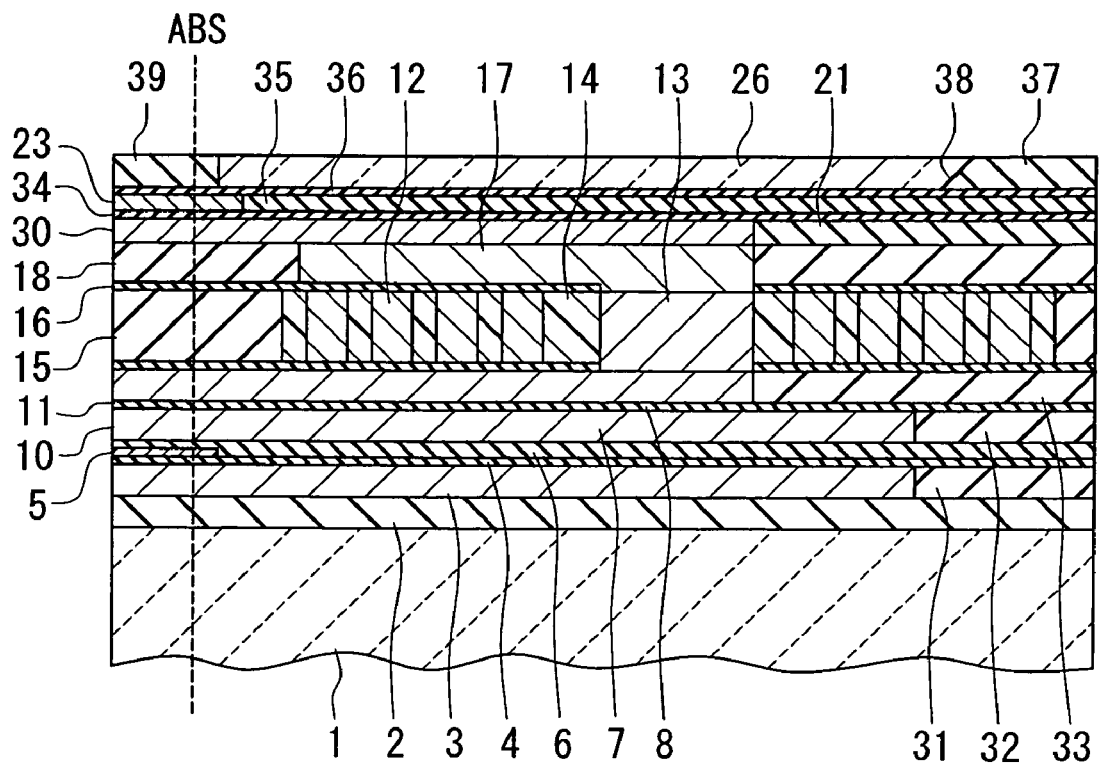
FIG. 30A and FIG. 30B are explanatory diagrams showing a step that follows the step of FIG. 29A and FIG. 29B.
Figure 30B:
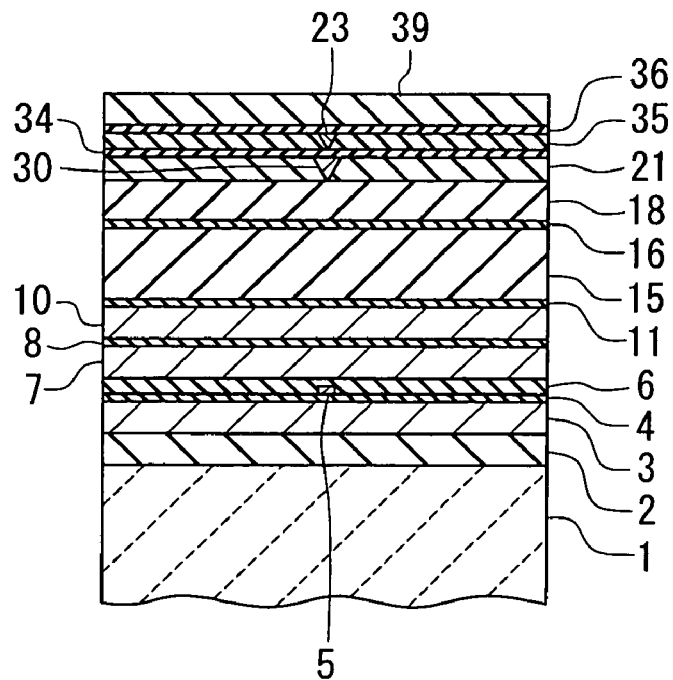

FIG. 30A and FIG. 30B show the next step. In this step, first, the waveguide 26 is formed by selectively etching the dielectric layer 26P by RIE, for example. Next, a dielectric layer to be made into the clad layer 39 afterward is formed over the entire top surface of the stack. The dielectric layer is then polished by, for example, CMP, until the waveguide 26 is exposed. The dielectric layer remaining after the polishing makes the clad layer 39. This polishing also flattens the waveguide 26 and the clad layers 37 and 39 at the top.

Figure 31A:
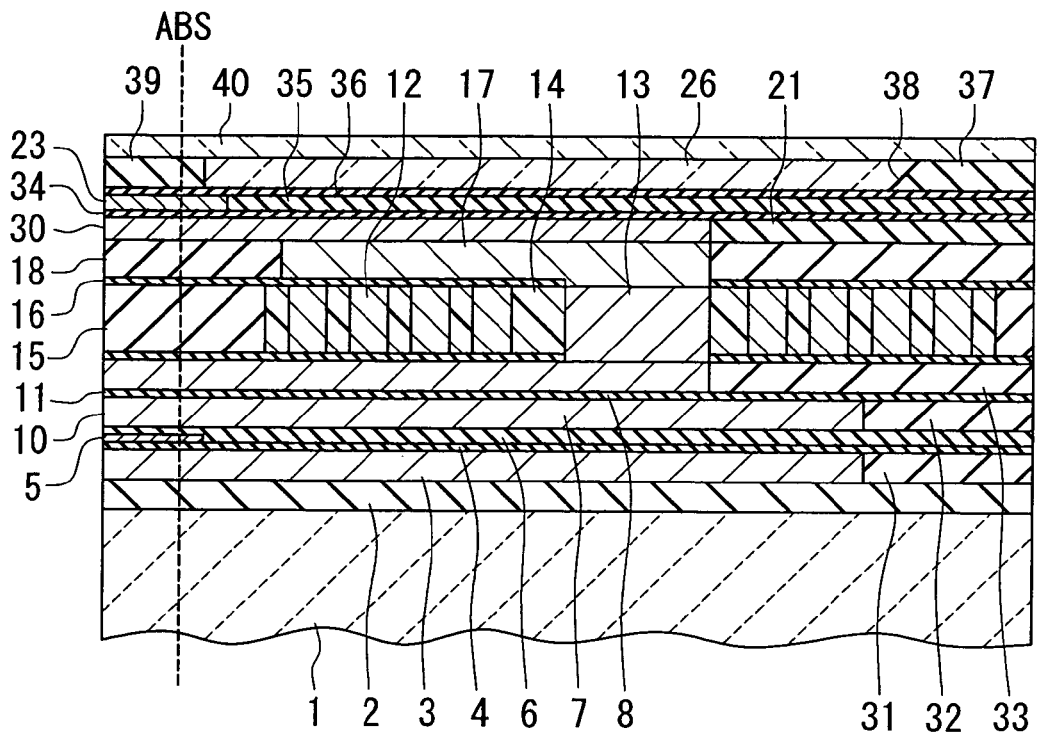
FIG. 31A and FIG. 31B are explanatory diagrams showing a step that follows the step of FIG. 30A and FIG. 30B.
Figure 31B:
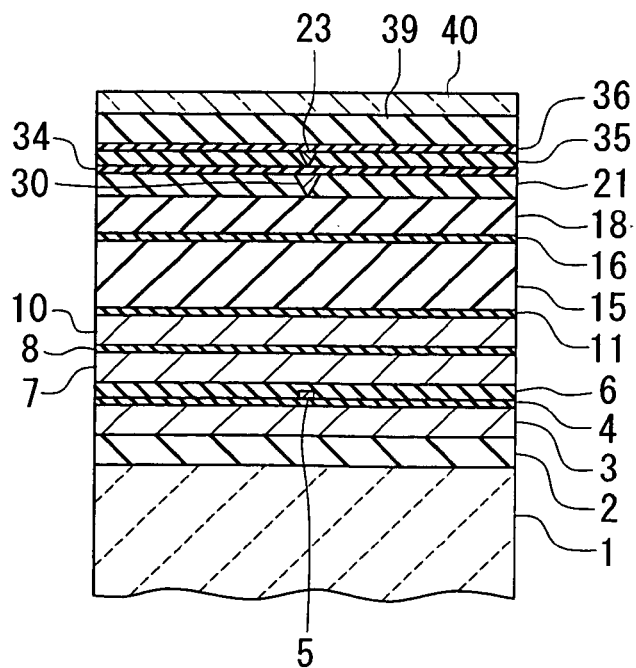

Next, as shown in FIG. 31A and FIG. 31B, the clad layer 40 is formed over the entire top surface of the stack. Wiring, the terminals 210 and so on are then formed on the top surface of the clad layer 40.

Figure 32A:
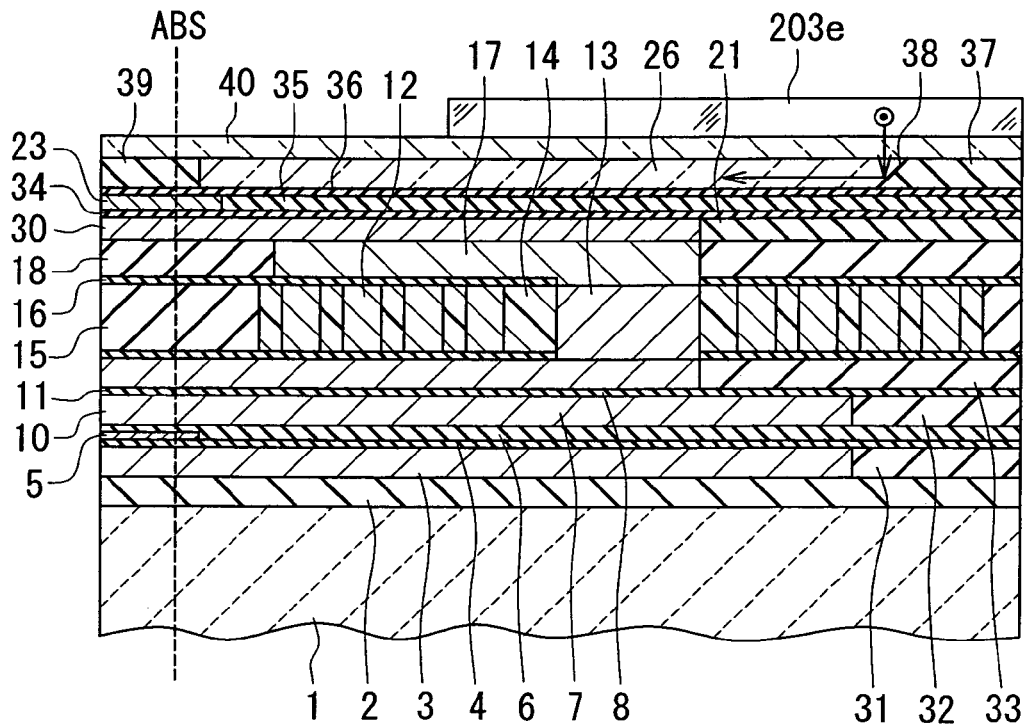
FIG. 32A and FIG. 32B are explanatory diagrams showing a step that follows the step of FIG. 31A and FIG. 31B.
Figure 32B:
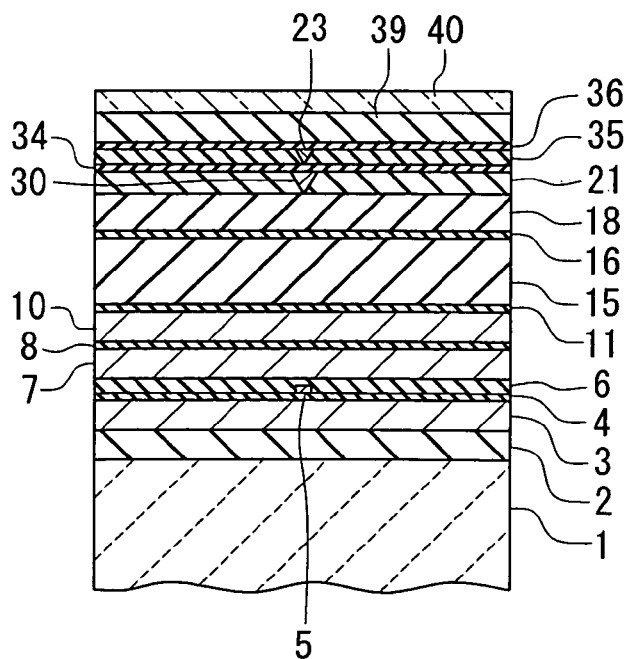

FIG. 32A and FIG. 32B show the next step. In this step, the laser diode 202 and the external mirror 203 are fixed to the top surface of the clad layer 40, i.e., the top surface 201c of the slider 201. In this step, the laser diode 202 and the external mirror 203 may be bonded to each other before fixation to the top surface 201c of the slider 201. Alternatively, the laser diode 202 may be first fixed to the top surface 201c of the slider 201 and then the external mirror 203 may be fixed to the emitting end face 202c of the laser diode 202 and the top surface 201c of the slider 201 so that the first reference surface 203c is in contact with the emitting end face 202c and the second reference surface 203d is in contact with the top surface 201c of the slider 201. Alternatively, the external mirror 203 may be first fixed to the top surface 201c of the slider 201 and then the laser diode 202 may be fixed to the first reference surface 203c of the external mirror 203 and the top surface 201c of the slider 201 so that the emitting end face 202c is in contact with the first reference surface 203c and the mounting surface 202a is in contact with the top surface 201c of the slider 201. Note that FIG. 32A shows the external mirror 203 with only the reflecting surface 203e.

Alignment of the laser diode 202 and the external mirror 203 with respect to the slider 201 is performed using a flip chip bonder, for example. Fixation of the laser diode 202 and the external mirror 203 to the slider 201 is performed using an adhesive, for example.

The slider 201 may include a conductor layer that is arranged to be exposed in the top surface 201c and electrically connects the p-electrode 214 of the laser diode 202 to one of the terminals 210. In this case, the p-electrode 214 of the laser diode 202 may be bonded to the conductor layer. For example, a conductive bonding material such as solder or a conductive adhesive, or ultrasonic bonding may be employed to bond the p-electrode 214 to the conductor layer. The n-electrode 213 of the laser diode 202 is electrically connected to another one of the terminals 210 with a not-shown bonding wire, for example.

Next, the substrate is cut into sliders, and polishing of the medium facing surface 201a, fabrication of flying rails, etc. are performed to thereby complete the heat-assisted magnetic recording head 200.

As has been described, in the present embodiment, the laser diode 202 is fixed to the slider 201 such that the mounting surface 202a faces the top surface 201c of the slider 201. The laser light emitted form the emission part 222a of the laser diode 202 is reflected by the external mirror 203 toward the waveguide 26. The mounting surface 202a of the laser diode 202 is parallel to the plane of the active layer 222 and has a greater area than that of the emitting end face 202c. In the present embodiment, it is therefore easy to align the laser diode 202 with respect to the slider 201 with high precision so that the optical axis of the laser light emitted from the emission part 222a is parallel to the top surface 201c of the slider 201. Thus, according to the present embodiment, it is possible to align the laser diode 202 with respect to the slider 201 so that the optical axis of the laser light emitted from the emission part 222a will not tilt with respect to a desired direction.

In the present embodiment, the laser light emitted from the emission part 222a of the laser diode 202 is reflected by the external mirror 203 toward the waveguide 26 in the slider 201. The external mirror 203 has the first reference surface 203c that is parallel to the emitting end face 202c and faces the emitting end face 202c, and the second reference surface 203d that is parallel to the mounting surface 202a and faces toward the same direction as the mounting surface 202a does. According to the present embodiment, at least either one of the first reference surface 203c and the second reference surface 203d can be used to align the external mirror 203 with respect to the slider 201 and the laser diode 202 so that the optical axis of the laser light reflected by the reflecting surface 203e will not tilt with respect to a desired direction. Specifically, in the present embodiment, the first reference surface 203c is in contact with the emitting end face 202c of the laser diode 202, and the second reference surface 203d is in contact with the top surface 201c of the slider 201. The external mirror 203 is thereby aligned with respect to the slider 201 and the laser diode 202 so that the optical axis of the laser light reflected by the reflecting surface 203e will not tilt with respect to a desired direction.

In the present embodiment, the reflecting surface 203e of the external mirror 203 connects the first reference surface 203c and the second reference surface 203d to each other, the first reference surface 203c facing the emitting end face 202c, the second reference surface 203d facing toward the same direction as the mounting surface 202a does. According to the present embodiment, it is therefore possible to reduce both the distance from the emission part 222a of the laser diode 202 to the reflecting surface 203e and the distance from the reflecting surface 203e to the slider 201.

In consequence, the present embodiment makes it possible that, while using the edge-emitting laser diode 202 of high optical output as the light source for emitting light to be used for generating near-field light, alignment of the laser light with the waveguide 26 is easy and the path of the laser light from the emission part 222a of the laser diode 202 to the waveguide 26 is shortened.

In the present embodiment, as shown in FIG. 22, the laser diode 202, the external mirror 203, the internal mirror 38 and the waveguide 26 are arranged so that the direction of travel of the laser light L1 emitted from the emission part 222a and the direction of travel of the laser light L3 reflected by the internal mirror 38 are orthogonal to each other as viewed from above the top surface 201c of the slider 201. According to the present embodiment, such arrangement allows the direction of polarization (the direction of oscillation of the electric field) of the laser light L3 reflected by the internal mirror 38 to be orthogonal to the direction of polarization of the laser light L1 emitted from the emission part 222a. Consequently, the present embodiment makes it possible that the direction of polarization of the laser light propagating through the waveguide 26 is set to such a direction that surface plasmons of high intensity can be generated on the near-field light generating element 23, i.e., the direction perpendicular to the opposed portion 26g, while using a typical laser diode that emits laser light of TE mode as the laser diode 202.

In the heat-assisted magnetic recording head 200 according to the present embodiment, the near-field light generating element 23 and the waveguide 26 are disposed farther from the top surface 1a of the substrate 1 than is the magnetic pole 30, and the light emitted from the laser diode 202 disposed above the waveguide 26 is reflected by the internal mirror 38 so as to travel through the waveguide 26 toward the medium facing surface 201a.

A case will now be considered where a near-field light generating element and a waveguide are disposed closer to the top surface 1a of the surface 1 than is the magnetic pole 30, i.e., in a positional relationship reverse to that of the near-field light generating element 23 and the waveguide 26 with the magnetic pole 30 according to the present embodiment. In this case, since the magnetic pole 30 lies above the near-field light generating element and the waveguide, the optical path from the laser diode to the waveguide becomes longer and the energy loss of the light increases if the laser diode is disposed above the waveguide as in the present embodiment. The longer optical path from the laser diode to the waveguide also makes it harder to precisely align the laser diode and the waveguide with respect to each other, thus often resulting in energy loss of the light due to misalignment between the laser diode and the waveguide.

In contrast, according to the present embodiment, it is possible to put the laser diode 202 and the waveguide 26 close to each other. This allows guiding the light from the laser diode 202 to the opposed portion 26g of the outer surface of the waveguide 26 through a shorter path. According to the present embodiment, it is therefore possible to reduce the energy loss of the light. Furthermore, the present embodiment facilitates precise alignment of the laser diode 202 and the waveguide 26 with respect to each other, since it is possible to put the laser diode 202 and the waveguide 26 close to each other. Consequently, according to the present embodiment, it is possible to reduce the energy loss of the light resulting from misalignment between the laser diode 202 and the waveguide 26.

In the present embodiment, the clad layer 40 having a refractive index lower than that of the waveguide 26 is provided on the top surface of the waveguide 26 on which the laser light is to be incident. Light that is incident on the interface between the waveguide 26 and the clad layer 40 from the side of the waveguide 26 at incident angles greater than or equal to the critical angle is thus totally reflected at the interface. The laser light that is emitted from the laser diode 202 and passes through the clad layer 40 to enter the waveguide 26 is thereby prevented from passing through the clad layer 40 again to return to the laser diode 202. Consequently, according to the present embodiment, it is possible to increase the use efficiency of the laser light and to prevent the laser diode 202 from being damaged by laser light that returns to the laser diode 202.

From the foregoing, the present embodiment makes it possible to increase the use efficiency of the light used for generating near-field light in the heat-assisted magnetic recording head 200.

The remainder of configuration, function and effects of the present embodiment are similar to those of the first embodiment.

Third Embodiment

Figure 33:
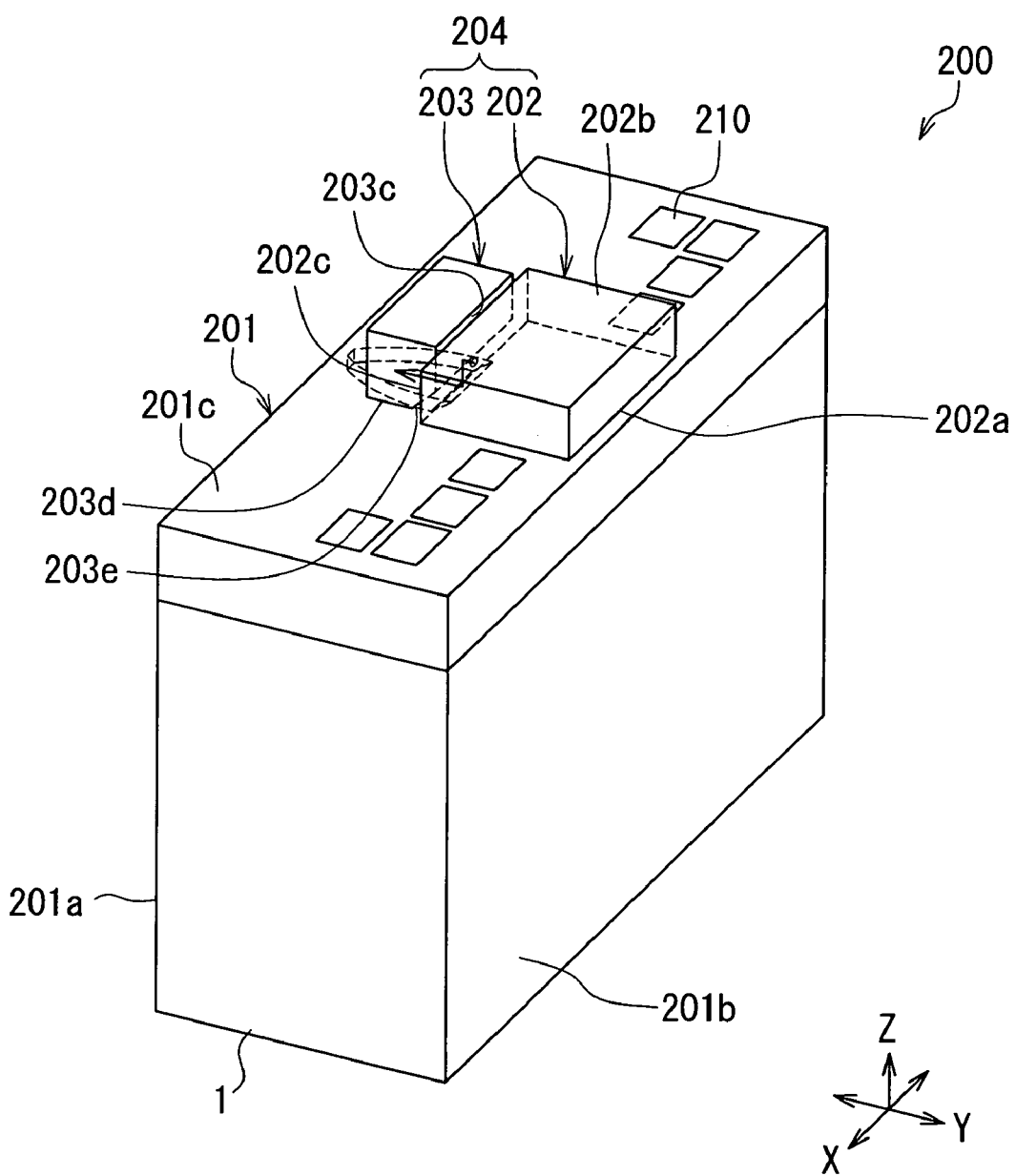
FIG. 33 is a perspective view of a heat-assisted magnetic recording head according to a third embodiment of the invention.
Figure 34:
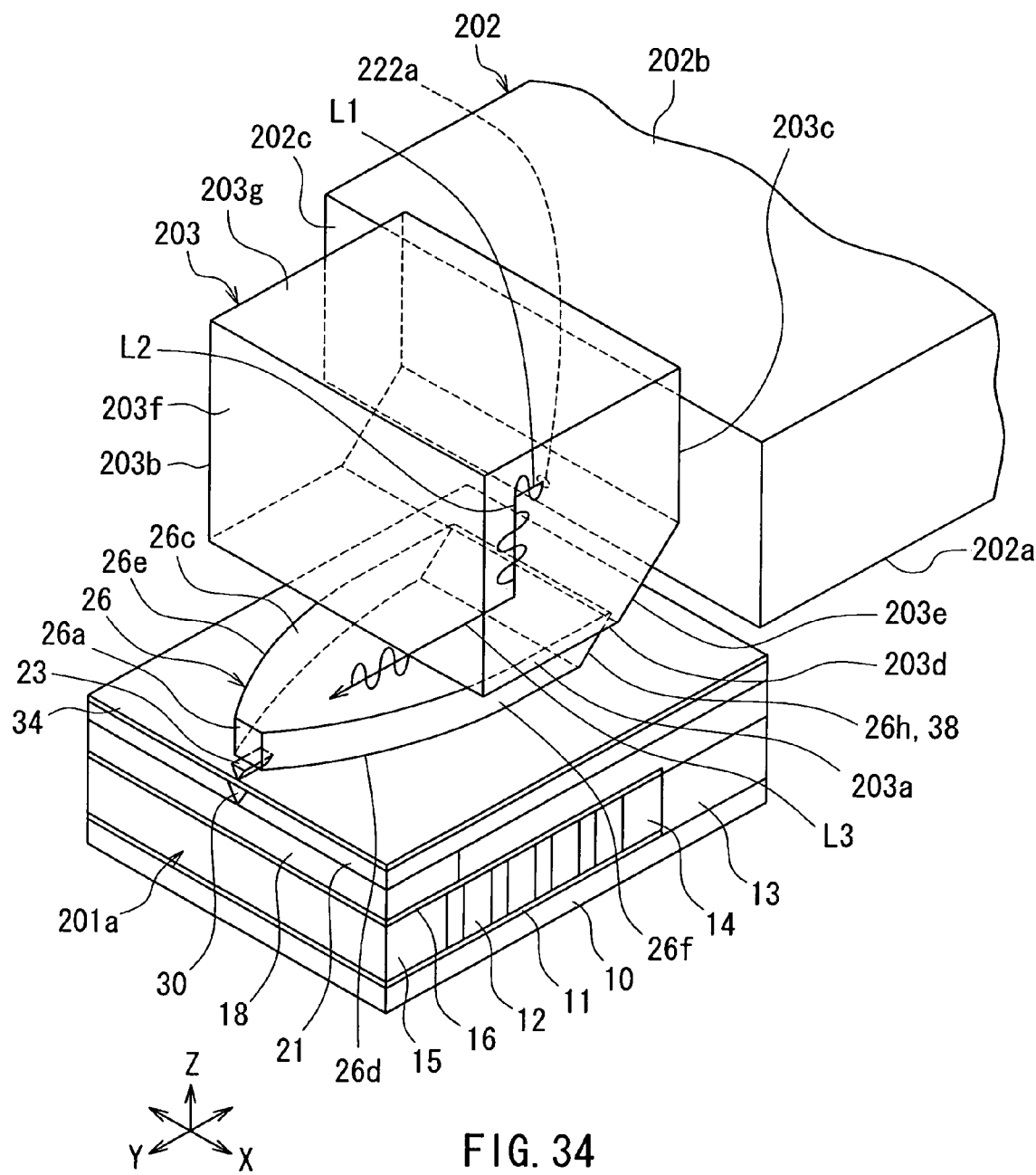
FIG. 34 is a perspective view showing the main part of the heat-assisted magnetic recording head shown in FIG. 33.

A heat-assisted magnetic recording head according to a third embodiment of the invention will now be described with reference to FIG. 33 and FIG. 34. FIG. 33 is a perspective view of the heat-assisted magnetic recording head according to the present embodiment. FIG. 34 is a perspective view of the main part of the heat-assisted magnetic recording head shown in FIG. 33.

In the present embodiment, as shown in FIG. 33 and FIG. 34, the laser diode 202, the external mirror 203, the internal mirror 38 and the waveguide 26 are arranged so that the direction of travel of the laser light L1 emitted from the emission part 222a and the direction of travel of the laser light L3 reflected by the internal mirror 38 are parallel to each other.

In the present embodiment, as shown in FIG. 34, the laser diode 202 emits linearly polarized laser light whose electric field oscillates in the direction perpendicular to the plane of the active layer 222, i.e., laser light of TM mode, from the emission part 222a. The direction of oscillation of the electric field of the laser light emitted from the emission part 222a is parallel to the YZ plane. The laser light emitted from the emission part 222a is reflected by the reflecting surface 203e of the external mirror 203 and travels toward the waveguide 26. Here, the direction of oscillation of the electric field of the laser light is parallel to the YZ plane. The laser light passes through the clad layer 40, enters the waveguide 26 from the top surface 26c, and is reflected by the internal mirror 38. The direction of oscillation of the electric field of the laser light reflected by the internal mirror 38 is parallel to the YZ plane. The laser light reflected by the internal mirror 38 propagates through the waveguide 26 to reach the opposed portion 26g. The direction of oscillation of the electric field of this laser light is perpendicular to the opposed portion 26g. This makes it possible to produce surface plasmons of high intensity on the near-field light generating element 23.

The remainder of configuration, function and effects of the present embodiment are similar to those of the second embodiment.

Fourth Embodiment

A heat-assisted magnetic recording head according to a fourth embodiment of the invention will now be described with reference to FIG. 35. FIG. 35 is a cross-sectional view showing the configuration of the slider of the present embodiment. The slider 201 of the heat-assisted magnetic recording head according to the present embodiment has a waveguide 56 and clad layers 57, 58 and 59, instead of the waveguide 26, the clad layers 37, 39 and 40 and the internal mirror 38 of the second embodiment.

The waveguide 56 is disposed on the interposition layer 36. The waveguide 56, except a portion in the vicinity of the end farther from the medium facing surface 201a, has the same shape as that of the waveguide 26. The portion of the waveguide 56 in the vicinity of the end farther from the medium facing surface 201a is bent to get closer to the top surface 201c of the slider 201 with increasing distance from the medium facing surface 201a. The waveguide 56 has an outer surface. The outer surface includes: a front end face 56a that is closer to the medium facing surface 201a; an incident end face 56b on the opposite side to the front end face 56a; a top surface that is farther from the top surface 1a of the substrate 1; a bottom surface that is closer to the top surface 1a of the substrate 1; and two side surfaces that are opposite to each other in the track width direction. In each of the top surface, the bottom surface and the two side surfaces of the waveguide 56, the portion in the vicinity of the end farther from the medium facing surface 201a is bent to get closer to the top surface 201c of the slider 201 with increasing distance from the medium facing surface 201a. The incident end face 56b is parallel to the top surface 1a of the substrate 1 and faces upward. The laser light reflected by the external mirror 203 is to be incident on this incident end face 56b. FIG. 35 shows an example in which the front end face 56a is located away from the medium facing surface 201a. The front end face 56a may be located in the medium facing surface 201a, however.

The clad layer 57 is disposed farther from the medium facing surface 201a than is the waveguide 56. The clad layer 57 has an end face 57a that is curved and in contact with the waveguide 56. The clad layer 58 is disposed to cover the waveguide 56 excluding its bottom surface and incident end face 56b. The incident end face 56b and the top surfaces of the clad layers 57 and 58 are flattened. The clad layer 59 is disposed over the incident end face 56b and the top surfaces of the clad layers 57 and 58. The top surface of the clad layer 59 constitutes the top surface 201c of the slider 201.

The outer surface of the waveguide 56 includes an opposed portion 56g that is opposed to a part of the coupling portion of the outer surface of the near-field light generating element 23. In the present embodiment, in particular, the waveguide 56 is disposed farther from the top surface 1a of the substrate 1 than is the near-field light generating element 23, and a part of the bottom surface of the waveguide 56 is opposed to a part of the top surface 23c of the near-field light generating element 23 with the interposition layer 36 interposed therebetween. This part of the bottom surface of the waveguide 56 opposed to the part of the top surface 23c is the opposed portion 56g.

The clad layers 57, 58 and 59 each have a refractive index lower than that of the waveguide 56. The material of the waveguide 56 is the same as that of the waveguide 26 of the second embodiment. The materials of the clad layers 57, 58 and 59 are the same as those of the clad layers 37, 39 and 40 of the second embodiment.

A manufacturing method for the heat-assisted magnetic recording head 200 according to the present embodiment will now be described. The manufacturing method for the heat-assisted magnetic recording head 200 according to the present embodiment is the same as that of the second embodiment up to the step of forming the interposition layer 36. In the present embodiment, next, a not-shown dielectric layer is formed on the interposition layer 36. This dielectric layer is to be made into the clad layer 57 afterward. On the dielectric layer, a not-shown metal mask having a plane shape corresponding to that of the clad layer 57 is formed. Next, the clad layer 57 is formed by selectively etching the dielectric layer by RIE, for example. The end face 57a of the clad layer 57 is formed at this time. Next, a dielectric layer to be made into the waveguide 56 afterward is formed over the entire top surface of the stack. The dielectric layer is then selectively etched by, for example, RIE, so as to form surfaces of the dielectric layer that respectively correspond to the front end face 56a and the two side surfaces of the waveguide 56. Next, another dielectric layer to be made into the clad layer 58 afterward is formed over the entire top surface of the stack.

Next, the foregoing two dielectric layers are polished by, for example, CMP, until the clad layer 57 is exposed. The two dielectric layers remaining after the polishing make the waveguide 56 and the clad layer 58, respectively. This polishing also forms the incident end face 56b and flattens the incident end face 56b and the top surfaces of the clad layers 57 and 58.

Next, the clad layer 59 is formed over the entire top surface of the stack. Wiring, the terminals 210 and so on are then formed on the top surface of the clad layer 59. Next, the laser diode 202 and the external mirror 203 are fixed to the top surface of the clad layer 59, i.e., the top surface 201c of the slider 201. The substrate is then cut into sliders, and polishing of the medium facing surface 201a, fabrication of flying rails, etc. are performed to thereby complete the heat-assisted magnetic recording head 200.

In the present embodiment, the laser light emitted from the emission part 222a of the laser diode 202 is reflected by the reflecting surface 203e of the external mirror 203, passes through the clad layer 59, and enters the waveguide 56 from the incident end face 56b. Entering the waveguide 56, the laser light is reflected at the interface between the waveguide 56 and the clad layers 57 and 58 while traveling through the waveguide 56 toward the medium facing surface 201a (the front end face 56a).

The remainder of configuration, function and effects of the present embodiment are similar to those of the second embodiment.

Fifth Embodiment

Figure 36:
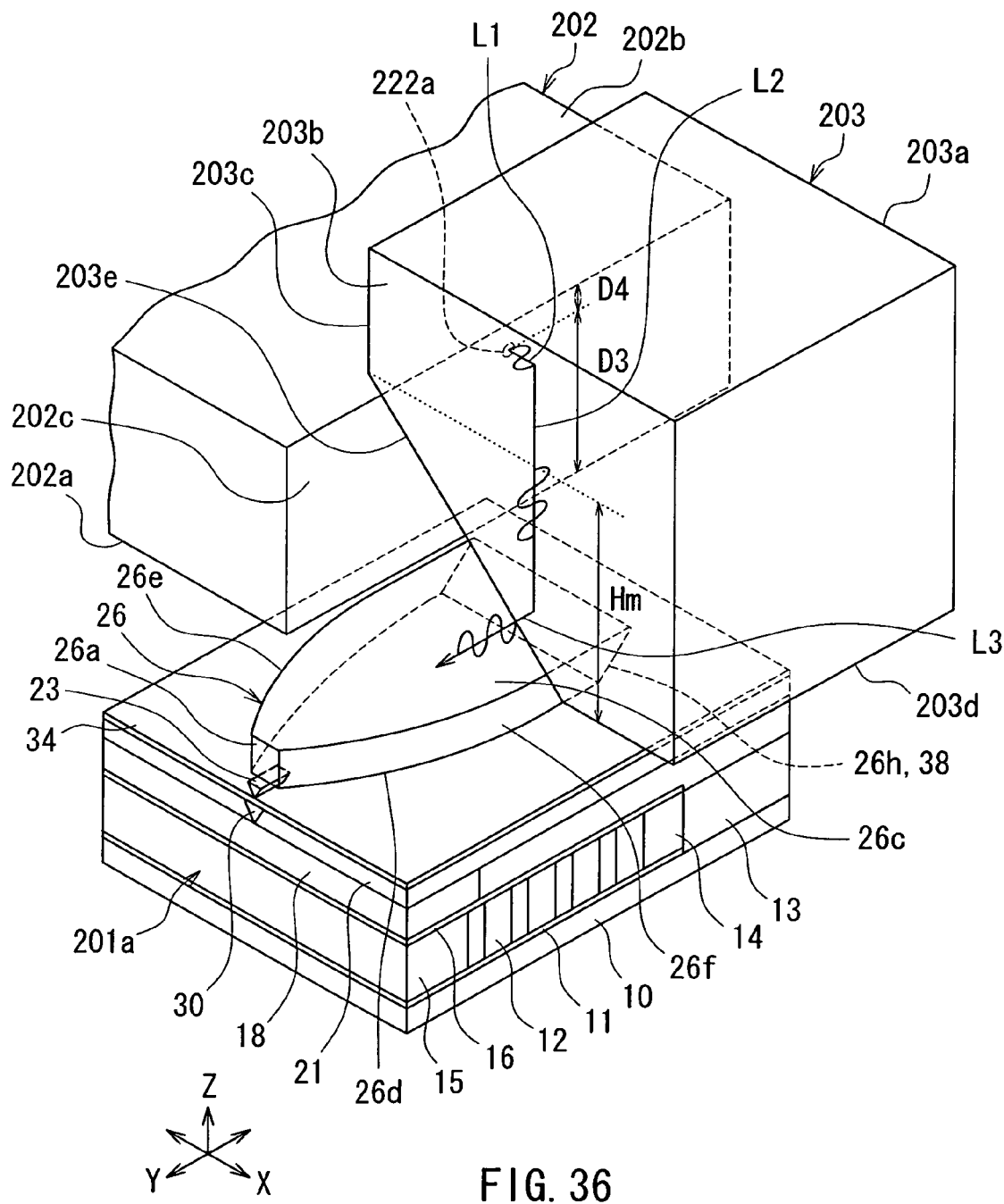
FIG. 36 is a perspective view showing the main part of a heat-assisted magnetic recording head according to a fifth embodiment of the invention.

A heat-assisted magnetic recording head according to a fifth embodiment of the invention will now be described with reference to FIG. 36. FIG. 36 is a perspective view showing the main part of the heat-assisted magnetic recording head according to the present embodiment.

In the present embodiment, the laser diode 202 is arranged so that the n-electrode 213 faces the top surface 201c of the slider 201. In the present embodiment, the mounting surface 202a of the laser diode 202 is formed by the surface of the n-electrode 213, and the rear surface 202b of the laser diode 202 is formed by the surface of the p-electrode 214. In the present embodiment, the distance D3 between the mounting surface 202a and the emission part 222a is greater than the distance D4 between the rear surface 202b and the emission part 222a.

In the external mirror 203 of the present embodiment, the distance (difference in level) Hm between both ends of the reflecting surface 203e in the direction perpendicular to the second reference surface 203d (the Y direction) is greater than the distance D3 between the mounting surface 202a and the emission part 222a of the laser diode 202.

In the present embodiment, the first reference surface 203c of the external mirror 203 is not in contact with the emitting end face 202c of the laser diode 202. The external mirror 203 is bonded to the top surface 201c of the slider 201 (the top surface of the clad layer 40) at a predetermined position so that the second reference surface 203d comes in contact with the top surface 201c. The external mirror 203 is thereby aligned with respect to the slider 201 and the laser diode 202.

The present embodiment does not provide the function and effects of the second embodiment resulting from such an arrangement of the laser diode 202 that the p-electrode 214 faces the top surface 201c of the slider 201. In other respects, the configuration, function and effects of the present embodiment are the same as those of the second embodiment.

It should be appreciated that the present invention is not limited to the foregoing embodiments, and various modifications may be made thereto. For example, in the second, third and fifth embodiments, the internal mirror 38 may be replaced with a diffraction grating that diffracts the laser light entering the waveguide 26 from the top surface 26c, so as to let the laser light travel through the waveguide 26 toward the medium facing surface 201a.

In the fourth embodiment, the laser diode 202 and the external mirror 203 may be arranged so that the laser light emitted from the emission part 222a of the laser diode 202 travels in the Y direction as in the third embodiment.

In the fifth embodiment, the laser diode 202, the external mirror 203, the internal mirror 38 and the waveguide 26 may be arranged so that the direction of travel of the laser light emitted from the emission part 222a of the laser diode 202 and the direction of travel of the laser light reflected by the internal mirror 38 are parallel to each other, as in the third embodiment.

In the present invention, the near-field light generating element 23 may have a shape other than the shapes shown in FIG. 7 and FIG. 20.

It is apparent that the present invention can be carried out in various forms and modifications in the light of the foregoing descriptions. Accordingly, within the scope of the following claims and equivalents thereof, the present invention can be carried out in forms other than the foregoing most preferable embodiments.

What is claimed is:

1. A heat-assisted magnetic recording head comprising a slider, an edge-emitting laser diode fixed to the slider, and an external mirror provided outside the slider, the slider comprising:
a medium facing surface that faces a recording medium;
a magnetic pole that has an end face located in the medium facing surface and produces a recording magnetic field for recording data on the recording medium;
a waveguide that allows light to propagate therethrough;
a near-field light generating element having a near-field light generating part located in the medium facing surface, a surface plasmon being excited based on the light propagating through the waveguide, the surface plasmon propagating to the near-field light generating part, the near-field light generating part generating near-field light based on the surface plasmon; and a substrate on which the magnetic pole, the near-field light generating element and the waveguide are stacked, wherein:

the laser diode includes: an active layer; an emitting end face that lies at an end in a direction parallel to a plane of the active layer and includes an emission part for emitting laser light; and a mounting surface that lies at an end in a direction perpendicular to the plane of the active layer and faces the slider; and the external mirror includes: a first reference surface that is parallel to the emitting end face and faces the emitting end face; a second reference surface that is parallel to the mounting surface and faces toward the same direction as the mounting surface does; and a reflecting surface that is oblique with respect to each of the first reference surface and the second reference surface, connects the first reference surface and the second reference surface to each other, and reflects the laser light emitted from the emission part toward the waveguide.

2. The heat-assisted magnetic recording head according to claim 1, wherein the first reference surface is in contact with the emitting end face.

3. The heat-assisted magnetic recording head according to claim 1, wherein the second reference surface is in contact with the slider.

4. The heat-assisted magnetic recording head according to claim 1, wherein the reflecting surface forms an angle of 45° with respect to each of the first reference surface and the second reference surface.

5. The heat-assisted magnetic recording head according to claim 1, wherein:

the slider has a rear surface that is opposite to the medium facing surface;

the waveguide has an incident end face for the laser light reflected by the external mirror to be incident on, the incident end face being located in the rear surface; and the laser diode is arranged so that the mounting surface faces the rear surface.

6. The heat-assisted magnetic recording head according to claim 1, wherein:

the substrate has a top surface that faces toward the magnetic pole, the near-field light generating element and the waveguide;

the slider has a top surface that lies at an end above the top surface of the substrate; and the laser diode is arranged so that the mounting surface faces the top surface of the slider.

7. The heat-assisted magnetic recording head according to claim 6, wherein the slider further comprises an internal mirror that reflects the laser light reflected by the external mirror so as to let the laser light travel through the waveguide toward the medium facing surface.

8. The heat-assisted magnetic recording head according to claim 7, wherein the laser diode, the external mirror, the internal mirror, and the waveguide are arranged so that a direction of travel of the laser light emitted from the emission part and a direction of travel of the laser light reflected by the internal mirror are orthogonal to each other as viewed from above the top surface of the slider.

9. The heat-assisted magnetic recording head according to claim 7, wherein the laser diode, the external mirror, the internal mirror, and the waveguide are arranged so that a direction of travel of the laser light emitted from the emission part and a direction of travel of the laser light reflected by the internal mirror are parallel to each other.

10. The heat-assisted magnetic recording head according to claim 6, wherein the waveguide has an incident end face for the laser light reflected by the external mirror to be incident on, the incident end face being located in the top surface of the slider.

11. The heat-assisted magnetic recording head according to claim 1, wherein the laser diode has a rear surface that is opposite to the mounting surface, and a distance between the mounting surface and the emission part is smaller than a distance between the rear surface and the emission part of the laser diode.

12. The heat-assisted magnetic recording head according to claim 1, wherein:

the near-field light generating element has an outer surface that includes: a first end face that is located in the medium facing surface; a second end face that is farther from the medium facing surface; and a coupling portion that couples the first end face and the second end face to each other, the first end face including the near-field light generating part;

a length of the near-field light generating element in a direction perpendicular to the medium facing surface is greater than a length of the first end face in a direction perpendicular to the top surface of the substrate; and the waveguide has an outer surface including an opposed portion that is opposed to a part of the coupling portion.

13. The heat-assisted magnetic recording head according to claim 12, wherein the slider further comprises an interposition layer that has a refractive index lower than that of the waveguide and is interposed between the opposed portion and the near-field light generating element.

14. The heat-assisted magnetic recording head according to claim 1, wherein the external mirror includes: a block having the first and second reference surfaces and an oblique surface that is oblique with respect to each of the first reference surface and the second reference surface and connects the first reference surface and the second reference surface to each other; and a metal film that adheres to the oblique surface to form the reflecting surface.

15. A laser assembly usable in combination with a slider to constitute a heat-assisted magnetic recording head, the slider comprising:

a medium facing surface that faces a recording medium;

a magnetic pole that has an end face located in the medium facing surface and produces a recording magnetic field for recording data on the recording medium;

a waveguide that allows light to propagate therethrough;

a near-field light generating element having a near-field light generating part located in the medium facing surface, a surface plasmon being excited based on the light propagating through the waveguide, the surface plasmon propagating to the near-field light generating part, the near-field light generating part generating near-field light based on the surface plasmon; and a substrate on which the magnetic pole, the near-field light generating element and the waveguide are stacked, the laser assembly comprising:

an edge-emitting laser diode to be fixed to the slider; and an external mirror to be provided outside the slider, wherein:

the laser diode includes: an active layer; an emitting end face that lies at an end in a direction parallel to a plane of the active layer and includes an emission part for emitting laser light; and a mounting surface that lies at an end in a direction perpendicular to the plane of the active layer and is to face the slider;

the external mirror includes: a first reference surface that is parallel to the emitting end face and faces the emitting end face; a second reference surface that is parallel to the mounting surface and faces toward the same direction as the mounting surface does; and a reflecting surface that is oblique with respect to each of the first reference surface and the second reference surface, connects the first reference surface and the second reference surface to each other, and reflects the laser light emitted from the emission part toward the waveguide; and the first reference surface is bonded to the emitting end face.

16. The laser assembly according to claim 15, wherein the reflecting surface forms an angle of 45° with respect to each of the first reference surface and the second reference surface.

17. The laser assembly according to claim 15, wherein the laser diode has a rear surface that is opposite to the mounting surface, and a distance between the mounting surface and the emission part is smaller than a distance between the rear surface and the emission part.

18. The laser assembly according to claim 15, wherein the external mirror includes: a block having the first and second reference surfaces and an oblique surface that is oblique with respect to each of the first reference surface and the second reference surface and connects the first reference surface and the second reference surface to each other; and a metal film that adheres to the oblique surface to form the reflecting surface.

19. A manufacturing method for the laser assembly according to claim 15, comprising the steps of:

fabricating the external mirror; and bonding the first reference surface of the external mirror to the emitting end face of the laser diode, wherein:

the step of fabricating the external mirror includes the steps of:

fabricating an initial block that has a first initial reference surface, a second initial reference surface orthogonal to the first reference surface, and a corner formed between the first initial reference surface and the second initial reference surface, the first initial reference surface including a portion to be the first reference surface afterward, the second initial reference surface including a portion to be the second reference surface afterward;

polishing the initial block at the corner to fabricate a block having the first and second reference surfaces and an oblique surface that is oblique with respect to each of the first reference surface and the second reference surface and connects the first reference surface and the second reference surface to each other; and depositing a metal film for forming the reflecting surface onto the oblique surface.

20. The manufacturing method according to claim 19, wherein the reflecting surface forms an angle of 45° with respect to each of the first reference surface and the second reference surface.

21. The manufacturing method according to claim 19, wherein the laser diode has a rear surface that is opposite to the mounting surface, and a distance between the mounting surface and the emission part is smaller than a distance between the rear surface and the emission part.

22. The manufacturing method according to claim 19, wherein the initial block is in the shape of a rectangular solid.

* * * * *